United States Patent
Hasegawa et al.

(10) Patent No.: US 6,714,388 B2
(45) Date of Patent: Mar. 30, 2004

(54) MAGNETIC SENSING ELEMENT HAVING IMPROVED MAGNETIC SENSITIVITY

(75) Inventors: Naoya Hasegawa, Niigata-ken (JP); Eiji Umetsu, Niigata-ken (JP)

(73) Assignee: Alps Electric Co., Ltd., Tokyo (JP)

( * ) Notice: Subject to any disclaimer, the term of this patent is extended or adjusted under 35 U.S.C. 154(b) by 26 days.

(21) Appl. No.: 10/192,921

(22) Filed: Jul. 11, 2002

(65) Prior Publication Data

US 2003/0011459 A1 Jan. 16, 2003

(30) Foreign Application Priority Data

Jul. 13, 2001 (JP) .................................... 2001-214267
Jan. 22, 2002 (JP) .................................... 2002-012796

(51) Int. Cl.$^7$ ............................................. G11B 5/127
(52) U.S. Cl. ......................... 360/324.11; 360/324.12; 360/324
(58) Field of Search ................ 336/200, 223, 336/232; 360/324.11, 324.12, 324, 326, 313, 324.2

(56) References Cited

U.S. PATENT DOCUMENTS

| | | | | |
|---|---|---|---|---|
| 5,654,566 A | * | 8/1997 | Johnson | 257/295 |
| 5,664,316 A | * | 9/1997 | Chen et al. | 29/603.08 |
| 5,949,623 A | | 9/1999 | Lin | |
| 6,030,753 A | | 2/2000 | Lin | |
| 6,469,877 B1 | * | 10/2002 | Knapp et al. | 360/324.12 |

FOREIGN PATENT DOCUMENTS

| | | |
|---|---|---|
| JP | 2000-348309 | 12/2000 |
| JP | 2001-52315 | 2/2001 |

* cited by examiner

Primary Examiner—Anh Mai
(74) Attorney, Agent, or Firm—Brinks Hofer Gilson & Lione

(57) ABSTRACT

Ferromagnetic layers and a free magnetic layer are laminated with a nonmagnetic layer therebetween, the nonmagnetic layer having a uniform thickness, the magnetization direction of the ferromagnetic layers being aligned in the track width direction by second antiferromagnetic layers. Thereby, the free magnetic layer can be aligned in a single domain state in the track width direction reliably.

36 Claims, 25 Drawing Sheets

MAGNETIC SENSING ELEMENT HAVING IMPROVED MAGNETIC SENSITIVITY

BACKGROUND OF THE INVENTION

1. Field of the Invention

The present invention relates to magnetic sensing elements mainly used for magnetic sensors, hard disk drives, etc., and more particularly, to a magnetic sensing element having an improved magnetic sensitivity and a method for making the same.

2. Description of the Related Art

FIG. 32 is a sectional view of a conventional magnetic sensing element, viewed from a surface facing a recording medium.

The magnetic sensing element shown in FIG. 32 is a spin-valve magnetic sensing element which is one type of giant magnetoresistive (GMR) element using a giant magnetoresistance effect and which detects a recorded magnetic field from a magnetic recording medium, such as a hard disk.

The spin-valve magnetic sensing element includes a multilayer film 8 including a substrate 1, an underlayer 2, a first antiferromagnetic layer 3, a pinned magnetic layer 4, a nonmagnetic material layer 5, a free magnetic layer 6, and a protective layer 7 deposited in that order from the bottom; a pair of ferromagnetic layers 9 formed on both sides of the multilayer film 8; a pair of second antiferromagnetic layers 10 formed on the pair of ferromagnetic layers 9; and a pair of electrode layers L formed on the pair of second antiferromagnetic layers 10.

In general, Pt—Mn alloy films are used for the first antiferromagnetic layer 3 and the second antiferromagnetic layers 10; Ni—Fe alloy films are used for the pinned magnetic layer 4, the free magnetic layer 6, and the ferromagnetic layers 9; a Cu film is used for the nonmagnetic material layer 5; Ta films are used for the underlayer 2 and the protective layer 7; and Cr films are used for the electrode layers L.

The magnetization of the pinned magnetic layer 4 is aligned in a single domain state in the Y direction (the direction of a fringing magnetic field from the recording medium, i.e., in the height direction) by an exchange anisotropic magnetic field with the first antiferromagnetic layer 3.

Each of the ferromagnetic layers 9 is aligned in a single domain state in the X direction by an exchange anisotropic magnetic field with the second antiferromagnetic layer 10. The free magnetic layer 6 and the ferromagnetic layers 9 are in contact with each other at joints J, thus forming a continuous ferromagnetic body. The free magnetic layer 6 is aligned in a single domain state in the X direction by a so-called "exchange bias system". In the exchange bias system, surface magnetic charges do not occur at both end faces (joints J) of the free magnetic layer 6, and the magnitude of a demagnetizing field generated in the free magnetic layer 6 can be decreased.

In the magnetic sensing element, a sensing current is supplied from one of the electrode layers L through the second antiferromagnetic layer 10 and the ferromagnetic layer 9 to the free magnetic layer 6, the nonmagnetic layer 5, and the pinned magnetic layer 4. A recording medium, such as a hard disk, travels in the Z direction, and when a fringing magnetic field from the recording medium is applied in the Y direction, the magnetization direction of the free magnetic layer 6 is changed from the X direction to the Y direction. Electrical resistance changes due to the relationship between the varying magnetization direction of the free magnetic layer 6 and the pinned magnetization direction of the pinned magnetic layer 4 exemplify the magnetoresistance effect. This effect can be detected by a voltage change resulting from electrical resistance changes in the fringing magnetic field from the magnetic recording medium.

In order to fabricate the magnetic sensing element shown in FIG. 32, the underlayer 2, the first antiferromagnetic layer 3, the pinned magnetic layer 4, the nonmagnetic layer 5, the free magnetic layer 6, and the protective layer 7 are deposited on the substrate 1, each being a thin film with a uniform thickness, and then portions other than a portion for forming the multilayer film 8 shown in FIG. 32 are removed by ion milling. Next, the ferromagnetic layers 9 are formed so as to come into contact with side faces 8a of the multilayer film 8, and the second antiferromagnetic layers 10 and the electrode layers L are further deposited on the ferromagnetic layers 9.

That is, in the magnetic sensing element shown in FIG. 32, the side faces 8a of the multilayer film 8 are interfaces trimmed by milling. Even if the ferromagnetic layers 9 are deposited on such interfaces trimmed by milling so as to be in contact with the interfaces, it is difficult to form a continuous ferromagnetic body in which the free magnetic layer 6 and the ferromagnetic layers 9 are joined to each other at the joints J, and therefore it is difficult to align the free magnetic layer 6 stably in a single domain state in the X direction.

Since the joints J between the free magnetic layer 6 and the ferromagnetic layers 9 are on the side faces 8a of the multilayer film 8, it is difficult to magnetically couple the free magnetic layer 6 and the ferromagnetic layers 9 to each other. For this reason, it is also difficult to align the free magnetic layer 6 stably in a single domain state in the X direction.

Additionally, if an angle θ1 of inclination of the side face 8a of the multilayer film 8 is decreased in order to stabilize the magnetic coupling between the free magnetic layer 6 and the ferromagnetic layers 9, it becomes difficult to form the width of the free magnetic layer 6 in the track width direction (X direction) in a predetermined range.

Moreover, in order to join the free magnetic layer 6 and the ferromagnetic layers 9 reliably in the structure shown in FIG. 32, the thickness of the ferromagnetic layer 9 must be increased. However, if the thickness of the ferromagnetic layer 9 is increased, the unidirectional anisotropic magnetic field of the ferromagnetic layer 9 is decreased, resulting in a difficulty in applying a stable longitudinal bias to the free magnetic layer 6. If the thickness of the ferromagnetic layer 9 is increased, insensitive regions occur at both ends of the free magnetic layer 6, and therefore, satisfactory read sensitivity cannot be obtained in an element with a narrow track width at 0.2 μm or less.

As described above, in the conventional magnetic sensing element shown in FIG. 32 using the exchange bias system, it is difficult to align the free magnetic layer 6 stably in a single domain state by applying a stable longitudinal bias to the free magnetic layer 6.

SUMMARY OF THE INVENTION

It is an object of the present invention to provide a magnetic sensing element using the exchange bias system and a method for fabricating the same, in which the free magnetic layer can be aligned stably in a single domain state in the X direction, and magnetic sensitivity can be improved.

In accordance with the present invention, a magnetic sensing element includes a multilayer film including a first antiferromagnetic layer; a pinned magnetic layer, the magnetization direction of the pinned magnetic layer being pinned by the first antiferromagnetic layer; a nonmagnetic material layer; a free magnetic layer, the magnetization direction of the free magnetic layer varying in response to an external magnetic field; a nonmagnetic layer; a pair of ferromagnetic layers; a pair of second antiferromagnetic layers; a first electrode layer; a second electrode layer; and a track width region comprising a central region and pair of sides, wherein the multilayer film has a characteristic track width direction. In the magnetic sensing element, the nonmagnetic layer has a uniform thickness, or the thickness in the central region of the nonmagnetic layer is larger than in its side regions; the pair of ferromagnetic layers are provided on the upper surface of the nonmagnetic layer, the pair of ferromagnetic layers at a predetermined distance apart from one another in the track width direction; the pair of the second antiferromagnetic layers are provided on the pair of ferromagnetic layers; and the magnetization direction of the free magnetic layer is substantially perpendicular to the magnetization direction of the pinned magnetic layer by magnetic coupling with the ferromagnetic layers, the magnetization direction of the ferromagnetic layers being aligned by magnetic coupling with the second antiferromagnetic layers. In the present invention, the magnetization direction of the ferromagnetic layers located under the pair of second antiferromagnetic layers is aligned in the track width direction by magnetic coupling with the second antiferromagnetic layers. The magnetization direction of the side regions of the free magnetic layer formed under the ferromagnetic layers with the nonmagnetic layer therebetween is aligned in a direction antiparallel to the magnetization direction of the ferromagnetic layers by RKKY interactions with the ferromagnetic layers. That is, under the pair of second antiferromagnetic layers, the ferromagnetic layer, the nonmagnetic layer, and the free magnetic layer form a synthetic ferrimagnetic structure such that the magnetization direction of the side regions of the free magnetic layer overlapping with the second antiferromagnetic layers and the ferromagnetic layers is pinned in the direction antiparallel to the track width direction.

On the other hand, the magnetization direction of a track width region of the free magnetic layer, which is the region not overlapping with the second antiferromagnetic layers and the ferromagnetic layers, is directed antiparallel to the track width direction following the side regions in the absence of an applied external magnetic field. When an external magnetic field is applied in a direction (height direction) perpendicular to the track width direction, the magnetization direction of the track width region of the free magnetic layer is changed to the height direction.

Electrical resistance changes due to the relationship between the varying magnetization direction of the free magnetic layer in the track width region and the pinned magnetization direction of the pinned magnetic layer exemplify the magnetoresistance effect. This effect is detectable by a voltage change resulting from electrical resistance changes in external magnetic fields, such as fringing magnetic fields from a magnetic recording medium.

In accordance with the present invention, since the synthetic ferrimagnetic structure is formed by the ferromagnetic layer, the nonmagnetic layer, and the free magnetic layer under the second antiferromagnetic layers, it is possible to increase a unidirectional anisotropic magnetic field for aligning the magnetization direction of the free magnetic layer in the side regions in a predetermined direction.

Consequently, it is possible to prevent the magnetic track width from being increased because of a change in the magnetization direction of the free magnetic layer in the side regions.

Even if the exchange coupling magnetic field between the second antiferromagnetic layers and the ferromagnetic layers is relatively weak, the magnetization direction of the free magnetic layer can be easily and reliably directed in substantially perpendicular to the magnetization direction of the pinned magnetic layer. Therefore, even in the region in which the thickness of the second antiferromagnetic layers is decreased, a sufficient unidirectional anisotropic magnetic field can be obtained.

A track width (optical track width) region of the magnetic sensing element defined by a predetermined distance in the track width direction between the pair of ferromagnetic layers effectively contributes to regeneration of the recorded magnetic field, constituting a sensitive region exhibiting the magnetoresistance effect.

That is, in the magnetic sensing element of the present invention, since the optical track width corresponds to the magnetic track width and insensitive regions do not occur, it is possible to prevent the read output from decreasing when the optical track width of the magnetic sensing element is reduced to satisfy demands for increasing recording density.

Since the magnitude of the bias magnetic field applied to the free magnetic layer becomes equal to the magnitude of the magnetic moment per unit area of the free magnetic layer, wherein the magnetic moment is defined by the product of the saturation magnetization (Ms) and the film thickness (t), a high output magnetic sensing element having a high sensitivity is produced.

In accordance with the present invention, since the free magnetic layer is composed of a magnetic material that extends to the regions below the second antiferromagnetic layers and the ferromagnetic layers, it is possible to reduce the influence of the demagnetizing field generated by surface magnetic charges at both end faces of the free magnetic layer.

Moreover, in the present invention, since the interface between the free magnetic layer and the nonmagnetic layer and the interfaces between the nonmagnetic layer and the ferromagnetic layers are not required to be trimmed by milling, it is possible to prevent decreases in the unidirectional anisotropic magnetic fields which align the magnetization directions of the side regions of the free magnetic layer in a predetermined direction.

Further, since the free magnetic layer and the ferromagnetic layers are magnetically coupled to each other with the nonmagnetic layer therebetween by the RKKY interactions, even when the interface between the free magnetic layer and the nonmagnetic layer or the interfaces between the nonmagnetic later and the ferromagnetic layers are surfaces trimmed by milling, it is possible to obtain unidirectional anisotropic magnetic fields which have a magnitude sufficient for aligning the magnetization directions of the side regions of the free magnetic layer in a predetermined direction.

In the present invention, since the ferromagnetic layers and the second antiferromagnetic layers are deposited on the planar nonmagnetic layer, the deposition step for the ferromagnetic layers and the second antiferromagnetic layers is easily controlled. In particular, in the synthetic ferrimagnetic structure including the ferromagnetic layer, the nonmagnetic layer, and the free magnetic layer, the thickness of the ferromagnetic layer can be reduced, thereby allowing an increase in the spin-flop magnetic field between the ferromagnetic layer and the free magnetic layer.

In the present invention, preferably after the track width region of the nonmagnetic layer is covered by a resist layer, the ferromagnetic layer and the second antiferromagnetic layers are formed by sputtering a ferromagnetic material and an antiferromagnetic material on the regions of the nonmagnetic layer not covered by the resist layer. This allows for the upper surfaces of the ferromagnetic layers and the second antiferromagnetic layers to form inclined surfaces or curved surfaces relative to the upper surface of the nonmagnetic layer.

As described above, by sputtering the ferromagnetic material and the antiferromagnetic material on the nonmagnetic layer, it is possible to produce a magnetic sensing element of this invention in which the ferromagnetic layers and the second antiferromagnetic layers are provided on the nonmagnetic layer having a planar upper surface.

Preferably, the nonmagnetic layer is composed of a conductive material. Consequently, the nonmagnetic layer exhibits a spin filter effect which can improve the magnetic sensitivity of the magnetic sensing element.

More preferably, the nonmagnetic layer is composed of any one of Ru, Rh, Ir, Os, and Re, or an alloy of at least two of these elements.

More preferably, the nonmagnetic layer is composed of Ru and has a thickness of 0.8 to 1.1 nm. Consequently, RKKY interactions between the ferromagnetic layers and the side regions of the free magnetic layer can be increased.

Preferably, the magnetic sensing element further includes a conductive material layer placed between the nonmagnetic layer and the free magnetic layer, the conductive material layer having a lower resistivity than that of the nonmagnetic layer. Consequently, a higher spin filter effect can be exhibited than in the case in which only a nonmagnetic layer is used, thereby further improving the magnetic sensitivity of the magnetic sensing element.

When the conductive material layer is formed, preferably, the nonmagnetic layer is composed of Ru and has a thickness of 0.4 to 1.1 nm. Preferably, the conductive material layer is composed of Cu and has a thickness of 0.3 to 0.5 nm.

If the nonmagnetic layer deposited in contact with the upper surface of the free magnetic layer is composed of a conductive material or if the conductive material layer is formed between the nonmagnetic layer and the free magnetic layer, the nonmagnetic layer can act as a back layer exhibiting a spin filter effect.

When a sensing current is applied to a spin-valve magnetic sensing element, conduction electrons mainly move in the vicinity of the nonmagnetic material layer having a small electrical resistance. The probability is that two types of conduction electrons, i.e., spin-up conduction electrons and spin-down conduction electrons, will be present in equal quantity.

The rate of change in magnetoresistance of the spin-valve magnetic sensing element is positively correlated with a difference in the mean free path between the two types of conduction electrons.

The spin-down conduction electrons are always scattered at the interface between the nonmagnetic material layer and the free magnetic layer, regardless of the direction of an applied external magnetic field. The probability of transferring electrons to the free magnetic layer remains low. Thus, the mean free path of the spin-down conduction electrons remains shorter than that of the spin-up electrons.

In contrast, the spin-up conduction electrons have an increased probability of transferring electrons from the nonmagnetic material layer to the free magnetic layer when the magnetization direction of the free magnetic layer is set parallel to the magnetization direction of the pinned magnetic layer by an external magnetic field. Consequently, the mean free path is increased. As the magnetization direction of the free magnetic layer is varied from a state parallel to the magnetization direction of the pinned magnetic layer due to an external magnetic field, the probability of being scattered at the interface between the nonmagnetic material layer and the free magnetic layer is increased and the mean free path of the spin-up conduction electrons is decreased.

As described above, the mean free path of the spin-up conduction electrons greatly changes in comparison with the mean free path of the spin-down conduction electrons, thereby greatly changing the difference between the two mean free paths. As a result, the mean free path of the entire conduction electrons greatly changes so as to increase the rate of change in magnetoresistance ($\Delta R/R$) of the spin-valve magnetic sensing element.

If a back layer is joined to the free magnetic layer, spin-up electrons passing through the free magnetic layer can also move into the back layer. Thus, the mean free path of the spin-up electrons can be further extended. Moreover, since the so-called "spin filter effect" can be exerted, the difference in the mean free path of conduction electrons can be increased, resulting in a further improvement in the rate of change in magnetoresistance of the spin-valve magnetic sensing element.

In the present invention, preferably, the free magnetic layer has a thickness of 1.5 to 4.5 nm.

The difference in the mean free path between the spin-up conduction electrons and the spin-down conduction electrons due to the spin filter effect is more effectively increased when the thickness of the free magnetic layer is relatively small.

If the thickness of the free magnetic layer is less than 1.5 nm, it is difficult for the free magnetic layer to function as a ferromagnetic material layer so as to obtain a sufficient magnetoresistance effect. In addition, since conduction electrons which are subjected to diffusive scattering without being subjected to specular reflection are present, the rate of change in resistance is reduced.

If the thickness of the free magnetic layer is more than 4.5 nm, there, is an increased number of spin-up conduction electrons scattering before reaching the back layer. This reduces the increase in the rate of change in resistance due to the spin filter effect.

The magnetic sensing element of the present invention may be a magnetic sensing element of a current-in-plane (CIP) type, wherein the electrode layers are provided on the side regions in the track width direction of the multilayer film so that a current flows parallel to the planes of the individual layers of the multilayer film.

Preferably, the electrode layers are provided on the pair of second antiferromagnetic layers and the edges of the electrode layers at the track width region sides overlap with the edges of the second antiferromagnetic layers at the track width region sides.

Alternatively, the electrode layers are provided on the pair of second antiferromagnetic layers and the edges of the electrode layers at the track width region sides are placed closer to the side faces of the multilayer film compared to the edges of the second antiferromagnetic layers at the track width region sides.

An upper shielding layer and a lower shielding layer, each composed of a magnetic material, may be formed on the upper surface and the lower surface of the magnetic sensing element of the present invention with insulating upper and lower gap layers therebetween.

If the edges of the electrode layers at the track width region sides are placed closer to the side faces of the multilayer film compared to the edges of the pair of second antiferromagnetic layers at the track width region sides, steps between the upper surface of the nonmagnetic layer in the track width region and the upper surfaces of the electrode layers and the second antiferromagnetic layers can be gentler. Therefore, even if the thickness of the upper gap layer is decreased, the upper gap layer can be formed reliably on the steps. Moreover, because there is more reliable protection against electrical short-circuiting between the upper shielding layer and the electrode layers, second antiferromagnetic layers, and ferromagnetic layers, the magnetic sensing element can be rendered suitable for gap narrowing.

If the distance between the upper shielding layer and the lower shielding layer is increased in the vicinity of both sides of the track width region of the multilayer film, magnetic fields originating from the recorded tracks of a recording medium at both sides of the recorded track easily enter the magnetic sensing element, thereby increasing the effective track width and facilitating crosstalk between recorded tracks.

In the present invention, as described above, since the steps between the upper surface of the nonmagnetic layer in the track width region and the upper surfaces of the electrode layers and the second antiferromagnetic layers can be gentler, it is possible to decrease the effective track width by preventing an increase in the distance between the upper shielding layer and the lower shielding layer in the vicinity of both sides of the track width region of the multilayer film.

Alternatively, the electrode layers are preferably provided on the second antiferromagnetic layers and the edges of the electrode layers at the track width region sides extend from the edges of the second antiferromagnetic layers at the track width region sides toward the central region of the multilayer film.

The ferromagnetic layers and the second antiferromagnetic layers are composed of materials having a larger resistivity than that of the electrode layer. If the electrode layer is disposed only on the ferromagnetic layers and the second antiferromagnetic layers, a DC current supplied to the electrode layer flows through the nonmagnetic layer, the free magnetic layer, the nonmagnetic material layer, and the pinned magnetic layer via the ferromagnetic layer and the second antiferromagnetic layer, thereby increasing the DC resistance of the magnetic sensing element.

When the edges of the electrode layers at the track width region sides extend from the edges of the second antiferromagnetic layers at the track width region sides toward the central region of the multilayer film, since the edges of the electrode layers at the track width region sides extend over the nonmagnetic layer, a DC current supplied to the electrode layer can be transmitted without passing through the ferromagnetic layer and the second antiferromagnetic layer. Accordingly, the DC resistance of the magnetic sensing elements of the present invention can be reduced.

The magnetic sensing element of the present invention may be a magnetic sensing element of a current-perpendicular-to-plane (CPP) type, in which the electrode layers are provided on the upper and lower surfaces of the multilayer film so that a current flows perpendicular to the planes of the individual layers of the multilayer film.

In the CPP-type magnetic sensing element of the present invention, the upper electrode layer over the multilayer film may be composed of a magnetic material and may further act as an upper shielding layer.

Preferably, an insulating layer is provided on the second antiferromagnetic layers and an upper electrode layer is formed over the insulating layer and the nonmagnetic layer. Consequently, it is possible to reduce the amount of shunt in the sensing current from the upper electrode layer to the second antiferromagnetic layers. Thus the output of the magnetic sensing element is improved and narrowing of the effective track width is accelerated.

The lower electrode layer under the multilayer film may be composed of a magnetic material and may also act as a lower shielding layer.

Preferably, a protruding section extending toward the multilayer film is provided in the center of the lower electrode layer in the track width direction such that the upper surface is in contact with the lower surface of the multilayer film and insulating layers are provided between the multilayer film and the lower electrode layer on both sides of the protruding section between the lower surface of the multilayer film and upper surface of the side regions of the second electrode layer in the track width direction of the lower electrode layer. In such a structure, the width of the sensing current path is reduced such that the effective track width can be further narrowed.

Preferably, the upper surface of the protruding section is flush with the upper surfaces of the insulating layers provided on the side regions of the lower electrode layer. Consequently, the multilayer film to be formed on the lower electrode layer and the insulating layers can be stably formed on the planar surface so as to better stabilize the magnetic sensing element.

Preferably, the nonmagnetic material layer is composed of a nonmagnetic conductive material. The magnetic sensing element in which the nonmagnetic material layer is composed of a nonmagnetic conductive material is referred to as a spin-valve GMR-type magnetoresistive element (CPP-GMR).

In the CPP-type magnetic sensing element of the present invention, the nonmagnetic material layer may be composed of an insulating material. Such a magnetic sensing element is referred to as a spin-valve tunneling magnetoresistive element (CPP-TMR).

Additionally, the free magnetic layer and the ferromagnetic layer must have different magnetic moments per unit area. The magnitude of the magnetic moment of the free magnetic layer or the ferromagnetic layer per unit area is the product of the saturation magnetization (Ms) and the thickness (t) of the layer.

Preferably, the pinned magnetic layer includes a plurality of ferromagnetic sublayers laminated to each other, a nonmagnetic intermediate sublayer being placed between two adjacent ferromagnetic sublayers, and the magnetization directions of the two adjacent ferromagnetic sublayers are in an antiparallel, ferrimagnetic state.

When the pinned magnetic layer has such a structure, the plurality of ferromagnetic sublayers pin each other's magnetization directions. As a result, it is possible to pin the magnetization direction of the entire pinned magnetic layer strongly in a predetermined direction and increase the exchange coupling magnetic field (Hex) between the second antiferromagnetic layer and the pinned magnetic layer.

Additionally, the demagnetizing field (dipole magnetic field) due to the pinned magnetization of the pined magnetic layer can be cancelled because the magnetostatic coupling magnetic fields of the plurality of ferromagnetic sublayers counteract each other. As a result, the contribution of the demagnetizing field (dipole magnetic field) by the pinned magnetization of the pinned magnetic layer to the variable magnetization of the free magnetic layer can be reduced.

Consequently, the variable magnetization of the free magnetic layer is more easily adjusted in a desired direction, and it is possible to obtain a magnetic sensing element which exhibits superior symmetry and low asymmetry.

Herein, asymmetry is defined as the degree of asymmetry of a regenerated output waveform. If the waveform is symmetrical, the asymmetry is decreased. Therefore, as the asymmetry is brought closer to zero, the regenerated output waveform has a more superior symmetry.

The asymmetry is zero when the direction of the variable magnetization of the free magnetic layer and the direction of the pinned magnetization of the pinned magnetic layer are perpendicular to each other. When the asymmetry is greatly increased, it is not possible to read the data accurately from the media, resulting in an error. Therefore, as the asymmetry is brought closer to zero, the reliability of processing regenerated signals is improved, resulting in a superior spin-valve magnetic sensing element.

In general, the demagnetizing field (dipole magnetic field) Hd has a nonuniform distribution in which the values are large at the ends and small in the center in the element height direction. Therefore, in some cases, the free magnetic layer may be prevented from being aligned in a single-domain state. However, by using the pinned magnetic layer having the laminated structure as described above, the dipole magnetic field Hd can be substantially set at zero. Thus, nonuniform distribution of the magnetization is prevented from occurring due to the formation of domain walls in the free magnetic layer. This makes it possible to prevent Barkhausen noise, etc. from occurring.

In the present invention, the free magnetic layer preferably includes a plurality of ferromagnetic sublayers laminated to each other, a nonmagnetic intermediate sublayer being placed between two adjacent ferromagnetic sublayers. The magnetization directions of the two adjacent ferromagnetic sublayers are in an antiparallel, ferrimagnetic state. Consequently, the same advantage is obtained as in the case in which magnetic sensitivity is improved by decreasing the thickness of the free magnetic layer.

Additionally, the magnitude of the magnetic moment per unit area of the ferromagnetic sublayer is represented by the product of the saturation magnetization (Ms) and the thickness (t) of the ferromagnetic sublayer.

The nonmagnetic intermediate sublayer may be composed of any one of Ru, Rh, Ir, Os, Cr, Re, and Cu, or an alloy of at least two of these elements.

In the present invention, at least one of the ferromagnetic layer or the free magnetic layer is preferably composed of a magnetic material represented by the formula CoFeNi, wherein the Fe content is in the range of 9 to 17 atomic percent, the Ni content is in the range of 0.5 to 10 atomic percent, and the balance is Co.

Preferably, the magnetic sensing element of the present invention further includes an interlayer composed of Co or a CoFe alloy between the free magnetic layer and the nonmagnetic material layer.

When the interlayer is formed, at least one of the ferromagnetic layer or the free magnetic layer is preferably composed of a magnetic material represented by the formula CoFeNi, wherein the Fe content is in the range of 7 to 15 atomic percent, the Ni content is in the range of 5 to 15 atomic percent, and the balance is Co.

Preferably, both the ferromagnetic layer and the free magnetic layer are composed of magnetic material represented by the formula CoFeNi.

In the present invention, the ferromagnetic layer, the nonmagnetic layer, and the free magnetic layer form a laminated ferrimagnetic structure under the second antiferromagnetic layer in which the magnetization directions of the ferromagnetic layer and the free magnetic layer sandwiching the nonmagnetic layer are in an antiparallel, ferrimagnetic state.

In order to maintain the antiparallel magnetization state appropriately, the exchange coupling magnetic field due to the RKKY interaction between the ferromagnetic layer and the free magnetic layer must be increased by improving the materials for the ferromagnetic layer and the free magnetic layer.

NiFe alloys are often used as magnetic materials for forming the ferromagnetic layer and the free magnetic layer. Although the NiFe alloys have been used for free magnetic layers, etc. due to superior soft magnetic properties, when the laminated ferrimagnetic structure is constructed using the NiFe alloys for the ferromagnetic layer and the free magnetic layer, antiparallel coupling between these layers is not substantially large.

Therefore, in the present invention, a CoFeNi alloy is used for at least one of the ferromagnetic layer and the free magnetic layer, and preferably for both of these layers. By utilizing the improved C-containing alloys of the present invention, antiparallel coupling between the ferromagnetic layer and the free magnetic layer is increased and the magnetizations of the side regions of the free magnetic layer located at both sides in the track width direction are not influenced by an external magnetic field. Thus, side reading can be appropriately suppressed.

FIG. 17 is a conceptual diagram of a hysteresis loop for a so-called "laminated ferrimagnetic structure" in which thin films composed of ferromagnetic materials are laminated with a nonmagnetic material layer therebetween. For example, the magnetic moment (saturation magnetization Ms×thickness t) per unit area of a first ferromagnetic layer (F1) is assumed to be larger than the magnetic moment per unit area of a second ferromagnetic layer (F2). An external magnetic field is assumed to be applied rightward in the drawing.

A resultant magnetic moment per unit area determined by the vector sum of the magnetic moment per unit area of the first ferromagnetic layer and the magnetic moment per unit area of the second ferromagnetic material layer (|Ms·t(F1)+Ms·t(F2)|) remains constant up to a certain point, even if the external magnetic field is increased. In an external magnetic field region A in which the resultant magnetic moment per unit area remains constant, since antiparallel coupling between the first ferromagnetic layer and the second ferromagnetic layer is stronger than the external magnetic field, the magnetizations of the first and second ferromagnetic layers are aligned in antiparallel, single-domain states.

However, the resultant magnetic moment per unit area increases as the rightward external magnetic field is further increased. Since the external magnetic field is stronger than the antiparallel coupling between the first ferromagnetic layer and the second ferromagnetic layer, the magnetizations of the first ferromagnetic layer and the second ferromagnetic layer are dispersed and the single-domain states are changed to multidomain states. Thus the resultant magnetic moment per unit area determined by the vector sum is increased. In an external magnetic field region B in which the resultant magnetic moment per unit area is increased, the antiparallel state of the ferromagnetic layers is lost. The magnitude of the external magnetic field at which the resultant magnetic moment per unit area starts to increase is referred to as a spin-flop magnetic field (Hsf).

When the rightward external magnetic field is increased further, the magnetizations of the first ferromagnetic layer and the second ferromagnetic layer are aligned in single-domain states again, and both layers are magnetized rightward this time. In this case, the resultant magnetic moment per unit area in this external magnetic field region C remains constant. The magnitude of the external magnetic field at which the resultant magnetic moment per unit area becomes constant is referred to as a saturation magnetic field (Hs).

It has been found that, when the CoFeNi alloy is used for the first ferromagnetic layer and the second ferromagnetic layer, the magnetic field at which the antiparallel state is lost, i.e., the spin-flop magnetic field (Hsf), can be satisfactorily increased compared to the case in which the NiFe alloy is used.

Experiments were conducted to determine the magnitude of the spin-flop magnetic field wherein both the first and second ferromagnetic layers comprise either a NiFe alloy (Comparative Example) or a CoFeNi alloy (Example) in accordance with the present invention.

The film structure used was substrate/nonmagnetic material layer (Cu)/first ferromagnetic layer (2.4 nm)/nonmagnetic interlayer (Ru)/second ferromagnetic layer, (1.4 nm).

When using a NiFe alloy with a Ni content of 80 atomic percent and a Fe content of 20 atomic percent in both the first second ferromagnetic layers (Comparative Example), the spin-flop magnetic field (Hsf) was approximately 59 kA/m.

By comparison, use of a CoFeNi alloy with a Co content of 87 atomic percent, an Fe content of 11 atomic percent, and an Ni content of 2 atomic percent resulted in a spin-flop magnetic field (Hsf) of approximately 293 kA/m.

As evidenced by the above experiment, the spin-flop magnetic field can be greatly improved by using a CoFeNi alloy for the first and second ferromagnetic layers as compared to the use of a NiFe alloy therein.

That is, by using a CoFeNi alloy for at least one of the ferromagnetic layer and the free magnetic layer, preferably for both layers, the spin-flop magnetic field of the ferromagnetic layer and the free magnetic layer can be effectively improved.

Next, the compositional ratio of the CoFeNi alloy will be described. The magnetostriction of a layer composed of the CoFeNi alloy is known to be shifted positively by approximately $1\times6^{-6}$ to $6\times10^{-6}$ when contacted with a nonmagnetic Interlayer composed of Ru as compared to the case in which a NiFe alloy is used.

The magnetostriction is preferably in the range of $-3\times10^{-6}$ to $3\times10^{-6}$. The coercive force is preferably 790 A/m or less. If the magnetostriction is large, stress tends to increase due to film deposition strain and differences in thermal expansion coefficients among layers. By maintaining a low coercive force, the magnetization of the free magnetic layer can be satisfactorily reversed in response to an external magnetic field.

In the present invention, when a film structure of nonmagnetic material layer/free magnetic layer/nonmagnetic layer/ferromagnetic layer is employed in conduction with a CoFeNi alloy, preferably, the Fe content is in the range of 9 to 17 atomic percent, the Ni content is in the range of 0.5 to 10 atomic percent, and the balance is Co. If the Fe content is larger than 17 atomic percent, the magnetostriction is negatively increased from $-3\times10^{-6}$ and soft magnetic properties are degraded.

If the Fe content is less than 9 atomic percent, the magnetostriction exceeds $3\times10^{-6}$ and soft magnetic properties are degraded.

If the Ni content is larger than 10 atomic percent, the magnetostriction exceeds $3\times10^{-6}$ and a change in resistance ($\Delta R$) and a rate of change in resistance ($\Delta R/R$) are reduced. This is due, in part, to diffusion of Ni at the interface with the nonmagnetic layer.

If the Ni content is less than 0.5 atomic percent, the magnetostriction negatively increases from $-3\times10^{-6}$.

The coercive force can be set at 790 A/m or less if the compositional ranges described above are satisfied.

Next, when an interlayer composed of a CoFe alloy or Co is formed between the free magnetic layer and the nonmagnetic material layer, as exemplified by a film structure of nonmagnetic material layer/interlayer (CoFe alloy)/free magnetic layer/nonmagnetic layer/ferromagnetic layer, with respect to the CoFeNi alloy, preferably, the Fe content is in the range of 7 to 15 atomic percent, the Ni content is in the range of 5 to 15 atomic percent, and the balance is Co. If the Fe content is larger than 15 atomic percent, the magnetostriction is increased negatively from $3\times10^{-6}$ and soft magnetic properties are degraded.

If the Fe content is less than 7 atomic percent, the magnetostriction exceeds $3\times10^{-6}$ and soft magnetic properties are degraded.

If the Ni content is larger than 15 atomic percent, the magnetostriction exceeds $3\times10^{-6}$.

If the Ni content is less than 5 atomic percent, the magnetostriction is negatively increased from $-3\times10^{-6}$.

If the compositional ranges described above are satisfied, the coercive force can be set at 790 A/m or less.

Additionally, since the interlayer composed of the CoFe alloy or Co has negative magnetostriction, when using the CoFeNi alloy, the Fe content should be slightly decreased and the Ni content should be slightly increased as compared to when the interlayer is not interposed between the free magnetic layer and the nonmagnetic material layer.

By disposing an interlayer composed of a CoFe alloy or Co between the nonmagnetic material layer and the free magnetic layer as described above, diffusion of metallic elements between the free magnetic layer and the nonmagnetic material layer can be more effectively avoided.

In the present invention, the first antiferromagnetic layer and/or the second antiferromagnetic layers may be composed of the same antiferromagnetic material having the same composition. Consequently, the magnetization of the first ferromagnetic layer can be easily directed perpendicular to the magnetization direction of the second ferromagnetic layer, and it is possible to direct the magnetizations of the free magnetic layer and the pinned magnetic layer perpendicular to each other in the absence of an external magnetic field.

In the magnetic sensing element of the present invention, preferably, the first antiferromagnetic layer and/or the second antiferromagnetic layers are composed of any one of a PtMn alloy; an X—Mn alloy, wherein X is at least one element selected from the group consisting of Pd, Ir, Rh, Ru, Os, Ni, and Fe; and a Pt—Mn—X' alloy, wherein X' is at least one element selected from the group consisting of Pd, Ir, Rh, Ru, Au, Ag, Os, Cr, Ni, Ar, Ne, Xe, and Kr.

In the PtMn alloy or the X—Mn alloy, the Pt content or the X content is preferably in the range of 37 to 63 atomic percent.

In the Pt—Mn—X' alloy, the X'+Pt content is preferably in the range of 37 to 63 atomic percent. Furthermore, in the Pt—Mn—X' alloy, the X' content is preferably in the range of 0.2 to 10 atomic percent. However, when X' is at least one element selected from the group consisting of Pd, Ir, Rh, Ru, Os, Ni, and Fe, the X' content is preferably in the range of 0.2 to 40 atomic percent.

By using the alloys in the appropriate compositional ranges described above, followed by annealing, a first antiferromagnetic layer and second antiferromagnetic layers generating large exchange coupling magnetic fields can be obtained. In particular, by using PtMn alloys, it is possible to obtain a first antiferromagnetic layer and second antiferromagnetic layers which generate exchange coupling magnetic fields of 48 kA/m or more, for example, exceeding 64 kA/m, and which have a significantly high blocking temperature of 380° C., the blocking temperature being a temperature at which the exchange coupling magnetic fields are lost.

Although these alloys have a disordered face-centered cubic (fcc) structure immediately after being deposited, the structure is transformed into a CuAuI-type ordered face-centered tetragonal (fct) structure by annealing.

The present invention further provides a magnetic sensing element comprising a multilayer film core structure, wherein the core structure includes an underlayer; a antiferromagnetic layer; a synthetic ferri-pinned-type pinned magnetic layer comprising a first pinned magnetic sublayer, a nonmagnetic intermediate sublayer, and a second pinned magnetic sublayer; a free magnetic layer comprising a diffusion-preventing layer and a magnetic layer; and a nonmagnetic layer.

In accordance with the present invention, a method for making a magnetic sensing element includes the steps of:
(a) forming a multilayer film on a substrate, the multilayer film including a first antiferromagnetic layer, a pinned magnetic layer, a nonmagnetic material layer, a free magnetic layer, and a nonmagnetic layer;
(b) annealing the multilayer film at a first annealing temperature in a first magnetic field having a first magnitude so as to pin the magnetization of the pinned magnetic layer in a predetermined direction;
(c) forming a first resist layer for a lift-off process on the nonmagnetic layer, the lower surface of the first resist layer having cutout sections;
(d) forming ferromagnetic layers on the nonmagnetic layer;
(e) forming second antiferromagnetic layers on the ferromagnetic layers; and
(f) annealing the multilayer film at a second annealing temperature in a second magnetic field having a second magnitude so as to pin the magnetization of the free magnetic layer in a direction substantially perpendicular to the magnetization direction of the pinned magnetic layer.

In the present invention, the multilayer film formed in step (a), in which the nonmagnetic layer is the uppermost layer, is annealed in the first magnetic field, and in step (e), a ferromagnetic material and an antiferromagnetic material are deposited on the nonmagnetic layer. Consequently, it is possible to obtain a magnetic sensing element in which the ferromagnetic layers and the second antiferromagnetic layers are formed on the planar upper surface of the nonmagnetic layer.

In the present invention, since the multilayer film is annealed in the magnetic field to pin the magnetization of the pinned magnetic layer in the predetermined direction in the state in which the second antiferromagnetic layers are not formed on the multilayer film, when the second antiferromagnetic layers are formed on the multilayer film, exchange anisotropic magnetic fields are not generated between the second antiferromagnetic layers and the ferromagnetic layers.

That is, the exchange anisotropic magnetic fields by the second antiferromagnetic layers are generated for the first time in step (f) so as to change the magnetization direction of the free magnetic layer easily to the predetermined direction. Therefore, the magnetization direction of the free magnetic layer is easily pinned in the direction substantially perpendicular to the magnetization direction of the pinned magnetic layer.

In step (f), the second annealing temperature is preferably lower than the blocking temperature of the first antiferromagnetic layer, and the magnitude of the second magnetic field is preferably smaller than the exchange anisotropic magnetic field of the first antiferromagnetic layer.

In the present invention, in steps (d) and (e), the ferromagnetic layers, the second antiferromagnetic layers, and electrode layers are continuously deposited using the first resist layer as a mask, and the first resist layer is then removed. Thereby, in the resultant magnetic sensing element, the electrode layers are placed on the second antiferromagnetic layers, and the edges of the electrode layers at the track width region sides overlap with the edges of the second antiferromagnetic layers at the track width region sides.

After step (e), the method for making the magnetic sensing element may further include the steps of:
(g) removing the first resist layer;
(h) forming a second resist layer for a lift-off process on the nonmagnetic layer and the second antiferromagnetic layers, the second resist layer having cutout sections;
(i) forming electrode layers on the second antiferromagnetic layers; and
(j) removing the second resist layer.

Consequently, in the resultant magnetic sensing element, the electrode layers are formed on the second antiferromagnetic layers, and the edges of the electrode layers at the track width region sides are placed closer to the side faces of the multilayer film compared to the edges of the second antiferromagnetic layers at the track width region sides.

Alternatively, after step (e), the method may further include the steps of:
(k) removing the first resist layer;
(l) forming a second resist layer for a lift-off process on the nonmagnetic layer, the second resist layer having cutout sections, the width in the track width direction of the bottom face of the second resist layer being smaller than the width of the bottom face of the first resist layer;
(m) forming electrode layers on the nonmagnetic layer and the second antiferromagnetic layers; and
(n) removing the second resist layer.

Consequently, in the resultant magnetic sensing element, the electrode layers are placed on the second antiferromagnetic layers, the edges of the electrode layers at the track width region sides extend from the edges of the second antiferromagnetic layers at the track width region sides toward the central region of the multilayer film.

When a CPP-type magnetic sensing element is fabricated, preferably, the method further includes: before step (a), step (o) of forming a lower electrode layer on the substrate; and after step (e), step (p) of masking the central region in the track width direction of the nonmagnetic layer; step (q) of forming an insulating layer on the second antiferromagnetic layers; and step (r) of forming an upper electrode layer electrically connecting to the multilayer film.

More preferably, the method further includes: between step (o) and step (a), step (s) of forming a protruding section which protrudes toward the multilayer film in the center in the track width direction of the lower electrode layer; and step (t) of forming insulating layers on the side regions in the track width direction of the lower electrode layer; and in step (a), the multilayer film is formed so that the upper surface of the protruding section is in contact with the lower surface of the multilayer film.

In step (t), preferably, the upper surface of the protruding section is flush with the upper surfaces of the insulating layers provided on the side regions of the lower electrode layers.

Preferably, the lower electrode layer and/or the upper electrode layer are composed of a magnetic material. Consequently, the lower electrode layer and/or the upper electrode layer function as the lower shielding layer and/or the upper shielding layer.

The upper electrode layer may be a laminate including a nonmagnetic conductive layer electrically connected to the multilayer film and a magnetic layer.

In the present invention, preferably, the nonmagnetic material layer is composed of a nonmagnetic conductive material. The magnetic sensing element in which the nonmagnetic material layer is composed of a nonmagnetic conductive material is referred to as a spin-valve GMR-type magnetoresistive element (CPP-GMR).

In the CPP-type magnetic sensing element of the present invention, the nonmagnetic material layer may be composed of an insulating material. Such a magnetic sensing element is referred to as a spin-valve tunneling magnetoresistive element (CPP-TMR).

Additionally, if the nonmagnetic layer is composed of one of Ru, Rh, Ir, Os, and Re, or an alloy of at least two of these elements in step (a), the surface of the nonmagnetic layer is not substantially oxidized in step (b). Therefore, even if the surface of the nonmagnetic layer is not treated by milling or the like before the ferromagnetic layers are formed by sputtering in step (d), RKKY interactions can be generated by the free magnetic layer and the ferromagnetic layers with the nonmagnetic layer therebetween.

That is, in accordance with the method for making the magnetic sensing element of the present invention, since the interfaces between the nonmagnetic layer and the ferromagnetic layers are not required to be trimmed by milling, it is possible to prevent a decrease in the unidirectional anisotropic magnetic field for aligning the magnetization direction of the free magnetic layer in each side region in a predetermined direction.

However, since the free magnetic layer and the ferromagnetic layers are magnetically coupled to each other with the nonmagnetic layer therebetween by the RKKY interactions, even when the interfaces between the nonmagnetic later and the ferromagnetic layers are surfaces trimmed by milling, it is possible to obtain unidirectional anisotropic magnetic fields having a magnitude sufficient for aligning the magnetization directions in the side regions of the free magnetic layer in a predetermined direction.

In step (a), preferably, the nonmagnetic layer is composed of Ru and the thickness of the nonmagnetic layer is set at 0.8 to 1.1 nm.

Alternatively, in step (a), preferably, a conductive material layer placed between the nonmagnetic layer and the free magnetic layer, the conductive material layer having a lower resistivity than that of the nonmagnetic layer. In such a case, more preferably, the nonmagnetic layer is composed of Ru and has a thickness of 0.4 to 1.1 nm, and the conductive material layer is composed of Cu and has a thickness of 0.3 to 0.5 nm.

Preferably, in step (a), the pinned magnetic layer is formed by laminating a plurality of ferromagnetic layers having different magnetic moments (Ms×t) per unit area, a nonmagnetic interlayer being placed between the two adjacent ferromagnetic layers.

Preferably, in step (a), the free magnetic layer is formed by laminating a plurality of ferromagnetic layers having different magnetic moments (Ms×t) per unit area, a nonmagnetic interlayer being placed between the two adjacent ferromagnetic layers.

Preferably, the nonmagnetic interlayer is composed of any one of Ru, Rh, Ir, Os, Cr, Re, and Cu, or an alloy of at least two of these elements.

In the present invention, the same antiferromagnetic material may be used for the first antiferromagnetic layer and the second antiferromagnetic layers.

Preferably, the first antiferromagnetic layer and/or the second antiferromagnetic layers are composed of any one of a PtMn alloy, an X—Mn alloy, wherein X is at least one element selected from the group consisting of Pd, Ir, Rh, Ru, Os, Ni, and Fe, and a Pt—Mn—X' alloy, wherein X' is at least one element selected from the group consisting of Pd, Ir, Rh, Ru, Au, Ag, Os, Cr, Ni, Ar, Ne, Xe, and Kr.

DESCRIPTION OF THE PREFERRED EMBODIMENTS

Figure 1:
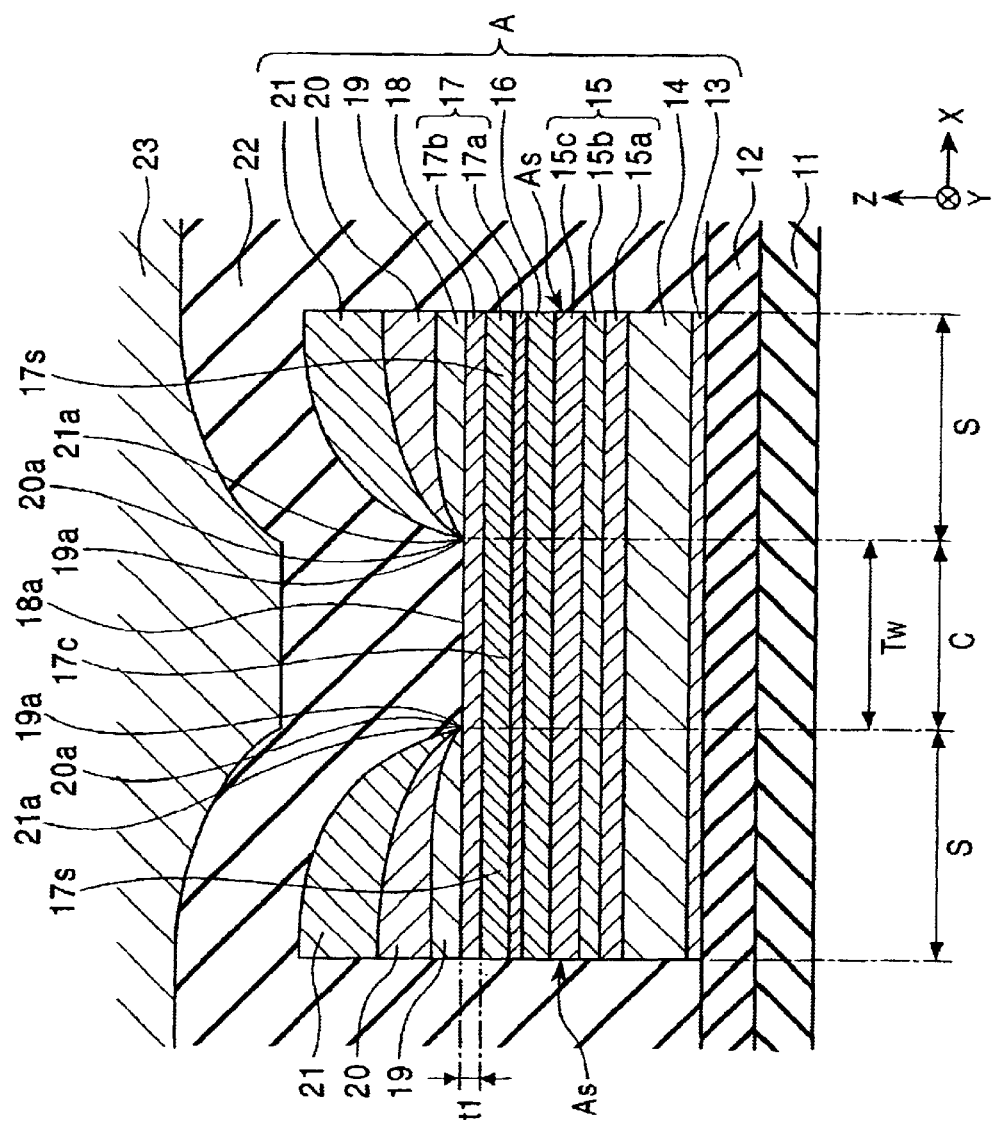
FIG. 1 is a sectional view of a magnetic sensing element in a first embodiment of the present invention.

FIG. 1 is a sectional view of a magnetic sensing element in a first embodiment of the present invention, viewed from a surface facing a recording medium.

The magnetic sensing element shown in FIG. 1 reads recorded signals by detecting fringing magnetic fields from a recording medium, such as a hard disk, using the magnetoresistance effect. Recording tracks are formed on the recording medium.

The surface facing the recording medium faces the surface of the recording medium on which the recording tracks are formed.

As shown in FIG. 1, a multilayer film A, which constitutes the magnetic sensing element in this embodiment, is deposited on a lower shielding layer 11 composed of a magnetic material, such as NiFe, with a lower gap layer 12 therebetween. The multilayer film A includes an underlayer 13; a first antiferromagnetic layer 14; a synthetic ferri-pinned-type pinned magnetic layer 15 including a first pinned magnetic sublayer 15a, a nonmagnetic intermediate sublayer 15b, and a second pinned magnetic sublayer 15c; a nonmagnetic material layer 16; a free magnetic layer 17 including a diffusion-preventing layer 17a and a magnetic layer 17b; a nonmagnetic layer 18; ferromagnetic layers 19; second antiferromagnetic layers 20; and electrode layers 21, which are deposited in that order from the bottom by a thin-film forming process, such as sputtering or vapor deposition. The second antiferromagnetic layers 20 and the ferromagnetic layers 19 function as longitudinal bias layers for the free magnetic layer 17.

An upper gap layer 22 is formed over the upper surface and the side faces of the multilayer film A, and an upper shielding layer 23 is formed on the upper gap layer 22.

When the multilayer film A constitutes a floating-type head, the lower shielding layer 11 is deposited on a trailing edge of a ceramic slider with an insulating film composed of $Al_2O_3$ or the like therebetween. An inductive head for writing may be deposited on the magnetic sensing element.

The lower shielding layer 11 and the upper shielding layer 23 are composed of ferromagnetic materials, such as NiFe. The lower shielding layer 11 and the upper shielding layer 23 may be formed by plating. Preferably, the easy magnetization axes of the lower shielding layer 11 and the upper shielding layer 23 are directed in the track width direction.

The lower gap layer 12 and the upper gap layer 22 are composed of insulating materials, such as $Al_2O_3$, $SiO_2$, and Al—Si—O.

The underlayer 13 is, for example, composed of Ta. Additionally, a seed layer may be formed using NiFeCr or Cr between the underlayer 13 and the antiferromagnetic layer 14 or instead of the underlayer 13. The seed layer aligns the crystal orientation of the first antiferromagnetic layer 14.

The first antiferromagnetic layer 14 and the second antiferromagnetic layers 20 are composed of any one of a PtMn alloy, an X—Mn alloy, wherein X is at least one element selected from the group-consisting of Pd, Ir, Rh, Ru, Os, Ni, and Fe, and a Pt—Mn—X' alloy, wherein X' is at least one element selected from the group consisting of Pd, Ir, Rh, Ru, Au, Ag, Os, Cr, Ni, Ar, Ne, Xe, and Kr.

By using the alloys described above, followed by annealing, a first antiferromagnetic layer 14 and second antiferromagnetic layers 20 generating large exchange coupling magnetic fields can be obtained. In particular, by using PtMn alloys, it is possible to obtain a first antiferromagnetic layer 14 and second antiferromagnetic layers 20 capable of generating exchange coupling magnetic fields of 48 kA/m or more. For example, between the first antiferromagnetic layer 14 and the first pinned magnetic sublayer 15a and between the second antiferromagnetic layers 20 and the ferromagnetic layers 19, exchange coupling magnetic fields exceeding 64 kA/m can be obtained. Moreover, use of e.g. PtMn alloys can increase the blocking temperature at which the exchange coupling magnetic fields are lost to 380° C.

Although the above alloys have a disordered face-centered cubic (fcc) structure immediately after being deposited, the structure is transformed into a CuAuI-type ordered face-centered tetragonal (fct) structure by annealing.

The first antiferromagnetic layer 14 has a thickness of 8 to 30 nm, for example, 20 nm, in the vicinity of the center of the layer in the track width direction. Additionally, in the magnetic sensing element according to this embodiment, the same antiferromagnetic material having the same composition may be used for the first antiferromagnetic layer 14 and the second antiferromagnetic layers 20.

In the PtMn alloy or the X—Mn alloy, the Pt content or the X content is preferably in the range of 37 to 63 atomic percent. In the Pt—Mn—X' alloy, the X'+Pt content is preferably in the range of 37 to 63 atomic percent. Furthermore, in the Pt—Mn—X' alloy, the X' content is preferably in the range of 0.2 to 10 atomic percent. However, when X' is at least one element selected from the group consisting of Pd, Ir, Rh, Ru, Os, Ni, and Fe, the X' content is preferably in the range of 0.2 to 40 atomic percent.

The first and second pinned magnetic sublayers 15a and 15c are composed of ferromagnetic materials, such as a NiFe alloy, Co, a CoNiFe alloy, a CoFe alloy, and a CoNi alloy, and preferably, are composed of a NiFe alloy, a CoFe alloy, or Co. Preferably, the first and second pinned magnetic sublayers 15a and 15c are composed of the same material.

The nonmagnetic intermediate sublayer 15b is composed of an element selected from the group consisting of Ru, Rh, Ir, Os, Cr, Re, and Cu, or an alloy of at least two of these elements. Preferably, the nonmagnetic intermediate sublayer 15b is composed of Ru.

The nonmagnetic material layer 16 prevents the pinned magnetic layer 15 and the free magnetic layer 17 from being magnetically coupled to each other, and is a layer through which the sensing current primarily passes. The nonmagnetic material layer 16 is preferably composed of a nonmagnetic conductive material, such as Cu, Cr, Au, or Ag, and more preferably, Cu.

The free magnetic layer 17 includes a diffusion-preventing layer (intermediate layer) 17a and a magnetic layer 17b. The diffusion preventing layer 17a is composed of a ferromagnetic material, such as Co or a CoFe alloy. The diffusion-preventing layer 17a prevents interdiffusion between the magnetic layer 17b and the nonmagnetic material layer 16. The magnetic layer 17b is composed of a ferromagnetic material, such as a NiFe alloy, Co, a CoNiFe alloy, a CoFe alloy, or a CoNi alloy. Additionally, the free magnetic layer 17 may be single-layered.

When the diffusion-preventing layer 17a is provided, as is the case in this embodiment, the magnetic layer 17b is preferably composed of a CoFeNi alloy in which the Fe content is in the range of 7 to 15 atomic percent, the Ni content is in the range of 5 to 15 atomic percent, and the balance is Co.

Consequently, the strength of exchange coupling magnetic fields due to RKKY interactions generated between the free magnetic layer 17 and the ferromagnetic layers 19 can be increased. Specifically, the strength of the magnetic field at which the antiparallel state is lost, i.e., the spin-flop magnetic field (Hsf), can be increased to approximately 293 kA/m.

As a result, the magnetizations of side regions 17s of the free magnetic layer 17, which overlap with the second antiferromagnetic layers 20 and the ferromagnetic layers 19, can be appropriately pinned, and thus side reading can be inhibited.

Preferably, both the magnetic layer 17b and the ferromagnetic layers 19 are composed of the CoFeNi alloy. Consequently, stabler and stronger spin-flop magnetic fields can be obtained, and the free magnetic layer 17 and the ferromagnetic layers 19 can be appropriately magnetized in an antiparallel state.

If the compositional ranges described above are satisfied, the magnetostrictions of the magnetic layer 17b and the ferromagnetic layers 19 can be set in the range of $-3 \times 10^{-6}$ to $3 \times 10^{-6}$, and the coercive forces can be decreased to 790 A/m or less.

Furthermore, the soft magnetic properties of the free magnetic layer 17 can be improved so as to suppress decreases in the change in resistance ($\Delta R$) and the rate of change in resistance ($\Delta R/R$) due to the diffusion of Ni in the magnetic layer 17b into the diffusion-preventing layer 17a and the nonmagnetic material layer 16.

Additionally, when the free magnetic layer 17 is formed as a single magnetic layer, the free magnetic layer 17 is preferably composed of a ferromagnetic material represented by the formula CoFeNi, wherein the Fe content is in the range of 9 to 17 atomic percent, the Ni content is 0.5 to 10 atomic percent, and the balance is Co.

The nonmagnetic layer 18 is composed of an element selected from the group consisting of Ru, Rh, Ir, Os, and Re, or an alloy of at least two of these elements.

The ferromagnetic layers 19 are composed of a ferromagnetic material, such as a NiFe alloy, Co, a CoNiFe alloy, a CoFe alloy, or a CoNi alloy. Preferably, the ferromagnetic layers 19 are composed of a ferromagnetic material represented by the formula CoFeNi, wherein the Fe content is in the range of 9 to 17 atomic percent, the Ni content is in the range of 0.5 to 10 atomic percent, and the balance is Co.

The electrode layers 21 are formed, for example, using Au, W, Cr, or Ta.

Additionally, the electrode layers 21 may be disposed on the second antiferromagnetic layers 20 with electrode underlayers composed of Ta, Cr, or the like therebetween.

In this embodiment, electrode layers 21 are disposed on the second antiferromagnetic layers 20, and the edges 21a of electrode layers 21 at the track width region C sides overlap with the edges 20a of the second antiferromagnetic layers 20 at the track width region C sides. Edges 19a of the ferromagnetic layers 19 at the track width region C sides also overlap with the edges 21a of the electrode layers 21 and the edges 20a of the second antiferromagnetic layers 20.

In the multilayer film A shown in FIG. 1, the track width region C corresponds to a region placed between the pair of electrode layers 21, the pair of second antiferromagnetic layers 20, and the pair of ferromagnetic layers 19 which are formed with a distance in the track width direction (in the X direction) therebetween.

In this embodiment, the magnetization directions of the ferromagnetic layers 19 placed under the second ferromagnetic layers 20 are aligned in the track width direction by magnetic coupling with the second antiferromagnetic layers 20. The magnetization directions of the side regions 17s of the free magnetic layer 17 formed under the ferromagnetic layers 19 with the nonmagnetic layer 18 therebetween are fixed in a direction antiparallel to the track width direction. That is, the ferromagnetic layer 19, the nonmagnetic layer 18, and the free magnetic layer 17 form a synthetic ferrimagnetic structure under the second antiferromagnetic layer 20.

Consequently, the magnetization directions of the side regions 17s of the free magnetic layer 17 are aligned in a direction substantially perpendicular to the magnetization direction of the pinned magnetic layer 15.

On the other hand, when an external magnetic field is not applied, the magnetization direction of a central region (track width region) 17c of the free magnetic layer 17, in which the free magnetic layer 17 does not overlap with the second antiferromagnetic layers 20 and the ferromagnetic layers 19, is directed in the direction antiparallel to the track width direction (in the direction antiparallel to the X direction), following the side regions 17s, and when an external magnetic field is applied in a direction perpendicular to the track width direction (in the height direction, i.e., in the Y direction), the magnetization direction of the central region 17c is changed toward the height direction.

Electrical resistance changes due to the relationship between the varying magnetization direction of the free magnetic layer 17 in the track width region 17c and the pinned magnetization direction of the pinned magnetic layer 15, exemplify the magnetoresistance effect. This effect can be detected by a voltage change resulting from electrical resistance changes in an external magnetic field, such as a fringing magnetic field from a magnetic recording medium.

In this embodiment, since the synthetic ferrimagnetic structure comprises a ferromagnetic layer 19, a nonmagnetic layer 18, and a free magnetic layer 17 under the second antiferromagnetic layer 20, it is possible to increase the unidirectional anisotropic magnetic field for aligning the magnetization direction of the free magnetic layer 17 in each side region 17s in a predetermined direction.

Consequently, it is possible to prevent the magnetic track width from being increased because of changes in the magnetization directions of the side regions 17s of the free magnetic layer 17 due to an external magnetic field.

Even if the exchange coupling magnetic fields between the pair of second antiferromagnetic layers 20 and the pair of ferromagnetic layers 19 are relatively weak, the magnetization direction of the free magnetic layer 17 can be easily and reliably directed substantially perpendicular to the magnetization direction of the pinned magnetic layer 15. Therefore, a sufficient unidirectional anisotropic magnetic field can be obtained even in a section in which the thickness of the end of the second antiferromagnetic layer 20 is decreased.

Consequently, the track width (optical track width) Tw of the magnetic sensing element is accurately defined as the distance between the edges 19a at the track width region C sides of the ferromagnetic layers 19. The track width Tw region effectively contributes to regeneration of the recorded magnetic field by constituting a sensitive region exhibiting the magnetoresistance effect. Moreover, the Tw region allows for the possibility of preventing side reading in which recorded signals are read in regions outside the track width Tw region of the magnetic sensing element (side regions S of the multilayer film A).

That is, since the optical track width corresponds to the magnetic track width and insensitive regions do not occur, it is possible to increase recording density by preventing the read output from decreasing when the optical track width Tw of the magnetic sensing element is decreased.

Further, a highly sensitive, high output magnetic sensing element can be produced, since the magnitude of the bias magnetic field applied to the free magnetic layer 17 becomes equal to the magnitude of the magnetic moment per unit area of the free magnetic layer 17(the magnetic moment being the product of the saturation magnetization (Ms) and the film thickness (t)).

In this embodiment, since the free magnetic layer 17 is composed of a magnetic material and extends to the regions below the second antiferromagnetic layers 20 and the ferromagnetic layers 19, it is possible to reduce the influence of the demagnetizing field generated by surface magnetic charges at both side faces of the free magnetic layer 17 on the magnetization of the free magnetic layer 17.

Moreover, in this embodiment, since the interface between the free magnetic layer 17 and the nonmagnetic layer 18 and between the nonmagnetic layer 18 and the ferromagnetic layers 19 are not surfaces trimmed by milling, it is possible to prevent decreases in the unidirectional anisotropic magnetic fields which align the magnetization directions in the side regions 17s of the free magnetic layer 17 in a predetermined direction.

In this embodiment, since the free magnetic layer 17 and the ferromagnetic layers 19 are magnetically coupled to each other with the nonmagnetic layer 18 therebetween by the RKKY interactions, even when the interfaces between the free magnetic layer 17 and the nonmagnetic layer 18 or between the nonmagnetic layer 18 and the ferromagnetic layers 19 are surface trimmed by milling, it is possible to obtain unidirectional anisotropic magnetic fields having a magnitude sufficient for aligning the magnetization directions in the side regions 17s of the free magnetic layer 17 in a predetermined direction.

In this embodiment, since the nonmagnetic layer 18 has a constant thickness t1, an upper surface 18a of the nonmagnetic layer 18 is planar. Therefore, the deposition step of the ferromagnetic layers 19 and the second antiferromagnetic layers 20 is easily controlled. Moreover, the thickness of the ferromagnetic layers 19 can be decreased and the strength of the spin-flop magnetic field between the ferromagnetic layer 19 and the free magnetic layer 17 can be increased in the synthetic ferrimagnetic structure comprising ferromagnetic layers 19, the nonmagnetic layer 18, and the free magnetic layer 17. The thickness of the ferromagnetic layers 19 may be set, for example, at 1.5 to 4.0 nm. The unidirectional anisotropic magnetic field applied to the free magnetic layer 17 can also be increased. For example, when the ferromagnetic layers 19 and the free magnetic layers 17 are composed of NiFe alloys, the strength of the unidirectional anisotropic magnetic field can be set at 56 kA/m. When the ferromagnetic layers 19 and the free magnetic layers 17 are composed of CoFe alloys, the unidirectional anisotropic magnetic field can be set at 152 kA/m.

In the present invention, after the upper surface of the nonmagnetic layer 18 in the track width Tw region is covered by a resist layer, the ferromagnetic layers 19 and the second antiferromagnetic layers 20 are formed by sputtering a ferromagnetic material and an antiferromagnetic material on the nonmagnetic layer 18 in the regions not covered by the resist layer. As a result, the upper surfaces of the ferromagnetic layers 19 and the second antiferromagnetic layers 20 exhibit inclined surfaces or curved surfaces relative to the upper surface of the nonmagnetic layer 18.

In the magnetic sensing element shown in FIG. 1, the nonmagnetic layer 18 functions as a protective layer for the free magnetic layer 17 in the track width region C.

In this embodiment, since the nonmagnetic layer 18 is composed of a conductive material, such as Ru, Rh, Ir, Os, or Re, or an alloy of at least two of these elements, the nonmagnetic layer 18 functions as a back layer exhibiting a spin filter effect that improves the magnetic sensitivity of the magnetic sensing element.

Preferably, the nonmagnetic layer 18 is composed of Ru and has a thickness t1 of 0.8 to 1.1 nm. Consequently, the RKKY interactions between the pair of ferromagnetic layers 19 and the side regions 17s of the free magnetic layer 17 can be increased. More preferably, the thickness t1 of the nonmagnetic layer 18 is in the range of 0.85 to 0.9 nm.

Figure 18:
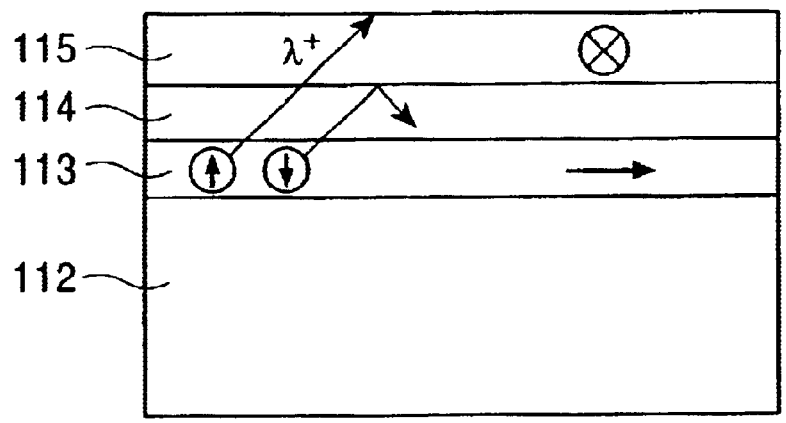
FIG. 18 is a schematic diagram illustrating the spin filter effect of a back layer.
Figure 19:
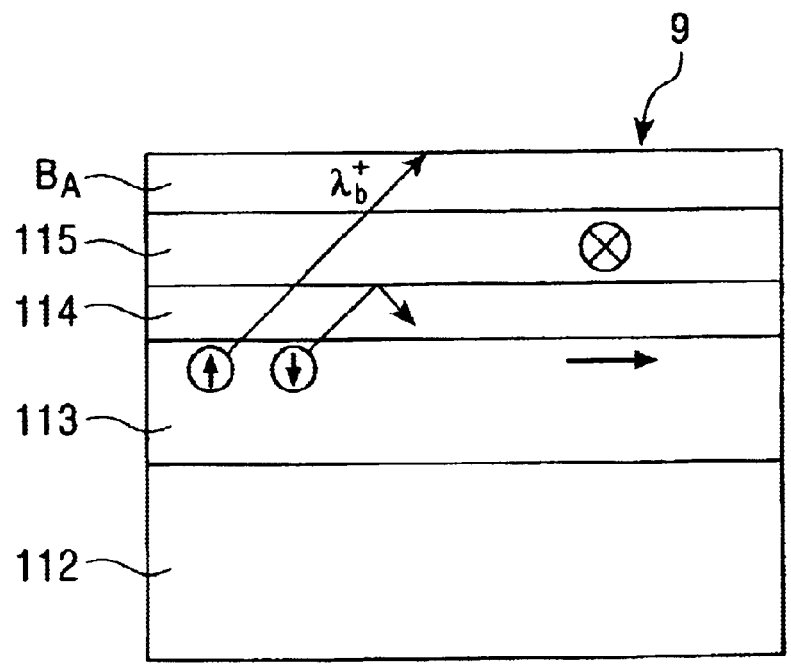
FIG. 19 is a schematic diagram illustrating the spin filter effect of a back layer.

FIGS. 18 and 19 are schematic diagrams illustrating the spin filter effect due to a back layer in a spin-valve magnetic sensing element. FIG. 18 shows a structure not provided with a back layer, and FIG. 19 shows a structure provided with a back layer.

The giant magnetoresistance (GMR) effect is mainly caused by "spin-dependent scattering" of electrons. That is, the GMR effect is based on the difference between the mean free path $\lambda+$ of the conduction electrons (e.g., spin-up electrons) having a spin parallel to the magnetization direction of the magnetic material (e.g. free magnetic layer 115) and the mean free path $\lambda-$ of the conduction electrons (e.g., spin-down electrons) having a spin antiparallel to the magnetization direction of the free magnetic layer 115. In FIGS. 18 and 19, upward arrows represent the spin-up conduction electrons, and downward arrows represent the spin-down conduction electrons. When an electron enters the free magnetic layer 115, if the electron is a spin-up electron having a spin parallel to the magnetization direction of the free magnetic layer 115, the electron can freely move. In contrast, if the electron is a spin-down electron, the electron is immediately scattered.

The reason for this is that the mean free path $\lambda+$ of the spin-up electrons is, for example, approximately 50 angstroms, while the mean free path $\lambda-$ of the spin-down electrons is approximately 6 angstroms, much shorter than the mean free path of the spin-up electrons. The thickness of the free magnetic layer 115 is set larger than the mean free path $\lambda-$ of the spin-down electrons and is set smaller than the mean free path $\lambda+$ of the spin-up electrons.

Spin-down electrons originating in a pinned magnetic layer 113 and passing through a nonmagnetic material layer 114 are scattered in the vicinity of the interface between the free magnetic layer 115 and the nonmagnetic material layer 114, and do not substantially reach the free magnetic layer 115. That is, even if the magnetization direction of the free magnetic layer 115 is rotated, the mean free path of the spin-down electrons is unchanged. Thus, the spin-down electrons do not affect the rate of change in resistance due to the GMR effect. Therefore, with respect to the GMR effect, only the behavior of the spin-up electrons may be taken into consideration.

Spin-up electrons originating in the pinned magnetic layer 113 reach the free magnetic layer 115 by passing through the nonmagnetic material layer 114 having a thickness that is shorter than the mean free path $\lambda+$ of the spin-up electrons. The spin-up electrons can freely pass through the free magnetic layer 115. This is because the spin-up electrons have a spin parallel to the magnetization direction of the free magnetic layer 115.

When the magnetization direction of the pinned magnetic layer 113 and the magnetization direction of the free magnetic layer 115 become antiparallel to each other, the spin of the spin-up electrons is not parallel anymore to the magnetization direction of the free magnetic layer 115. Therefore, the spin-up electrons are scattered in the vicinity of the interface between the free magnetic layer 115 and the nonmagnetic material layer 114, and the effective mean free path of the spin-up electrons is suddenly decreased, thereby increasing the resistance. The rate of change in resistance is positively correlated with a change in the effective mean free path of the spin-up electrons.

As shown in FIG. 19, when a back layer $B_A$ is provided, the spin-up electrons which have passed through the free magnetic layer 115 are transmitted through the back layer $B_A$ by an additional mean free path $\lambda+_b$ determined by the material of the back layer $B_A$, and are then scattered. By providing the back layer $B_A$, the mean free path $\lambda+$ of the spin-up electrons is extended by the additional mean free path $\lambda+_b$ length.

In this embodiment, since the nonmagnetic layer 18 functions as the back layer, it is possible to extend the mean free path of spin-up conduction electrons. Therefore, a change in the mean free path of the spin-up electrons is increased upon application of an external magnetic field. Consequently, an improvement in the rate of change in resistance ($\Delta R/R$) of the spin-valve magnetic sensing element is obtained.

When the thickness of the free magnetic layer 17 is relatively small, an increase in the difference in the mean free path between the spin-up conduction electrons and the spin-down conduction electrons due to the spin filter effect is more effectively exhibited.

If the thickness of the free magnetic layer 17 is less than 15 angstroms, it is difficult for the free magnetic layer 17 to function as a ferromagnetic material layer, and it is not possible to obtain a sufficient magnetoresistance effect. In addition, since conduction electrons which are subjected to diffusive scattering without being subjected to specular reflection are also present, the rate of change in resistance is decreased.

If the thickness of the free magnetic layer 17 is more than 45 angstroms, there is an increase in the number of spin-up conduction electrons scattered before reaching the nonmagnetic layer 18, resulting in a reduced rate of change in resistance due to the spin filter effect.

Furthermore, if the nonmagnetic layer 18 is composed of Ru and the free magnetic layer 17 is composed of a CoFe alloy, it is possible to set the magnetostriction of the free magnetic layer 17 to zero.

In the magnetic sensing element shown in FIG. 1, the pinned magnetic layer 15 includes the first pinned magnetic sublayer (ferromagnetic layer) 15a and the second pinned magnetic sublayer (ferromagnetic layer) 15c having different magnetic moments per unit area laminated with the nonmagnetic intermediate sublayer 15b therebetween. That is, in the pinned magnetic layer 15, a plurality of ferromagnetic layers having different magnetic moments per unit area are laminated on each other, a nonmagnetic layer being placed between two adjacent ferromagnetic layers, and the magnetization directions of the two adjacent ferromagnetic layers with the nonmagnetic layer therebetween are in an antiparallel, ferrimagnetic state.

The first pinned magnetic sublayer 15a is in contact with the first antiferromagnetic layer 14 such that an exchange anisotropic magnetic field is generated at the interface between the first pinned magnetic sublayer 15a and the first antiferromagnetic layer 14 by annealing in a magnetic field. The magnetization direction of the first pinned magnetic sublayer 15a is thereby pinned in the Y direction. When the magnetization direction of the first pinned magnetic sublayer 15a is pinned in the Y direction, the magnetization direction of the second pinned magnetic sublayer 15c facing the first pinned magnetic sublayer 15a (with the nonmagnetic intermediate sublayer 15b therebetween) is pinned in a direction antiparallel to the magnetization direction of the first pinned magnetic sublayer 15a.

The direction of the resultant magnetic moment obtained by adding the magnetic moment of the first pinned magnetic sublayer 15a to the magnetic moment of the second pinned magnetic sublayer 15c corresponds to the magnetization direction of the pinned magnetic layer 15.

As described above, the magnetization directions of the first pinned magnetic sublayer 15a and the second pinned magnetic sublayer 15c are in an antiparallel, ferrimagnetic state. Further, since the first magnetic pinned sublayer 15a and the second pinned magnetic sublayer 15c pin each other's magnetization directions, it is possible to stabilize the magnetization direction of the entire pinned magnetic layer 15 in a predetermined direction.

The first pinned magnetic sublayer 15a and the second pinned magnetic sublayer 15c are composed of ferromagnetic materials, such as a NiFe alloy, Co, a CoNiFe alloy, a CoFe alloy, and a CoNi alloy. Preferably, they are composed of a NiFe alloy, Co, or a CoFe alloy and/or the first pinned magnetic sublayer 15a and the second pinned magnetic sublayer 15c are composed of the same material. In the magnetic sensing element shown in FIG. 1, the first pinned magnetic sublayer 15a and the second pinned magnetic sublayer 15c are composed of the same material. By forming the sublayers 15a and 15c so as to have different thicknesses, sublayers 15a and 15c will have different magnetic moments per unit area.

The nonmagnetic intermediate sublayer 15b is composed of any one of Ru, Rh, Ir, Os, Cr, Re, and Cu, or an alloy of at least two of these elements. Preferably, the nonmagnetic intermediate sublayer 15b is composed of Ru.

When the pinned magnetic layer 15 includes the first pinned magnetic sublayer 15a and the second pinned magnetic sublayer 15c, which are laminated with the nonmagnetic intermediate sublayer 15b therebetween, the first pinned magnetic sublayer 15a and the second pinned magnetic sublayer 15c pin each other's magnetization directions. Therefore, the magnetization direction of the entire pinned magnetic layer 15 can be strongly pinned in a predetermined direction. That is, it is possible to obtain a large exchange coupling magnetic field (Hex) between the first antiferromagnetic layer 14 and the pinned magnetic layer 15, for example, 80 to 160 kA/m.

In this embodiment, the demagnetizing field (dipole magnetic field) from the pinned magnetization of the pinned magnetic layer 15 can be cancelled. This is because the magnetostatic coupling magnetic fields of the first pinned magnetic sublayer 15a and the second pinned magnetic sublayer 15c counteract each other. As a result, the contribution of the demagnetizing field from the pinned magnetization of the pinned magnetic layer 15 to the variable magnetization of the free magnetic layer 17 is reduced.

Consequently, the variable magnetization of the free magnetic layer 17 can be more easily corrected in a desired direction so as to obtain a magnetic sensing element exhibiting superior symmetry and low asymmetry.

The demagnetizing field (dipole magnetic field) $H_d$ resulting from the pinned magnetization of the pinned magnetic layer 15 carries a nonuniform distribution in which the values are large at the ends and small in the center in the element height direction such that the free magnetic layer 17 can be prevented from being aligned in a single domain state. By forming the pinned magnetic layer 15 having the laminated structure as described above, the dipole magnetic field $H_d$ can be set to be substantially zero. Because domain walls are not formed in the free magnetic layer 17, nonuniform magnetization does not occur. This facilitates prevention of e.g., Barkhausen noise, etc.

Alternatively, the pinned magnetic layer 15 may be formed as a single ferromagnetic layer.

Moreover, a diffusion-preventing layer composed of Co or the like may be formed between the second pinned magnetic sublayer 15c and the nonmagnetic material layer 16. The diffusion-preventing layer prevents interdiffusion between the second pinned magnetic sublayer 15c and the nonmagnetic material layer 16.

In this embodiment, even when the first antiferromagnetic layer 14 and the second antiferromagnetic layers 20 are formed using the same antiferromagnetic material with the same composition, it is possible to direct the exchange anisotropic magnetic fields of the second antiferromagnetic layers 20 in the X direction and to direct the exchange anisotropic magnetic field of the first antiferromagnetic layer 14 in the Y direction. That is, in this embodiment, the magnetization direction of the free magnetic layer 17 can be fixed in a direction substantially perpendicular to the magnetization direction of the pinned magnetic layer 15.

The free magnetic layer 17 and the ferromagnetic layers 19 must have different magnetic moments per unit area. The magnitude of the magnetic moment per unit area in each of the free magnetic layer 17 and the ferromagnetic layers 19 is represented by the product of the saturation magnetization (Ms) and the thickness (t) of the layer. In this embodiment, the thickness of the ferromagnetic layer 19 is smaller than the thickness of the free magnetic layer 17. By decreasing the thickness of the ferromagnetic layer 19, it is possible to increase the spin-flop magnetic field at which the antiparallel state of the magnetization directions of the free magnetic layer 17 and the ferromagnetic layers 19 is lost.

Figure 2:
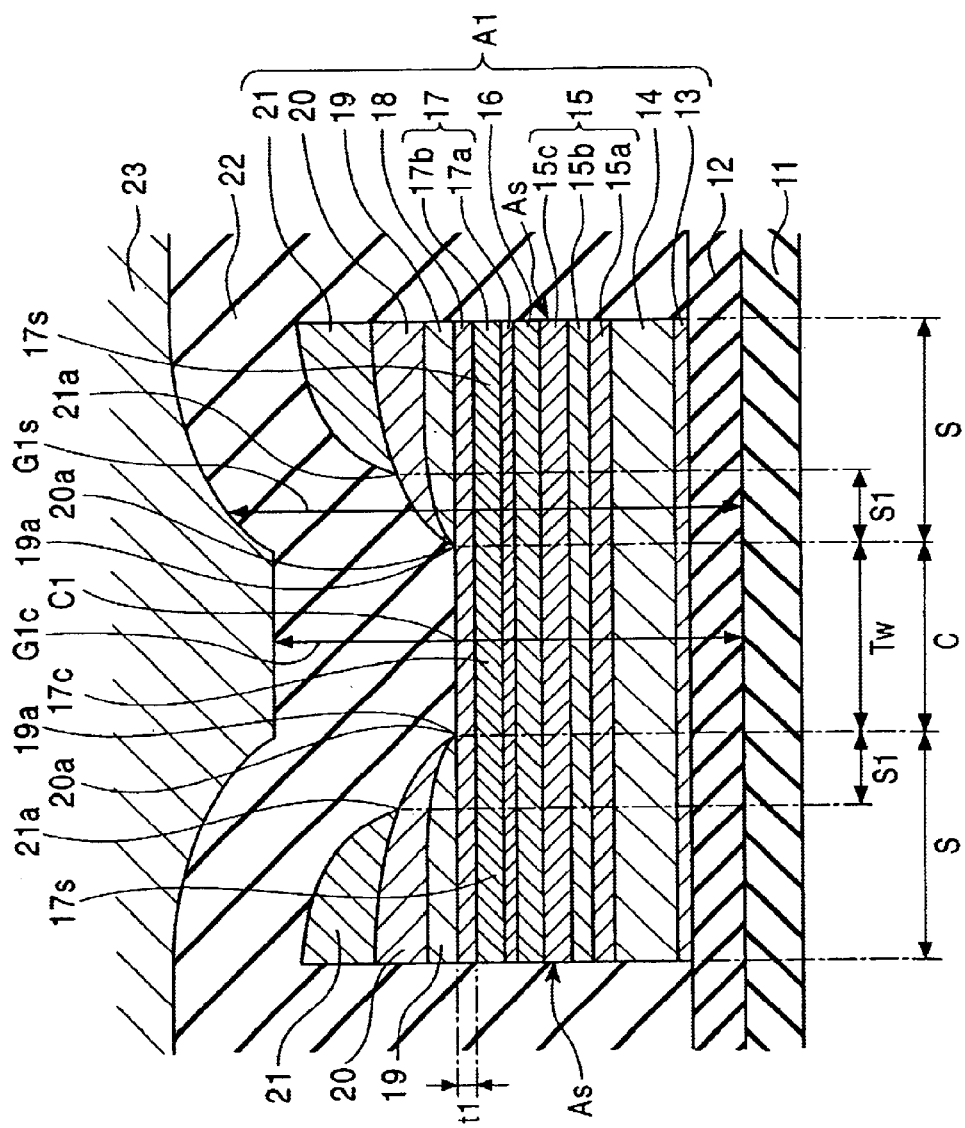
FIG. 2 is a sectional view of a magnetic sensing element in a second embodiment of the present invention.

FIG. 2 is a sectional view of a magnetic sensing element in a second embodiment of the present invention, viewed from a surface facing a recording medium.

The magnetic sensing element in this embodiment differs from the magnetic sensing element shown in FIG. 1 in that the edges 21a of the electrode layers 21 at the track width region C sides are placed closer to side faces. As of the multilayer film A1 compared to the edges 20a of the second antiferromagnetic layers 20 at the track width region C sides. In FIG. 2, the track width region C corresponds to a region placed between the ferromagnetic layers 19 and between the antiferromagnetic layers 20.

If the edges 21a of the electrode layers 21 at the track width region C sides are placed closer to side faces As of the multilayer film A1 compared to the edges 20a of the second antiferromagnetic layers 20 at the track width region C sides, the steps between the upper surface of the nonmagnetic layer 18 in the track width region C and the upper surfaces of the electrode layers 21 and the second antiferromagnetic layers 20 can be gentler. Therefore, even if the thickness of the upper gap layer 22 of the magnetic sensing element is decreased, the upper gap layer 22 can be formed reliably on the steps. Moreover, because there is more reliable prevention of electrical short-circuiting between the upper shielding layer 23 and the electrode layers 21, second antiferromagnetic layers 20, and ferromagnetic layers 19, the magnetic sensing element can be rendered suitable for gap narrowing.

If the distance is increased between the upper shielding layer 23 and the lower shielding layer 11 in the vicinity of both sides of the track width region C of the multilayer film A1, magnetic fields originating from the recorded tracks of a recording medium at both sides of the recorded track to be detected easily enter the magnetic sensing element, thus increasing the effective track width and facilitating crosstalk between recorded tracks.

In this embodiment, as described above, since the steps between the upper surface of the nonmagnetic layer 18 in the track width region C and the upper surfaces of the electrode layers 21 and the second antiferromagnetic layers 20 can be gentler, it is possible to decrease the effective track width by preventing an increase in the distance between the upper shielding layer 23 and the lower shielding layer 11 in the vicinity of both sides of the track width region C of the multilayer film A1.

Preferably, the relationship G1c≦G1s≦G1c+90 nm is satisfied, wherein: (1) the ferromagnetic layer 19 overlaps with the second antiferromagnetic layer 20 and does not overlap with the electrode layer 21; and (2) G1c is the distance between the upper shielding layer 23 and the lower shielding layer 11 in the region S1 measured at the position corresponding to the center C1 of the multilayer A1. More preferably, the relationship G1c≦G1s≦G1c+70 nm is satisfied. Most preferably, the relationship G1c≦G1s≦G1c+30 nm is satisfied.

Alternatively, the distance G1s and the distance G1c are set so as to preferably satisfy the relationship 1.00≦G1s/G1c≦2.50, more preferably, the relationship 1.00≦G1x/G1c≦2.17, and most preferably, the relationship 1.00≦G1s/G1c≦1.50.

Figure 3:
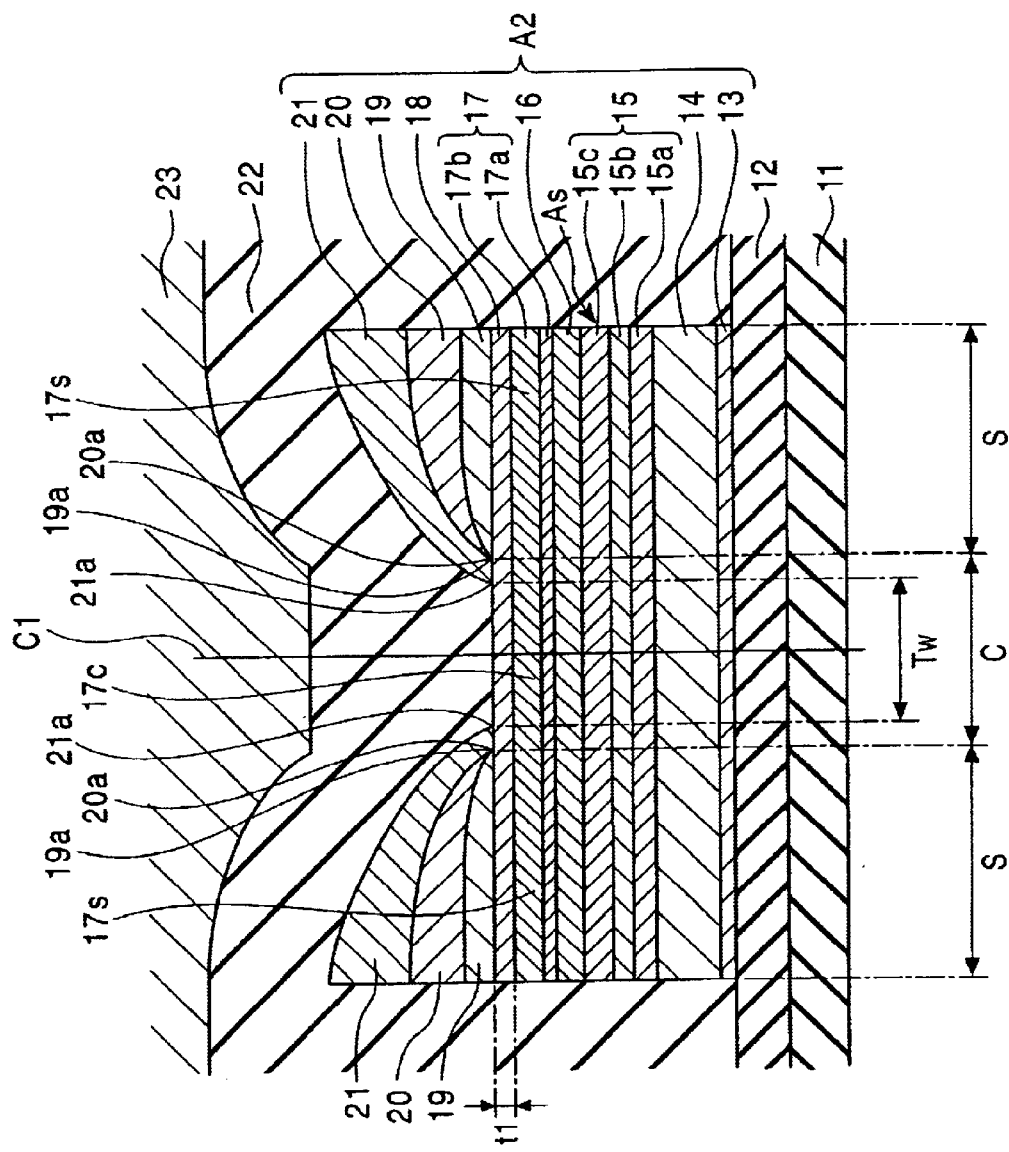
FIG. 3 is a sectional view of a magnetic sensing element in a third embodiment of the present invention.

FIG. 3 is a sectional view of a magnetic sensing element in a third embodiment of the present invention, viewed from a surface facing a recording medium.

The magnetic sensing element in this embodiment differs from the magnetic sensing element shown in FIG. 1 in that the edges 21a at the track width region C sides of the electrode layers 21, which are disposed on the second antiferromagnetic layers 20, extend from the edges 19a of the ferromagnetic layers 19 at the track width region C sides and the edges 20a of the second antiferromagnetic layers 20 at the track width region C sides toward the center C1 of the multilayer film A2.

In FIG. 3, the track width region C of the multilayer film A2 corresponds to the region placed between the electrode layers 21 which are formed with a distance therebetween in the track width direction.

The ferromagnetic layers 19 and the second antiferromagnetic layers 20 are composed of materials having a larger resistivity than that of the electrode layer 21. If the electrode layer 21 is disposed only on the ferromagnetic layer 19 and the second antiferromagnetic layer 20, a DC current supplied to the electrode layer 21 flows through the nonmagnetic layer 18, the free magnetic layer 17, the nonmagnetic material layer 16, and the pinned magnetic layer 15 via the ferromagnetic layers 19 and the second antiferromagnetic layers 20, thereby increasing the DC resistance of the magnetic sensing element.

On the other hand, when the edges 21a of the electrode layers 21 at the track width region C sides extend from the edges 19a of the ferromagnetic layers 19 at the track width region C sides and the edges 20a of the second antiferromagnetic layers 20 at the track width region C sides toward the center C1 of the multilayer film A2, a DC current supplied to the electrode layer 21 can be transmitted without passing through the ferromagnetic layer 19 and the second antiferromagnetic layer 20. As a result, the DC resistance of the magnetic sensing element can be decreased, since the edges 21a of the electrode layers 21 extend over the nonmagnetic layer 18 in this case.

The track width Tw of the magnetic sensing element shown in FIG. 3 is determined by the distance between the edges 21a of the electrode layers 21 at the track width region C sides. Therefore, even if the magnetization directions of the side regions 17s of the free magnetic layer 17 in the vicinity of the edges 20a of the second antiferromagnetic layers 20 at the track width region C sides are altered due to compositional changes, sagging, etc., it is possible to prevent changes in the track width Tw.

Figure 4:
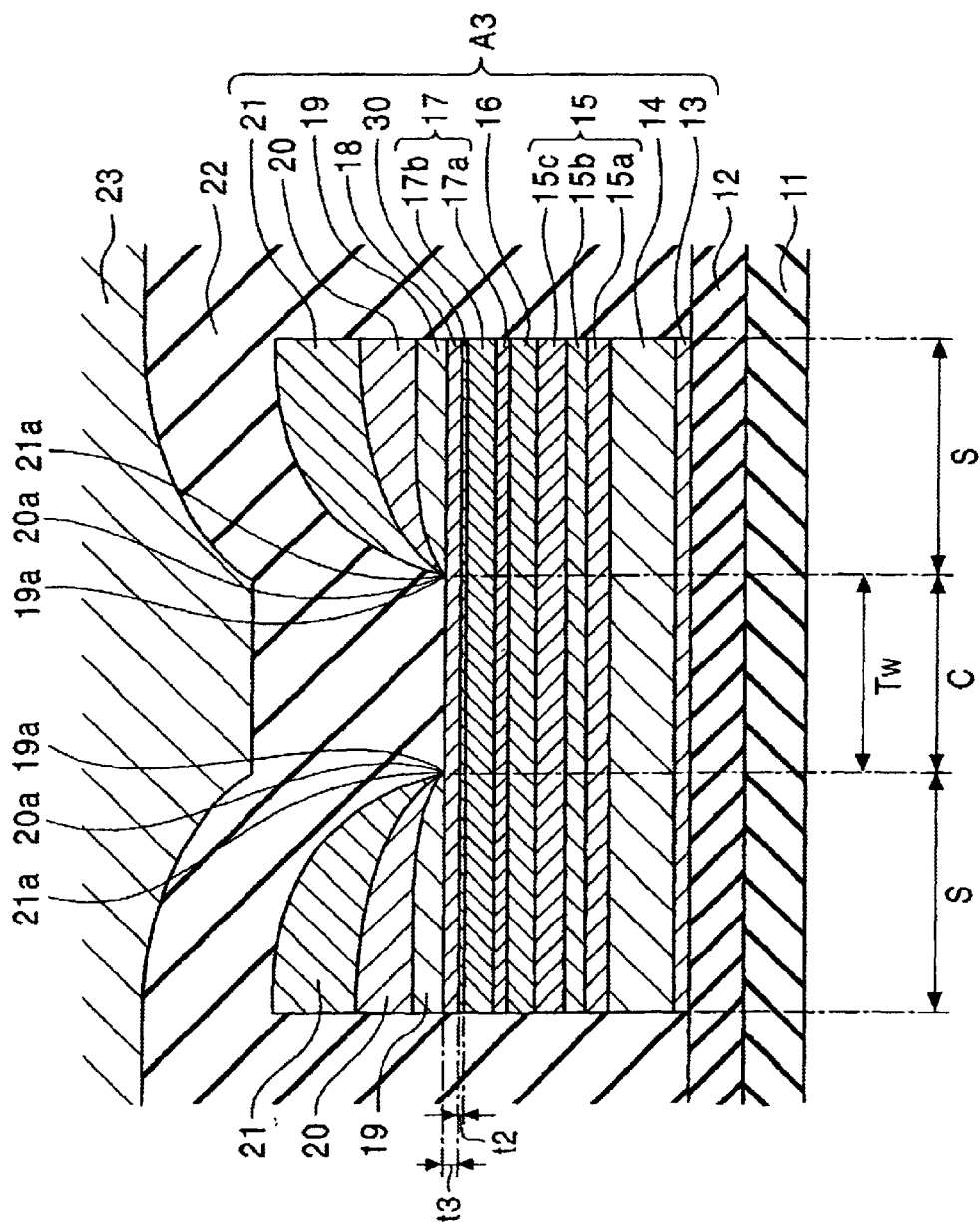
FIG. 4 is a sectional view of a magnetic sensing element in a fourth embodiment of the present invention.

FIG. 4 is a sectional view of a magnetic sensing element in a fourth embodiment of the present invention, viewed from a surface facing a recording medium.

The magnetic sensing element shown in FIG. 4 differs from the magnetic sensing element shown in FIG. 1 in that a conductive material layer 30 composed of Cu is formed between the nonmagnetic layer 18 and the free magnetic layer 17.

When the conductive material layer 30 composed of a conductive material having a lower resistivity than that of the nonmagnetic layer 18 is provided, a higher spin filter effect can be exhibited than in the case in which only the nonmagnetic layer 18 is used. Consequently, use of the conductive material layer can help to improve the magnetic sensitivity of the magnetic sensing element.

When the conductive material layer 30 is included, the nonmagnetic layer 18 may be composed of Ru with a thickness of 0.4 to 1.1 nm and the conductive material layer 30 may be composed of Cu with a thickness of 0.3 to 0.5 nm.

If the conductive material layer 30 is formed using Cu, the crystal lattice constant of the conductive material layer 30 is close to that of the free magnetic layer 17 composed of NiFe or CoFeNi. Therefore, a higher spin filter effect can be produced.

Figure 5:
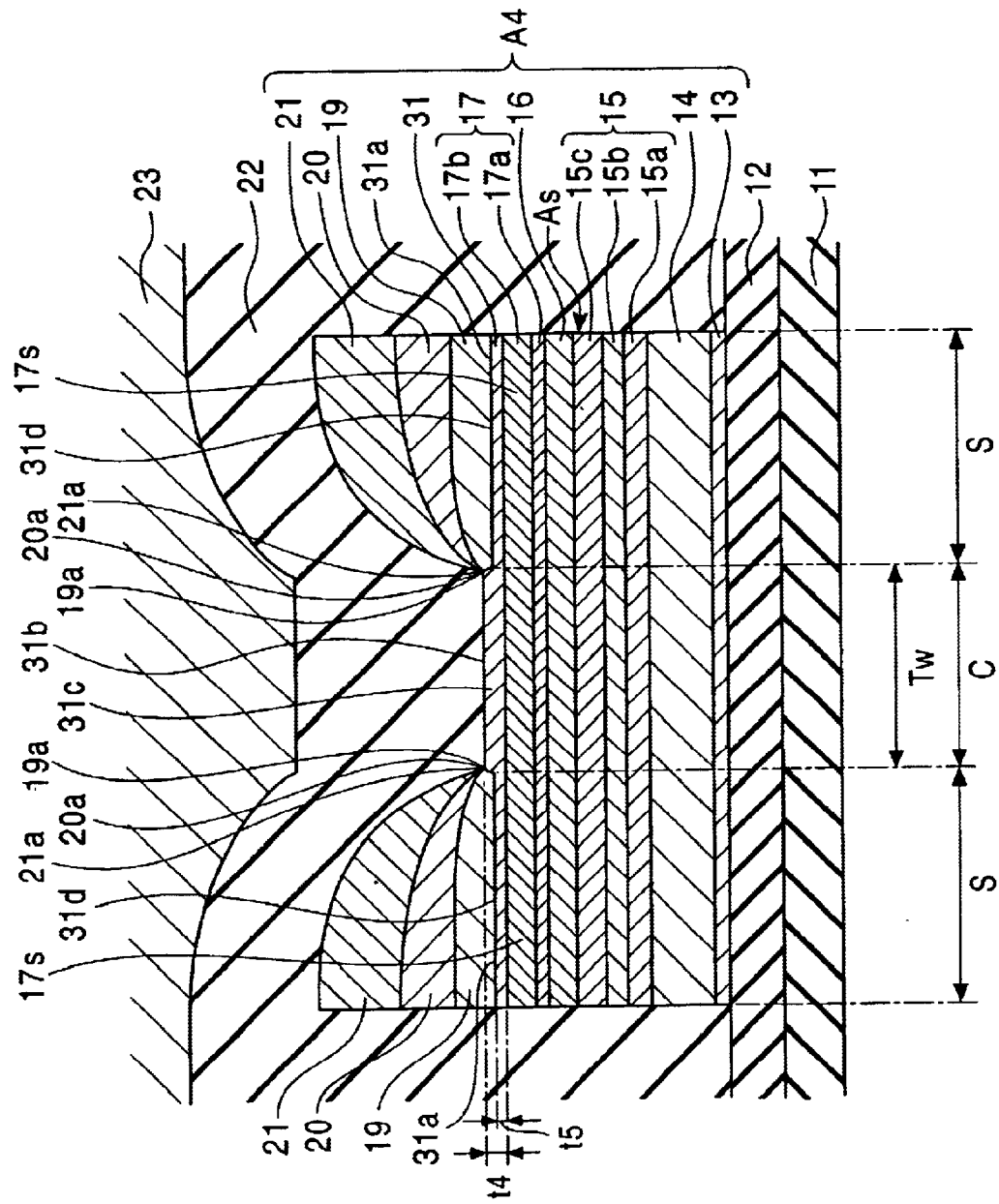
FIG. 5 is a sectional view of a magnetic sensing element in a fifth embodiment of the present invention.

FIG. 5 is a sectional view of a magnetic sensing element in a fifth embodiment of the present invention, viewed from a surface facing a recording medium.

The magnetic sensing element shown in FIG. 5 differs from the magnetic sensing element shown in FIG. 1 in that the thickness t4 of the central region 31c of a nonmagnetic layer 31 is larger than the thickness t5 of the side regions 31d of the nonmagnetic layer 31.

In the magnetic sensing element in this embodiment, since the thickness t4 of the central region 31c of the nonmagnetic layer 31 can be increased arbitrarily, the spin filter effect can be improved. Consequently, increasing the thickness can further improve the magnetic sensitivity of the magnetic sensing element.

Preferably, the thickness t5 of the side regions 31d of the nonmagnetic layer 31, which overlap with the second antiferromagnetic layers 20 and the ferromagnetic layers 19, is set in a range that can increase the RKKY interactions between the ferromagnetic layers 19 and the side regions 17s of the free magnetic layer 17.

For example, when the nonmagnetic layer 31 is composed of Ru, by setting the thickness t5 of the side regions 31d of the nonmagnetic layer 31 at 0.8 to 1.1 nm, the RKKY interactions between the ferromagnetic layers 19 and the side regions 17s of the free magnetic layer 17 can be increased.

Additionally, in the magnetic sensing element shown in FIG. 5, the central region 31c has the same width in the track width direction as that of the track width region C placed between the electrode layers 21, the second antiferromagnetic layers 20, and the ferromagnetic layers 19. Further, the track width Tw is defined by the distance between the pairs of edges 21a of the electrode layers 21, edges 20a of the second antiferromagnetic layers 20, or edges 19a of the ferromagnetic layers 19 at the track width region C sides.

Figure 6:
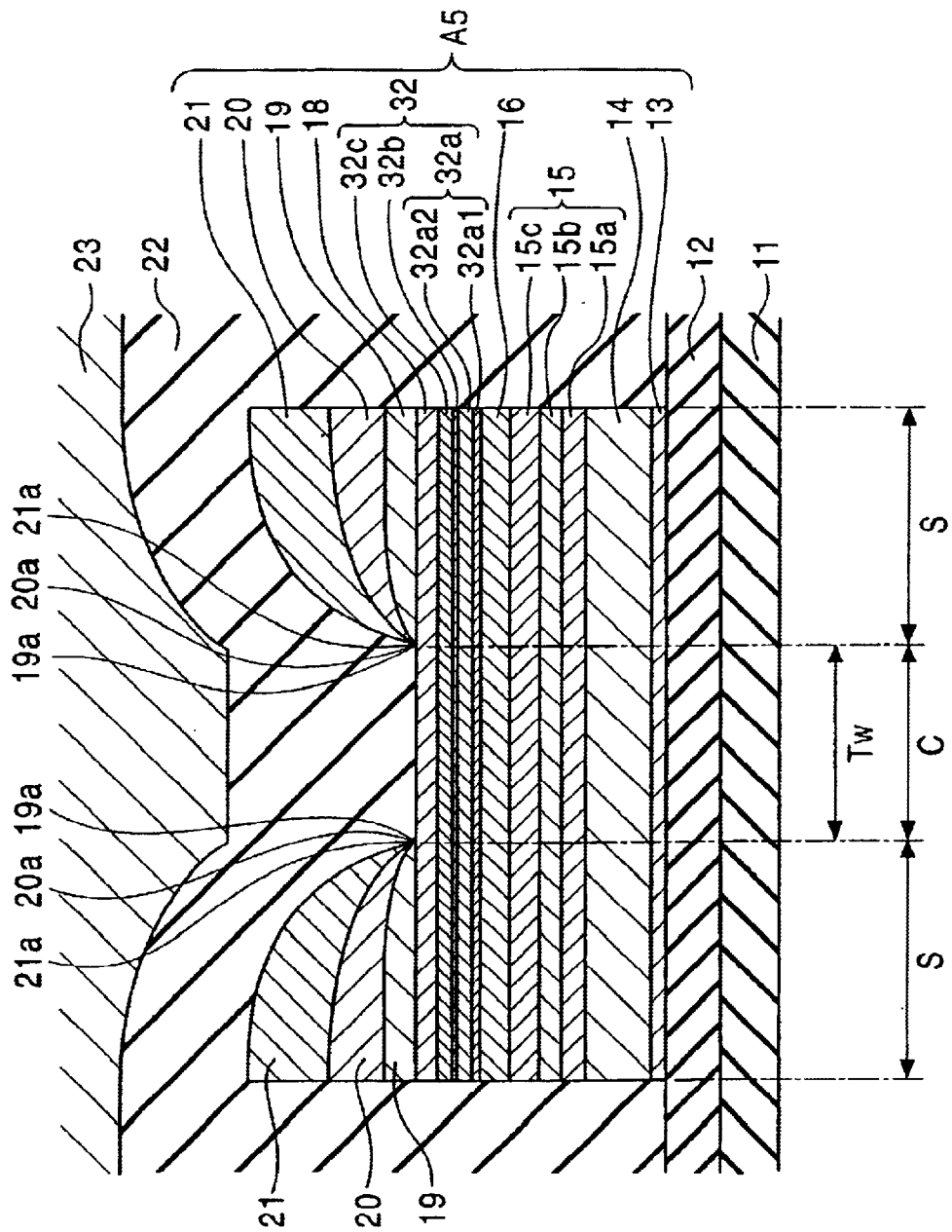
FIG. 6 is a sectional view of a magnetic sensing element in a sixth embodiment of the present invention.

FIG. 6 is a sectional view of a magnetic sensing element in a sixth embodiment of the present invention, viewed from a surface facing a recording medium.

The magnetic sensing element shown in FIG. 6 has substantially the same structure as that of the magnetic sensing element in the first embodiment shown in FIG. 1 apart from the fact that a free magnetic layer 32 is a so-called "synthetic-ferri-free-type" free magnetic layer including a first free magnetic sublayer (ferromagnetic layer) 32a and a second free magnetic sublayer (ferromagnetic layer) 32c having different magnetic moments per unit area which are laminated with a nonmagnetic intermediate sublayer 32b therebetween. That is, in the free magnetic layer 32, a plurality of ferromagnetic layers having different magnetic moments per unit area are laminated on each other, a nonmagnetic intermediate layer being placed between the two adjacent ferromagnetic layers, and the magnetization directions of the two adjacent ferromagnetic layers with the nonmagnetic intermediate layer therebetween are in an antiparallel, ferrimagnetic state.

The first free magnetic sublayer 32a includes a diffusion-preventing layer (interlayer) 32a1 and a magnetic layer 32a2. The diffusion-preventing layer 32a1 is, for example, composed of Co or CoFe, and prevents interdiffusion between the magnetic layer 32a2 and the nonmagnetic material layer 16.

The first free magnetic sublayer 32a and the second free magnetic sublayer 32c are composed of ferromagnetic materials, such as a NiFe alloy, Co, a CoNiFe alloy, a CoFe alloy, and a CoNi alloy. Preferably, the sublayers are composed of a CoFeNi alloy.

The nonmagnetic intermediate sublayer 32b is composed of any one of Ru, Rh, Ir, Os, Cr, Re, and Cu, or an alloy of at least two of these elements. Preferably, the nonmagnetic intermediate sublayer 32b is composed of Ru.

Additionally, the first free magnetic sublayer 32a and the second free magnetic sublayer 32c may have different magnetic moments per unit area. The magnetic moment per unit area is the product of the saturation magnetization (Ms) and the film thickness (t).

In this embodiment, since the diffusion-preventing layer 32a1 is formed between the first free magnetic sublayer 32a and the nonmagnetic material layer 16, the sum of the magnetic moment per unit area of the magnetic layer 32a2 and the magnetic moment per unit area of the diffusion-preventing layer 32a1 is different from the magnetic moment per unit area of the second free magnetic sublayer 32c.

The thickness of the second free magnetic sublayer 32c is preferably in the range of 0.5 to 2.5 nm. The thickness of the first free magnetic sublayer 32a is preferably in the range of 2.5 to 4.5 nm. The thickness of the first free magnetic sublayer 32a is more preferably in the range of 3.0 to 4.0 nm and, most preferably, in the range of 3.5 to 4.0 nm. If the thickness of the first free magnetic sublayer 32a is out of the ranges described above, it is not possible to increase the rate of change in magnetoresistance in the spin-valve magnetic sensing element.

In the magnetic sensing element shown in FIG. 6, a laminate including the first free magnetic sublayer 32a and the second free magnetic sublayer 32c which are laminated with the nonmagnetic intermediate sublayer 32b therebetween functions as a free magnetic layer 32.

The magnetization direction of the first free magnetic sublayer 32a is antiparallel to the magnetization direction of the second free magnetic sublayer 32c, and is therefore in a ferrimagnetic state.

When the magnetization directions of the first free magnetic sublayer 32a and the second free magnetic sublayer 32c are in a ferrimagnetic state, the same advantage is obtained as in the case in which the thickness of the free magnetic layer 32 is decreased. That is, the apparent magnetic thickness (Ms×t) is decreased upon varying the magnetization of the free magnetic layer 32, thereby resulting in improved the magnetic sensitivity of the magnetic sensing element.

The direction of the resultant magnetic moment per unit area obtained by adding the magnetic moment of the first free magnetic sublayer 32a per unit area to the magnetic moment of the second free magnetic sublayer 32c per unit area corresponds to the magnetization direction of the free magnetic layer 32.

However, only the magnetization direction of the first free magnetic layer 32a contributes to the output due to the relationship with the magnetization direction of the pinned magnetic layer 15.

If the first free magnetic sublayer 32a and the second free magnetic sublayer 32c have different magnetic thicknesses, the spin-flop magnetic field of the free magnetic layer 32 can be increased.

When an external magnetic field is applied to two magnetic layers of which magnetization directions are antiparallel to each other, the magnitude of the external magnetic field at which the antiparallel state of the magnetization directions is lost is referred to as the spin-flop magnetic field.

Figure 17:
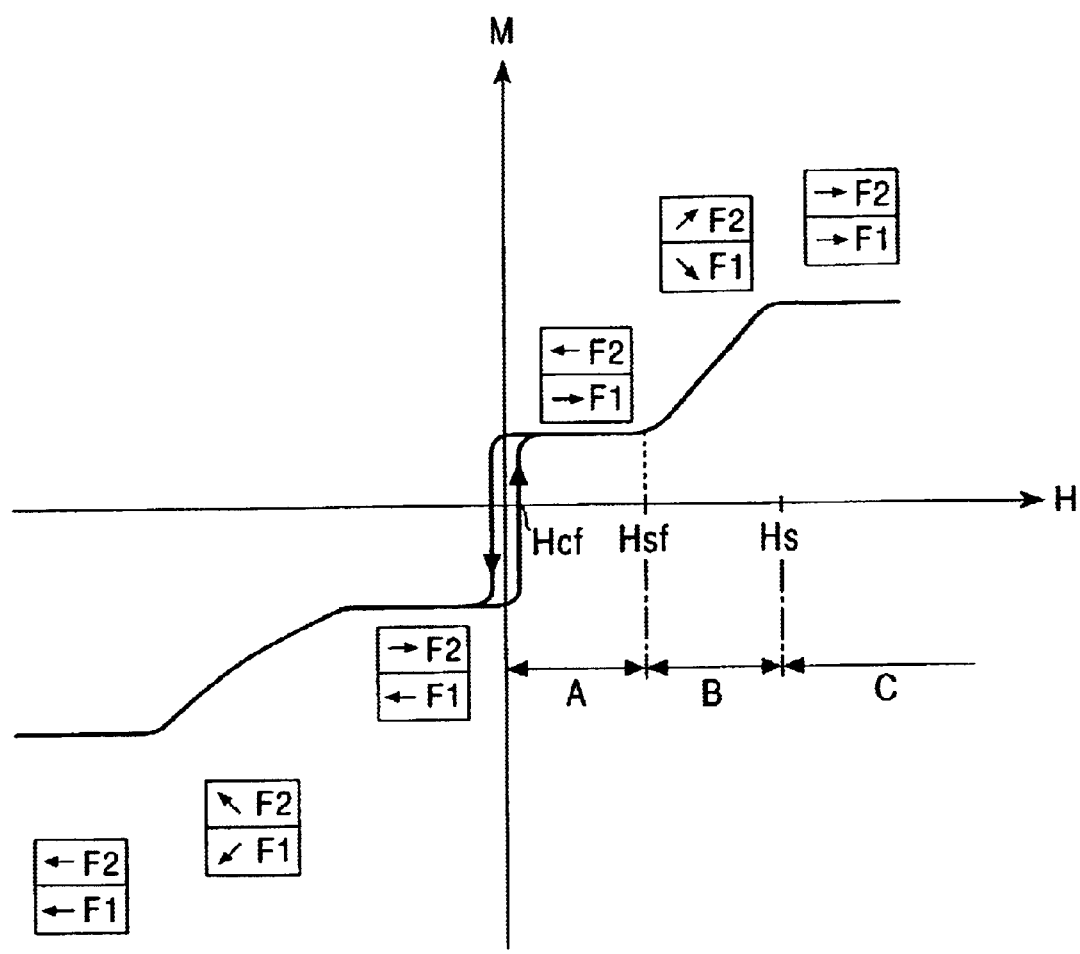
FIG. 17 is a graph schematically showing a hysteresis loop of a free magnetic layer having a laminated ferrimagnetic structure.

FIG. 17 is a conceptual diagram of a hysteresis loop of the free magnetic layer 32. The M-H curve shows the change in the magnetization M of the free magnetic layer 32 when an external magnetic field is applied in the track width direction to the free magnetic layer 32 having the structure shown in FIG. 6.

In FIG. 17, the arrow F1 represents the magnetization direction of the first free magnetic sublayer 32a, and the arrow F2 represents the magnetization direction of the second free magnetic sublayer 32c.

As shown in FIG. 17, when the external magnetic field H is small, the first free magnetic sublayer 32a and the second free magnetic sublayer 32c are in the ferrimagnetic state, namely, the directions of the arrows F1 and F2 are antiparallel to each other. When the magnitude of the external magnetic field H exceeds a certain value, the RKKY interaction between the first free magnetic sublayer 32a and the second free magnetic sublayer 32c is destroyed, and the ferrimagnetic state is lost. This phenomenon is the spin-flop transition. The magnitude of the external magnetic field at which the spin-flop transition occurs is the spin-flop magnetic field, which is represented by the symbol Hsf in FIG. 17. The symbol Hcf in the diagram represents the coercive force of the magnetization of the free magnetic layer 32.

When the first free magnetic sublayer 32a and the second free magnetic sublayer 32c have different magnetic moments per unit area, the spin-flop magnetic field Hsf of the free magnetic layer 32 is increased. This increases the range of the magnetic field for which the ferrimagnetic state of the free magnetic layer 32 can be stabilized or maintained.

When the diffusion-preventing layer 32a1 is provided, as is the case in this embodiment, the magnetic layer 32a2 and the second free magnetic sublayer 32c of the free magnetic layer 32 are preferably composed of the CoFeNi alloy in which the Fe content is in the range of 7 to 15 atomic percent, the Ni content is in the range of 5 to 15 atomic percent, and the balance is Co.

Consequently, the strength of exchange coupling magnetic fields due to the RKKY interaction generated between the first free magnetic sublayer 32a and the second free magnetic sublayer 32c can be increased. Specifically, the strength of the magnetic field at which the antiparallel state is lost, i.e., the spin-flop magnetic field (Hsf), can be increased to approximately 293 kA/m.

As a result, the magnetizations of the side regions of the first free magnetic sublayer 32a and the second free magnetic sublayer 32c, which lie below the second antiferromagnetic layers 20 and the ferromagnetic layers 19, can be appropriately pinned in an antiparallel state so as to inhibit side reading.

If the compositional ranges described above are satisfied, the magnetostrictions of the first free magnetic sublayer 32a and the second free magnetic sublayer 32c can be set in the range of $-3\times10^{-6}$ to $3\times10^{-6}$, and the coercive forces can be decreased to 790 A/m or less.

Furthermore, the soft magnetic properties of the free magnetic layer 32 can be improved, and decreases in the change in resistance ($\Delta R$) and the rate of change in resistance ($\Delta R/R$) due to the diffusion of Ni into the nonmagnetic material layer 16 can be appropriately suppressed.

Additionally, when the first free magnetic sublayer 32a does not include the diffusion-preventing layer 32a1 and includes the magnetic layer 32a2 only, the first free magnetic sublayer 32a and the second free magnetic sublayer 32c are preferably composed of a CoFeNi alloy, wherein the Fe content is in the range of 9 to 17 atomic percent, the Ni content is 0.5 to 10 atomic percent, and the balance is Co.

The magnetic sensing elements shown in FIGS. 2 to 6 also have the same advantages as those of the magnetic sensing element in the first embodiment shown in FIG. 1.

In any one of the magnetic sensing elements shown in FIGS. 1 to 5, the free magnetic layer 17 may be formed as a synthetic-ferri-free-type free magnetic layer.

In any one of the magnetic sensing elements shown in FIGS. 4 to 6, the edges 21 at the track width region C sides of the electrode layers 21 disposed on the second antiferromagnetic layers 20 may be formed so as to be closer to the side faces of the multilayer film compared to the edges 20a at the track width region C sides of the second antiferromagnetic layers 20.

In any one of the magnetic sensing elements shown in FIGS. 4 to 6, the edges 21 at the track width region C sides of the electrode layers 21 disposed on the second antiferromagnetic layers 20 may be formed so as to extend from the edges 19a at the track width region C sides of the ferromagnetic layers 19 and the edges 20a at the track width region C sides of the second antiferromagnetic layers 20 toward the center C1 of the multilayer film.

A method for fabricating the magnetic sensing element shown in FIG. 1 will now be described.

For example, when the magnetic sensing element constitutes a floating-type head, the lower shielding layer 11 is disposed on the trailing end of a ceramic slider with an insulating film, such as an $Al_2O_3$ film, therebetween. The multilayer film A shown in FIG. 1 is formed on the lower shielding layer 11 with the lower gap layer 12 therebetween.

Figure 7:
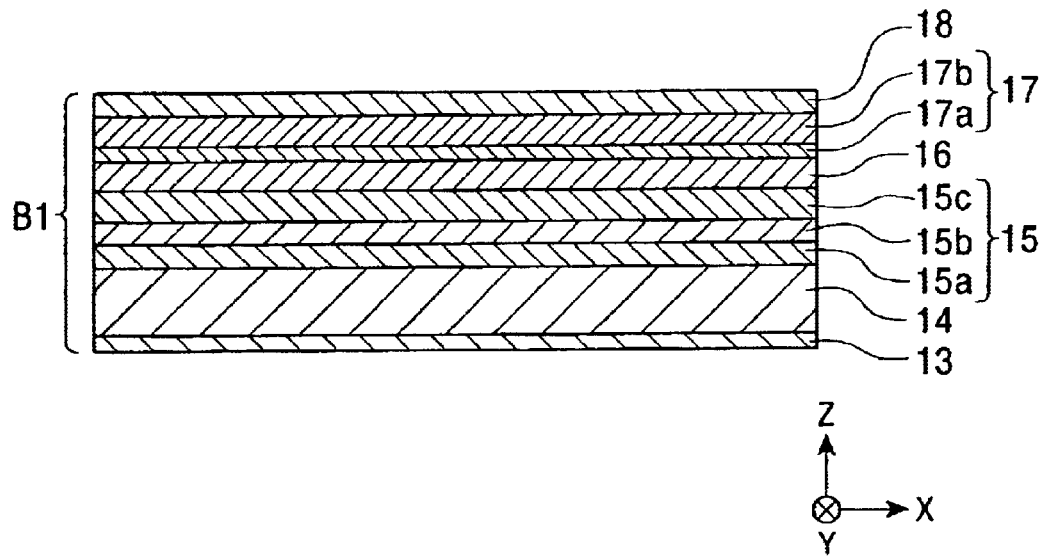
FIG. 7 is a sectional view showing a step in the fabrication process of a magnetic sensing element of the present invention.
Figure 8:
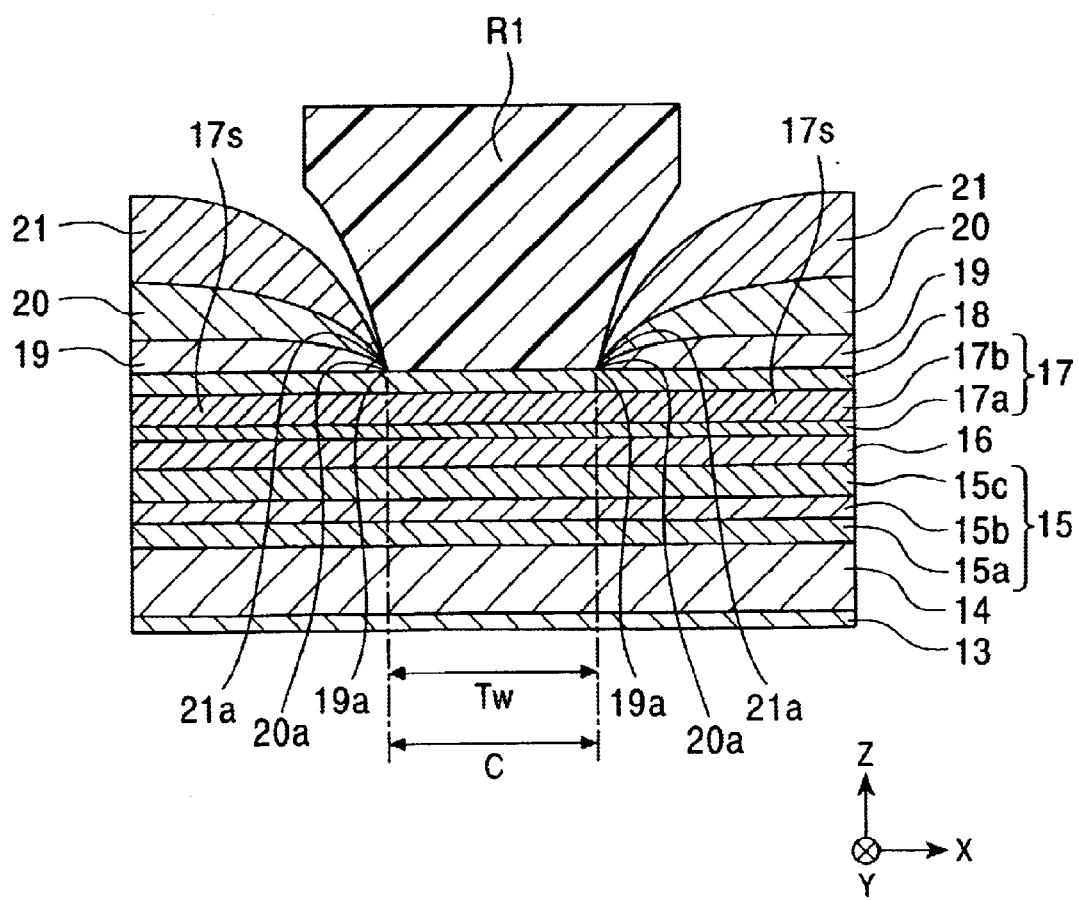
FIG. 8 is a sectional view showing a step in the fabrication process of a magnetic sensing element of the present invention.

FIGS. 7 and 8 are sectional views showing the steps in the fabrication process of the magnetic sensing element shown in FIG. 1. First, the antiferromagnetic layer 14 is deposited on the underlayer 13 (see FIG. 7). The synthetic ferri-pinned-type pinned magnetic layer 15 including the first pinned magnetic sublayer 15a, the nonmagnetic intermediate sublayer 15b, and the second pinned magnetic sublayer 15c is then deposited thereon. The nonmagnetic material layer 16, the free magnetic layer 17, and the nonmagnetic layer 18 are deposited on the pinned magnetic layer 15. These layers are continuously deposited by a thin-film forming process, such as sputtering or vapor deposition, in the same vacuum deposition apparatus, and thus a multilayer film A is thereby formed.

The first antiferromagnetic layer 14 is composed of any one of a PtMn alloy, an X—Mn alloy, wherein X is at least one element selected from the group consisting of Pd, Ir, Rh, Ru, Os, Ni, and Fe, and a Pt—Mn—X' alloy, wherein X' is at least one element selected from the group consisting of Pd, Ir, Rh, Ru, Au, Ag, Os, Cr, Ni, Ar, Ne, Xe, and Kr.

Although these alloys have a disordered face-centered cubic (fcc) structure immediately after being deposited, the structure is transformed into a CuAuI-type ordered face-centered tetragonal (fct) structure by annealing.

The first antiferromagnetic layer 14 has a thickness of 8 to 30 nm in the vicinity of the center of the layer in the track width direction.

The first and second pinned magnetic sublayers 15a and 15c are composed of ferromagnetic materials, such as a NiFe alloy, Co, a CoNiFe alloy, a CoFe alloy, and a CoNi alloy, and preferably, are composed of a NiFe alloy, a CoFe alloy, or Co. Preferably, the first and second pinned magnetic sublayers 15a and 15c are composed of the same material.

The nonmagnetic intermediate sublayer 15b is composed of an element selected from the group consisting of Ru, Rh, Ir, Os, Cr, Re, and Cu, or an alloy of at least two of these elements. Preferably, the nonmagnetic intermediate sublayer 15b is composed of Ru.

The nonmagnetic material layer 16 is preferably composed of a nonmagnetic conductive material, such as Cu, Cr, Au, or Ag, and more preferably, Cu.

The free magnetic layer 17 includes the diffusion-preventing layer 17a and the magnetic layer 17b. The diffusion-preventing layer 17a is composed of a ferromagnetic material, such as Co or a CoFe alloy. The magnetic layer 17b is composed of a ferromagnetic material, such as a NiFe alloy, Co, a CoNiFe alloy, a CoFe alloy, or a CoNi alloy.

When the diffusion-preventing layer 17a is provided, as is the case in this embodiment, the magnetic layer 17b is preferably composed of a CoFeNi alloy in which the Fe content is in the range of 7 to 15 atomic percent, the Ni content is in the range of 5 to 15 atomic percent, and the balance is Co.

Consequently, the strength of exchange coupling magnetic fields due to RKKY interactions generated between the free magnetic layer 17 and the ferromagnetic layers 19 can be increased. Accordingly, the spin-flop magnetic field (Hsf), can be increased to approximately 293 kA/m.

If the compositional ranges described above are satisfied, the combined magnetostriction of the magnetic layer 17b and the diffusion-preventing layer 17a in the free magnetic layer 17 can be set in the range of $-3\times10^{-6}$ to $3\times10^{-6}$, and the coercive force can be decreased to 790 A/m or less.

Furthermore, the soft magnetic properties of the free magnetic layer 17 can be improved, and decreases in the change in resistance ($\Delta R$) and the rate of change in resistance ($\Delta R/R$) due to the diffusion of Ni in the magnetic layer 17b into the diffusion-preventing layer 17a and the nonmagnetic material layer 16 can be appropriately suppressed.

Additionally, when the free magnetic layer 17 is formed as a single magnetic layer, the free magnetic layer 17 is preferably composed of a ferromagnetic material represented by the formula CoFeNi, wherein the Fe content is in the range of 9 to 17 atomic percent, the Ni content is 0.5 to 10 atomic percent, and the balance is Co.

The nonmagnetic layer 18 is composed of an element selected from the group consisting of Ru, Rh, Ir, Os, and Re, or an alloy of at least two of these elements. When the nonmagnetic layer 18 is composed of Ru, the thickness t1 of the nonmagnetic layer 18 is preferably in the range of 0.8 to 1.1 nm, and more preferably, in the range of 0.85 to 0.9 nm.

The multilayer film B1 is then annealed at a first annealing temperature in a first magnetic field directed in the Y direction having a first magnitude to produce an exchange anisotropic magnetic field between the first antiferromagnetic layer 14 and the first pinned magnetic sublayer 15a. Therefore, magnetization of the pinned magnetic layer 15 is pinned in the Y direction. In this embodiment, the first annealing temperature is 270° C. and the first magnitude is 800 kA/m.

Next, as shown in FIG. 8, a first resist layer R1 for a lift-off process is formed on the nonmagnetic layer 18, the lower surface of the first resist layer R1 having cutout sections. The first resist layer R1 covers the track width region C of the nonmagnetic layer 18.

The ferromagnetic layers 19, the second antiferromagnetic layers 20, and the electrode layers 21 are continuously formed by sputtering on the nonmagnetic layer 18 in the regions not covered by the first resist layer R1.

By adjusting the incident angle of sputtering, edges 19a, 20a, and 21a at the track width region C sides of the ferromagnetic layers 19, antiferromagnetic layers 20, and electrode layers 21 are extended to the joints between the nonmagnetic layer 18 and the resist layer R1. Herein, edges 20a of the antiferromagnetic layers 20 overlap with edges 21a of the electrode layers 21. At this stage, the width of the resist layer R1 in the track width direction is equal to the distances defined by either pair of edges 19a or 20a (see FIG. 8). Accordingly, the track width Tw of the magnetic sensing element is determined by the distance between either pair of edges 19a, 20a, or 21a.

The nonmagnetic layer 18 can be composed of any one of Ru, Rh, Ir, Os, and Re, or an alloy of at least two of these elements. In such cases, the surface of the nonmagnetic layer 18 is not substantially oxidized during annealing in the first magnetic field. Therefore, even if the surface of the nonmagnetic layer 18 is not treated by milling or the like before the ferromagnetic layers 19 are formed sputtering, RKKY interactions can be generated by the free magnetic layer 17 and the ferromagnetic layers 19 with the nonmagnetic layer 18 therebetween. For example, when the free magnetic layer 17 and the ferromagnetic layer 19 are composed of NiFe and the nonmagnetic layer is composed of Ru, even if the surface of the nonmagnetic layer 18 is not treated by milling or the like, a unidirectional anisotropic magnetic field of 42 KA/m can be generated.

That is, since the interfaces between the nonmagnetic layer 18 and the ferromagnetic layers 19 are not required to be trimmed by milling, it is possible to prevent a decrease in the unidirectional anisotropic magnetic field for aligning the magnetization direction of the free magnetic layer 17 in each side region 17 in a predetermined direction.

The second antiferromagnetic layers 20 are composed of the same material as the first antiferromagnetic layer 14.

In the magnetic sensing element of this embodiment, the first antiferromagnetic layer 14 and the second antiferromagnetic layers 20 may comprise the same composition of antiferromagnetic material.

Additionally, electrode underlayers composed of a nonmagnetic material, such as Ta, may be formed between the second antiferromagnetic layers 20 and the electrode layers 21.

Figure 9:
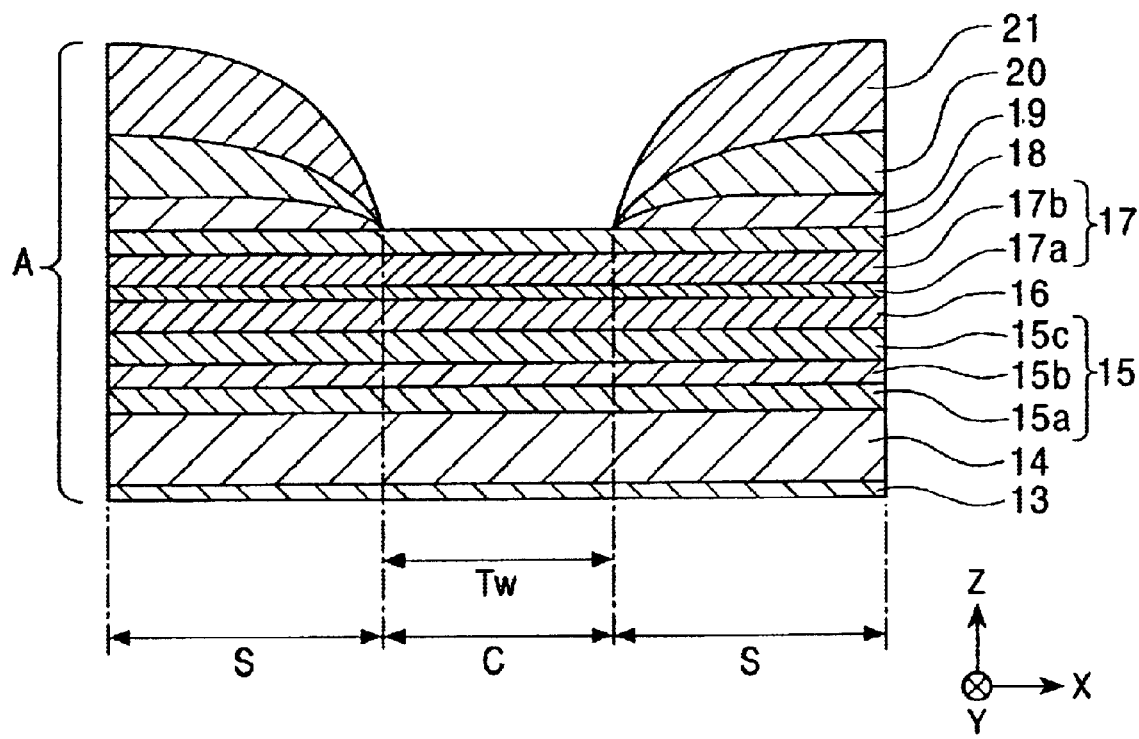
FIG. 9 is a sectional view showing a step in the fabrication process of a magnetic sensing element of the present invention.

By removing the resist layer R1, a multilayer film A is obtained as shown in FIG. 9. The multilayer film A is then annealed at a second annealing temperature in a second magnetic field directed in the X direction having a second magnitude that produces exchange anisotropic magnetic fields between the second antiferromagnetic fields 20 and the ferromagnetic layers 19 such that the magnetization directions of the ferromagnetic layers 19 are pinned in the X direction. In this embodiment, the second annealing temperature is 250° C. and the second magnitude is 8 kA/m.

The exchange anisotropic magnetic fields between the second antiferromagnetic layers 20 and the ferromagnetic layers 19 are first generated in the annealing step in the second magnetic field. Therefore, in order to direct the exchange anisotropic magnetic fields between the second antiferromagnetic layers 20 and the ferromagnetic layers 19 in the X direction while the direction of the exchange anisotropic magnetic field between the first antiferromagnetic layer 14 and the first pinned magnetic sublayer 15a is being directed in the Y direction, the only requirements are that: (1) the second annealing temperature be set lower than the blocking temperature at which the exchange coupling magnetic field by the first antiferromagnetic layer 14 is lost; and (2) the magnitude of the second magnetic field be set smaller than the magnitude of the exchange anisotropic magnetic field between the first antiferromagnetic layer 14 and the first pinned magnetic sublayer 15a. If annealing in the second magnetic field is performed under such conditions, even if the first antiferromagnetic layer 14 and the second antiferromagnetic layers 20 comprise the same composition of antiferromagnetic material, it is possible to direct the exchange anisotropic magnetic fields between the second antiferromagnetic layers 20 and the ferromagnetic layers 19 in the X direction while the direction of the exchange anisotropic magnetic field between the first antiferromagnetic layer 14 and the first pinned magnetic sublayer 15a is being directed in the Y direction. That is, the magnetization direction of the free magnetic layer 17 is easily pinned in the direction substantially perpendicular to the magnetization direction of the pinned magnetic layer 15.

Preferably, the second magnitude of the second magnetic field for annealing is: (1) larger than the saturation magnetic fields of the free magnetic layer 17 and the ferromagnetic layer 19 and the demagnetizing fields of the free magnetic layer 17 and the ferromagnetic layer 19; and (2) smaller than the spin-flop magnetic field at which antiparallel coupling between the free magnetic layer 17 and the ferromagnetic layer 19 is lost.

In the above embodiment, given the low magnitude of the second magnetic field during annealing in the second magnetic field (8 kA/m), it is possible to prevent the magnetization direction of the pinned magnetic layer 15 from being changed when annealing in the second magnetic field. Further, even if the magnitude of the second magnetic field is set at 8 kA/m, when both the free magnetic layer 17 and the ferromagnetic layers 19 are composed of NiFe and the nonmagnetic layer 18 is composed of Ru, a unidirectional anisotropic magnetic field of 56 kA/m can be generated. When both the free magnetic layer 17 and the ferromagnetic layers 19 are composed of CoFe and the nonmagnetic layer 18 is composed of Ru, a unidirectional anisotropic magnetic field of 152 kA/m can be generated.

After the multilayer film A is completed, the upper gap layer 22 and the upper shielding layer 23 are formed. The magnetic head for reading as shown in FIG. 1 is thereby obtained.

A method for fabricating the magnetic sensing element shown in FIG. 2 is described below.

Herein, a multilayer film A1 is formed on the lower shielding layer 11 with the lower gap layer 12 therebetween.

First, the antiferromagnetic layer 14 is deposited on the underlayer 13 (as in FIG. 7). The synthetic ferri-pinned-type pinned magnetic layer 15 including the first pinned magnetic sublayer 15a, the nonmagnetic intermediate sublayer 15b, and the second pinned magnetic sublayer 15c is then deposited thereon. The nonmagnetic material layer 16, the free magnetic layer 17, and the nonmagnetic layer 18 are deposited on the pinned magnetic layer 15. These layers are continuously deposited by a thin-film forming process, such as sputtering or vapor deposition, in the same vacuum deposition apparatus. A multilayer film A1 is thereby formed.

The first antiferromagnetic layer 14, the first pinned magnetic sublayer 15a, the nonmagnetic intermediate sublayer 15b, the second pinned magnetic sublayer 15c, the nonmagnetic material layer 16, the free magnetic layer 17, and the nonmagnetic layer 18 are composed of the same materials used in the method for fabricating the magnetic sensing element of FIG. 1.

The multilayer film A1 is then annealed at a first annealing temperature in a first magnetic field directed in the Y direction having a first magnitude to produce an exchange anisotropic magnetic field between the first antiferromagnetic layer 14 and the first pinned magnetic sublayer 15a. Therefore, magnetization of the pinned magnetic layer 15 is pinned in the Y direction. In this embodiment, the first annealing temperature is 270° C. and the first magnitude is 800 kA/m.

Figure 10:
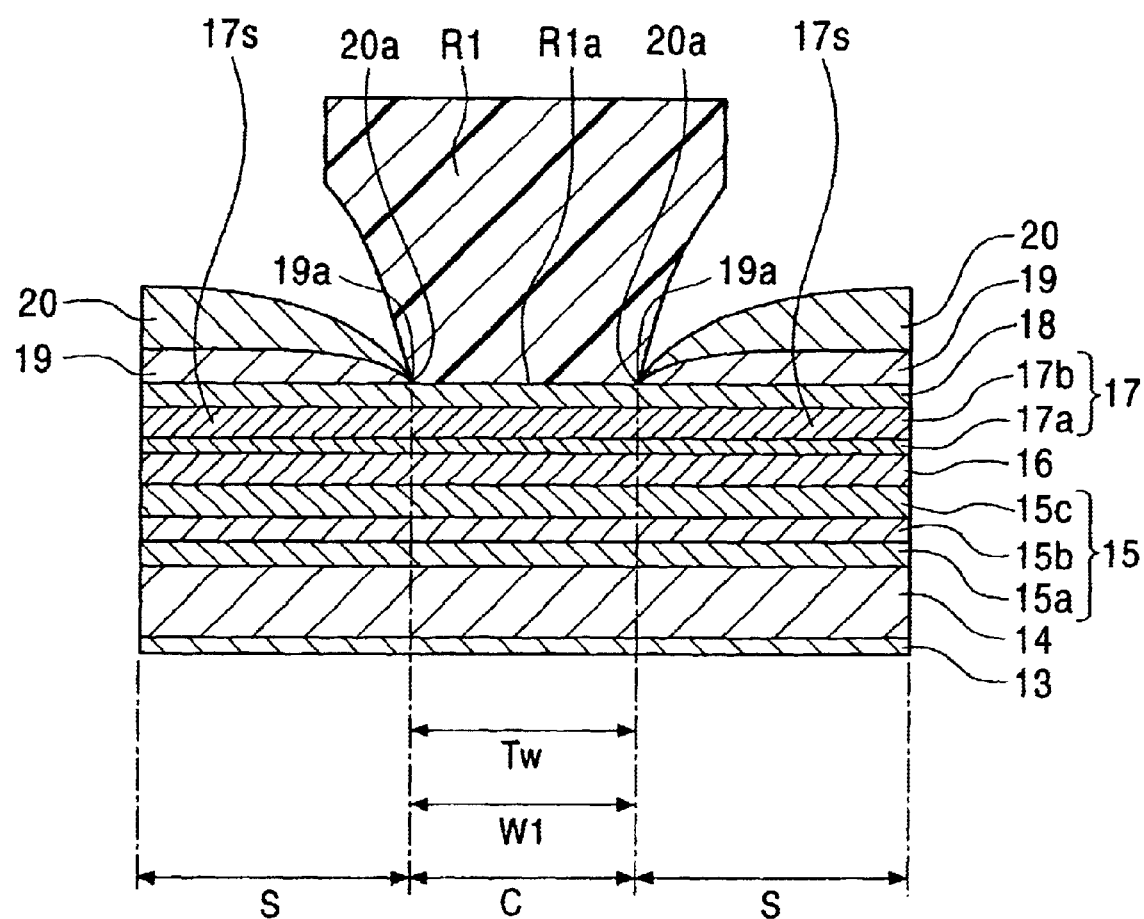
FIG. 10 is a sectional view showing a step in the fabrication process of a magnetic sensing element of the present invention.

Next, as shown in FIG. 10, a first resist layer R1 for a lift-off process is formed on the nonmagnetic layer 18, the lower surface of the first resist layer R1 having cutout sections. The first resist layer R1 covers the track width region (central region) C of the nonmagnetic layer 18.

The ferromagnetic layers 19 and the second antiferromagnetic layers 20 are continuously formed by sputtering on the nonmagnetic layer 18 in the regions not covered by the resist layer R1.

By adjusting the incident angle of sputtering, edges 19a and 20a at the track width region C sides of the ferromagnetic layers 19 and the second antiferromagnetic layers 20 are extended to the joints between the nonmagnetic layer 18 and the resist layer R1. At this stage, the width of the bottom face of the resist layer R1 in the track width direction is equal to the distances defined by either pair of edges 19a or 20a (see FIG. 10). Accordingly, the track width Tw of the magnetic sensing element is determined by the distance between either pair of edges 19a or 20a.

As in the previous embodiment, the nonmagnetic layer 18 can be composed of any one of Ru, Rh, Ir, Os, and Re, or an alloy of at least two of these elements. In such cases, the surface of the nonmagnetic layer 18 is not substantially oxidized during annealing in the first magnetic field. Therefore, even if the surface of the nonmagnetic layer 18 is not treated by milling or the like before the ferromagnetic layers 19 are formed sputtering, RKKY interactions can be generated by the free magnetic layer 17 and the ferromagnetic layers 19 with the nonmagnetic layer 18 therebetween.

That is, since the interfaces between the nonmagnetic layer 18 and the ferromagnetic layers 19 are not required to be trimmed by milling, it is possible to prevent a decrease in the unidirectional anisotropic magnetic field for aligning, in a predetermined direction, the magnetization direction of the free magnetic layer 17 in each of the two side regions 17s.

Figure 11:
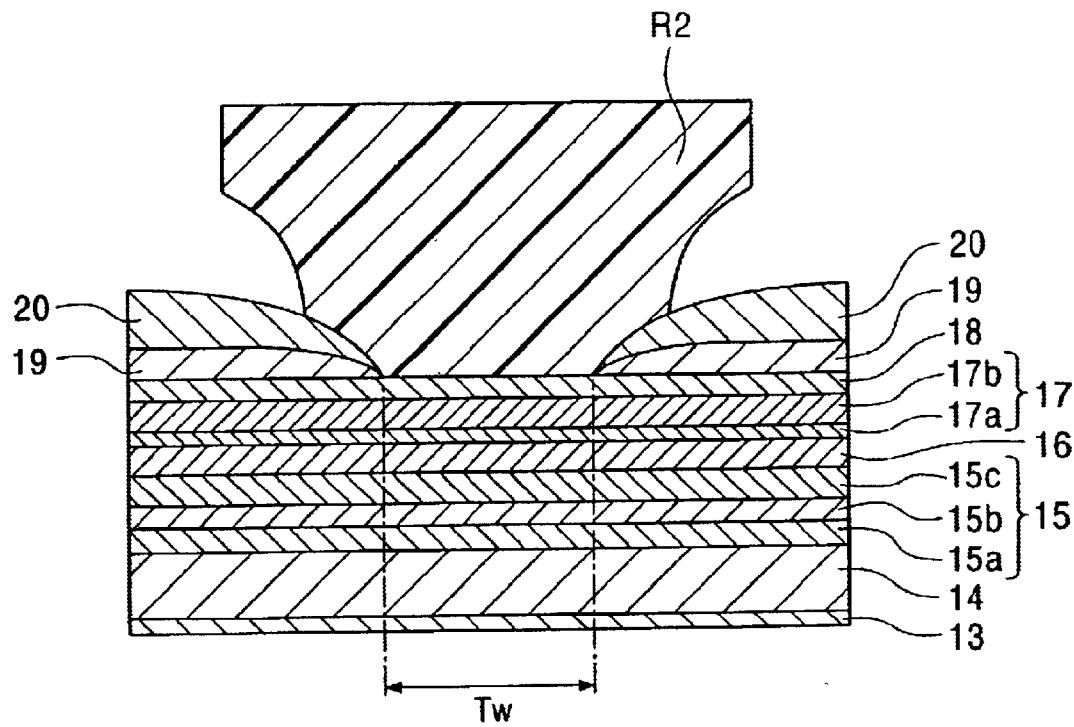
FIG. 11 is a sectional view showing a step in the fabrication process of a magnetic sensing element of the present invention.

Next, as shown in FIG. 11, a second resist layer R2 for a lift-off process is formed on the nonmagnetic layer 18 and the second antiferromagnetic layers 20, the second resist layer R2 having cutout sections.

Figure 12:
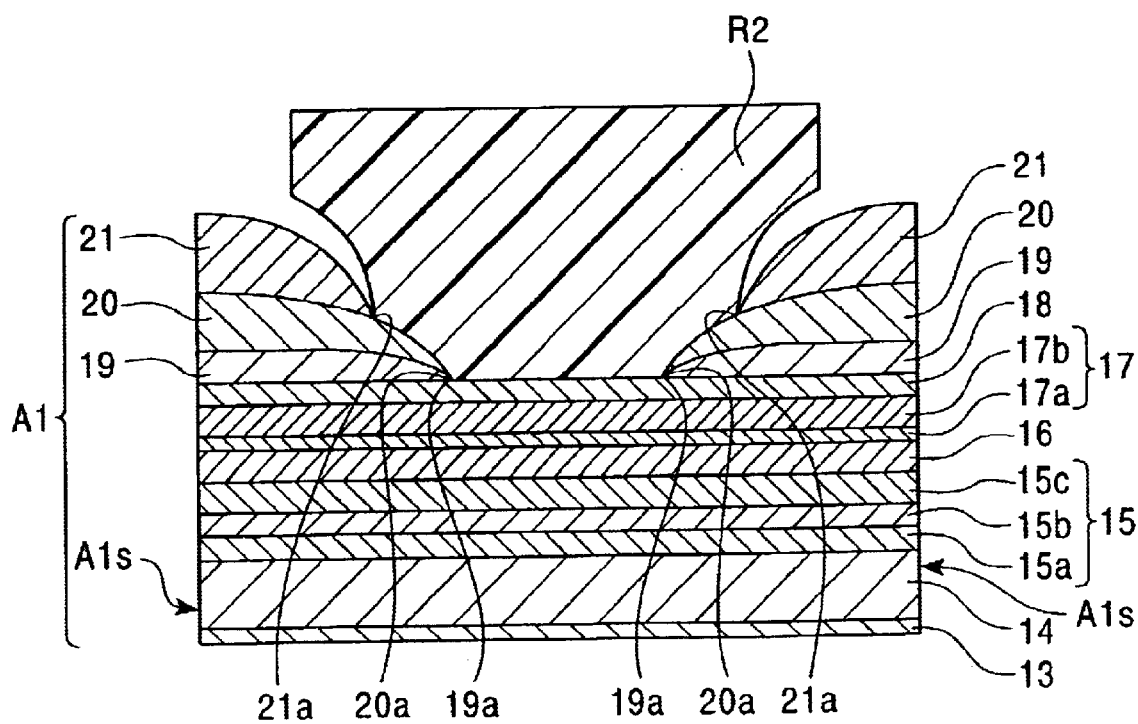
FIG. 12 is a sectional view showing a step in the fabrication process of a magnetic sensing element of the present invention.

In accordance with FIG. 12, the electrode layers 21 are formed by sputtering on the second antiferromagnetic layers 20 in the regions not covered by the resist layer R2. In the resultant magnetic sensing element, the edges 21a of the electrode layers 21 at the track width region C sides are placed closer to the side faces A1s of the multilayer film A1 compared to the edges 20a of the second antiferromagnetic layers 20 at the track width region C sides.

If the edges 21a of the electrode layers 21 at the track width region C sides are placed closer to side faces A1s of the multilayer film A1 compared to the edges 20a of the second antiferromagnetic layers 20 at the track width region C sides, the steps between the upper surface of the nonmagnetic layer 18 in the track width region C and the upper surfaces of the electrode layers 21 and the second antiferromagnetic layers 20 can be gentler. Therefore, even if the thickness of the upper gap layer of the magnetic sensing element is decreased, the upper gap layer can be reliably formed on the steps. Moreover, because there is more reliable protection against electrical short-circuiting between the upper shielding layer 23 and the electrode layers 21, the second antiferromagnetic layers 20, and the ferromagnetic layers 19, the magnetic sensing element can be rendered suitable for gap narrowing.

Since the steps between the upper surface of the nonmagnetic layer 18 in the track width region C and the upper surfaces of the electrode layers 21 and the second antiferromagnetic layers 20 can be gentler, it is possible to decrease the effective track width by preventing an increase in the distance between the upper shielding layer 23 and the lower shielding layer 11 in the vicinity of both sides of the track width region C of the multilayer film A1.

In the magnetic sensing element, the first antiferromagnetic layer 14 and the second antiferromagnetic layers 20 may comprise the same composition of antiferromagnetic material.

Additionally, electrode underlayers composed of a nonmagnetic material, such as Ta, may be formed between the second antiferromagnetic layers 20 and the electrode layers 21.

Figure 13:
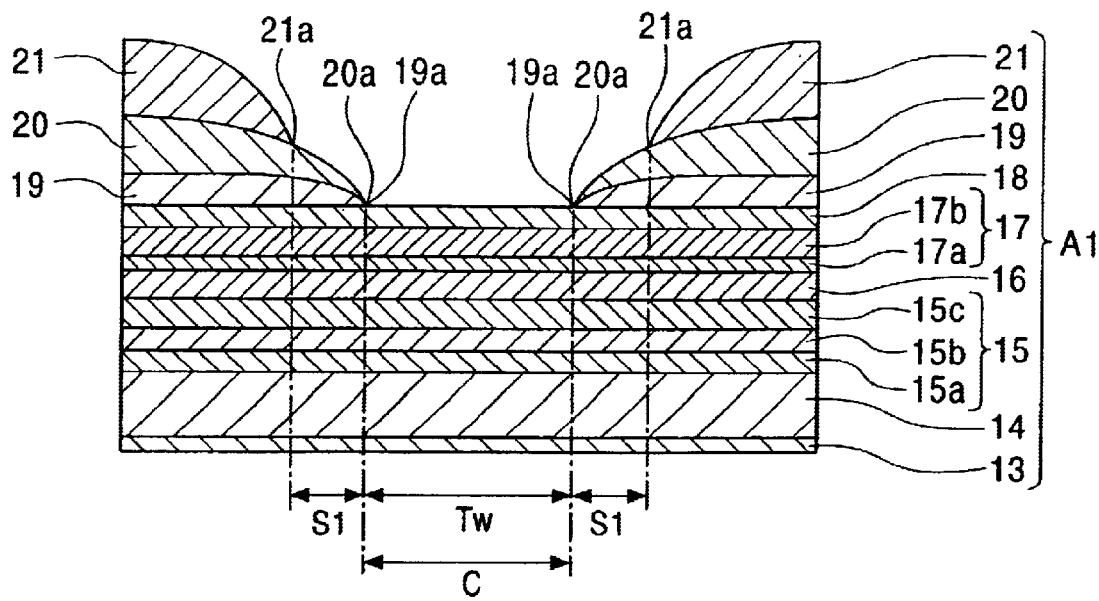
FIG. 13 is a sectional view showing a step in the fabrication process of a magnetic sensing element of the present invention.

By removing the resist layer R2, a multilayer film A1 is obtained as shown in FIG. 13. The multilayer film A1 is then annealed at a second annealing temperature in a second magnetic field directed in the X direction having a second magnitude that produces exchange anisotropic magnetic fields between the second antiferromagnetic layers 20 and the ferromagnetic layers 19 such that the magnetization directions of the ferromagnetic layers 19 are pinned in the X direction. In this embodiment, the second annealing temperature is 250° C. and the second magnitude is 8 kA/m.

The exchange anisotropic magnetic fields between the second antiferromagnetic layers 20 and the ferromagnetic layers 19 are first generated in the annealing step in the second magnetic field. Therefore, in order to direct the exchange anisotropic magnetic fields between the second antiferromagnetic layers 20 and the ferromagnetic layers 19 in the X direction while the direction of the exchange anisotropic magnetic field between the first antiferromagnetic layer 14 and the first pinned magnetic sublayer 15a is being directed in the Y direction, the only requirements are that: (1) the second annealing temperature should be set lower than the blocking temperature at which the exchange coupling magnetic field by the first antiferromagnetic layer 14 is lost; and (2) the magnitude of the second magnetic field should be set smaller than the magnitude of the exchange anisotropic magnetic field between the first antiferromagnetic layer 14 and the first pinned magnetic sublayer 15a. If annealing in the second magnetic field is performed under such conditions, even if the first antiferromagnetic layer 14 and the second antiferromagnetic layers 20 comprise the same composition of antiferromagnetic material, it is possible to direct the exchange anisotropic magnetic fields between the second antiferromagnetic layers 20 and the ferromagnetic layers 19 in the X direction while the direction of the exchange anisotropic magnetic field between the first antiferromagnetic layer 14 and the first pinned magnetic sublayer 15a is being directed in the Y direction. That is, the magnetization direction of the free magnetic layer 17 is easily pinned in the direction substantially perpendicular to the magnetization direction of the pinned magnetic layer 15.

Preferably, the second magnitude of the second magnetic field for annealing is: (1) larger than the saturation magnetic fields of the free magnetic layer 17 and the ferromagnetic layer 19 and the demagnetizing fields of the free magnetic layer 17 and the ferromagnetic layer 19; and (2) smaller than the spin-flop magnetic field at which antiparallel coupling between the free magnetic layer 17 and the ferromagnetic layer 19 is lost.

After the multilayer film A1 is completed, the upper gap layer 22 and the upper shielding layer 23 are formed. The magnetic sensing element shown in FIG. 2 is thereby obtained.

A method for fabricating the magnetic sensing element shown in FIG. 3 is described below.

Herein, a multilayer film A2 is formed on the lower shielding layer 11 with the lower gap layer 12 therebetween.

First, the antiferromagnetic layer 14 is deposited on the underlayer 13 (see FIG. 7). The synthetic ferri-pinned-type pinned magnetic layer 15 including the first pinned magnetic sublayer 15a, the nonmagnetic intermediate sublayer 15b, and the second pinned magnetic sublayer 15c is then deposited thereon. The nonmagnetic material layer 16, the free magnetic layer 17, and the nonmagnetic layer 18 are deposited on the pinned magnetic layer 15. These layers are continuously deposited by a thin-film forming process, such as sputtering or vapor deposition, in the same vacuum deposition apparatus, and thus a multilayer film A2 is formed.

The first antiferromagnetic layer 14, the first pinned magnetic sublayer 15a, the nonmagnetic intermediate sublayer 15b, the second pinned magnetic sublayer 15c, the nonmagnetic material layer 16, the free magnetic layer 17, and the nonmagnetic layer 18 are composed of the same materials used in the method for fabricating the magnetic sensing element of FIG. 1.

The multilayer film A2 is then annealed at a first annealing temperature in a first magnetic field directed in the Y direction having a first magnitude to produce an exchange anisotropic magnetic field between the first antiferromagnetic layer 14 and the first pinned magnetic sublayer 15a. Therefore, the magnetization of the pinned magnetic layer 15 is pinned in the Y direction. In this embodiment, the first annealing temperature is 270° C. and the first magnitude is 800 kA/m.

Next, as shown in FIG. 10, a first resist layer R1 for a lift-off process is formed on the nonmagnetic layer 18, the lower surface of the first resist layer R1 having cutout sections. The first resist layer R1 covers the track width region (central region) C of the nonmagnetic layer 18.

The ferromagnetic layers 19 and the second antiferromagnetic layers 20 are continuously formed by sputtering on the nonmagnetic layer 18 in the regions not covered by the resist layer R1.

By adjusting the incident angle of sputtering, edges 19a and 20a at the track width region C sides of the ferromagnetic layers 19 and the second antiferromagnetic layers 20 are extended to the joints between the nonmagnetic layer 18 and the resist layer R1. At this stage, the width of the bottom face of the resist layer R1 in the track width direction is equal to the distances defined by either pair of edges 19a or 20a (see FIG. 10).

As in the previous embodiment, the nonmagnetic layer 18 can be composed of any one of Ru, Rh, Ir, Os, and Re, or an alloy of at least two of these elements. In such cases, the surface of the nonmagnetic layer 18 is not substantially oxidized during annealing in the first magnetic field. Therefore, even if the surface of the nonmagnetic layer 18 is not treated by milling or the like before the ferromagnetic layers 19 are formed sputtering, RKKY interactions can be generated by the free magnetic layer 17 and the ferromagnetic layers 19 with the nonmagnetic layer 18 therebetween.

That is, since the interfaces between the nonmagnetic layer 18 and the ferromagnetic layers 19 are not required to be trimmed by milling, it is possible to prevent a decrease in the unidirectional anisotropic magnetic field for aligning, in a predetermined direction, the magnetization direction of the free magnetic layer 17 in each of the side regions 17s.

Figure 14:
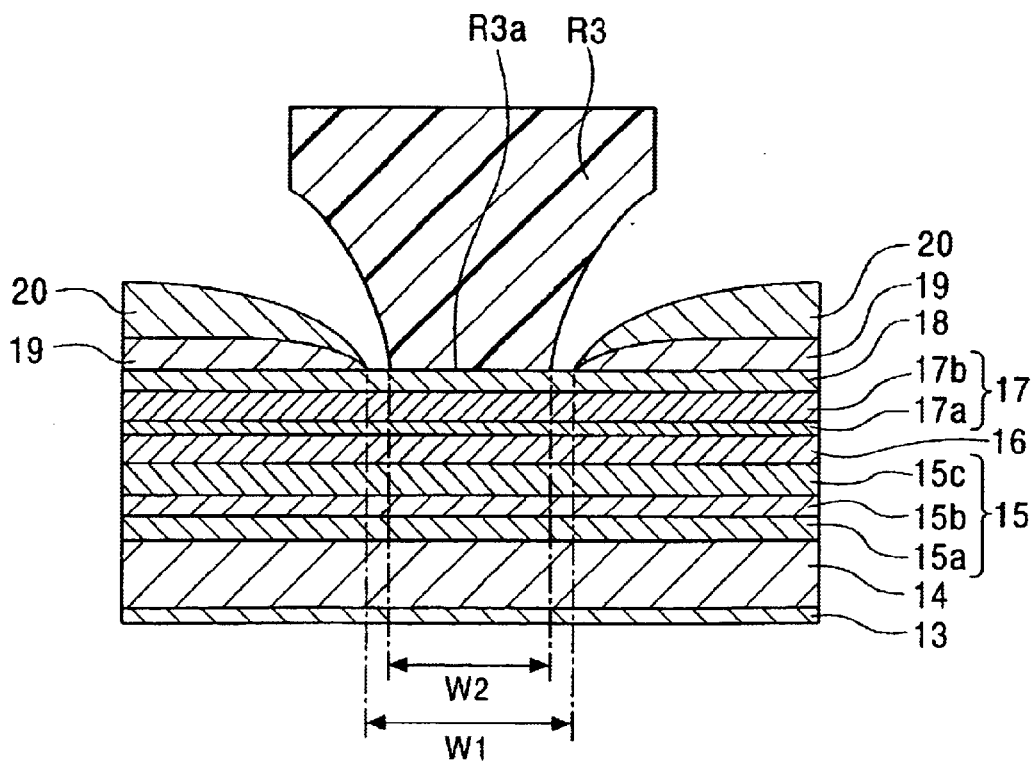
FIG. 14 is a sectional view showing a step in the fabrication process of a magnetic sensing element of the present invention.

Next, as shown in FIG. 14, a second resist layer R3 for a lift-off process is formed on the nonmagnetic layer 18, the width W2 in the track width direction of the bottom face R3a of the second resist layer R3 being smaller than the width W1 of the bottom face R1a of the first resist layer R1.

Figure 15:
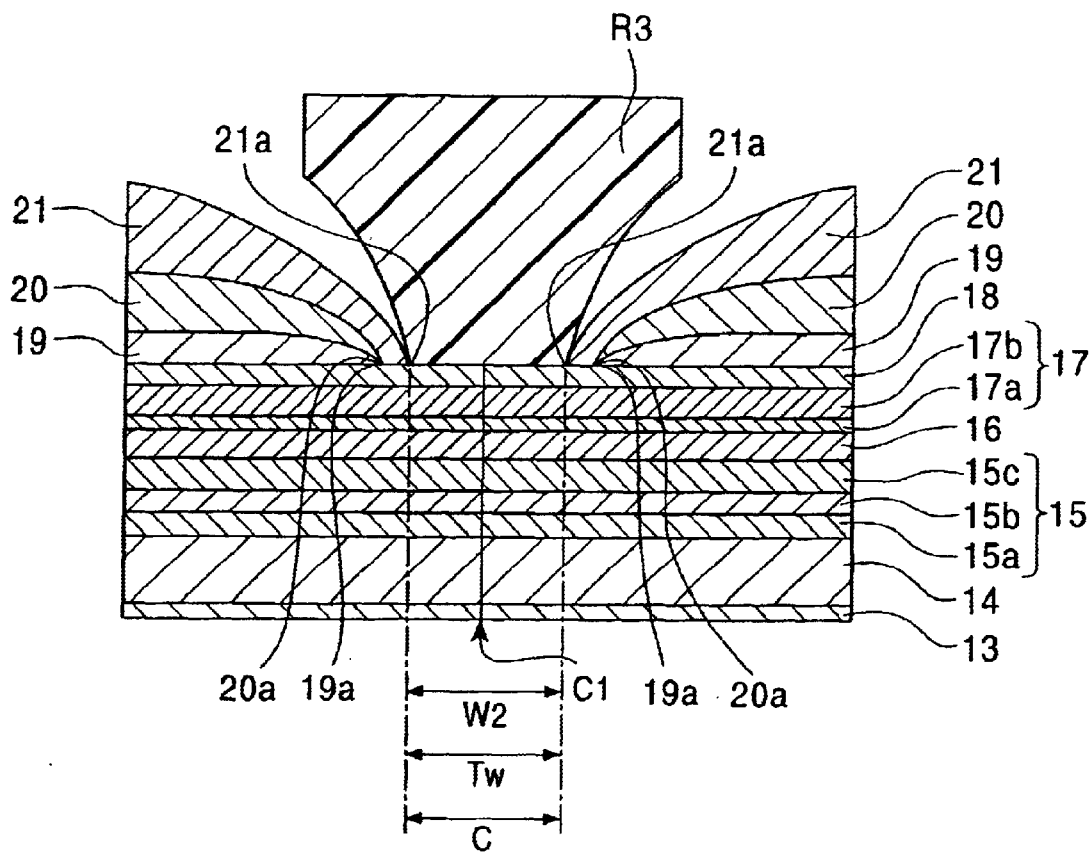
FIG. 15 is a sectional view showing a step in the fabrication process of a magnetic sensing element of the present invention.

In accordance with FIG. 15, the electrode layers 21 are formed by sputtering on the second antiferromagnetic layers 20 and on the nonmagnetic layer 18 in the regions not covered by the resist layer R3.

By adjusting the incident angle of sputtering, the edges 21a at the track width region C sides of the electrode layers 21 are extended to the joints between the nonmagnetic layers 18 and the resist layer R3. As a result, edges 21a at the track width region C sides of the electrode layers 21, which are formed on the second antiferromagnetic layers 20, extend from the edges 19a of the ferromagnetic layers 19 at the track width region C sides and the edges 20a of the second antiferromagnetic layers 20 at the track width region C sides toward the center C1 of the multilayer film A2.

At this stage, the width in the track width direction of the bottom face of the resist layer R3 is equal to the distance between the edges 21a. The distance between the edges 21a of the electrode layers 21 determines the track width Tw of the magnetic sensing element.

The ferromagnetic layers 19 and the second antiferromagnetic layers 20 are composed of materials having a larger resistivity than the electrode layer 21. If the electrode layer 21 is disposed only on the ferromagnetic layers 19 and the antiferromagnetic layers 20, a DC current supplied to the electrode layer 21 flows through the nonmagnetic layer 18, the free magnetic layer 17, the nonmagnetic material layer 16, and the pinned magnetic layer 15 via the ferromagnetic layers 19 and the antiferromagnetic layers 20, thereby increasing the DC resistance of the magnetic sensing element.

On the other hand, when the edges 21a of the electrode layers 21 at the track width region C sides extend from the edges 19a of the ferromagnetic layers 19 at the track width region C sides and the edges 20a of the second antiferromagnetic layers 20 at the track width region C sides toward the center C1 of the multilayer film A2, a DC current supplied to the electrode layer 21 can be transmitted without passing through the ferromagnetic layer 19 and the second antiferromagnetic layer 20. As a result, the DC resistance is decreased in this magnetic sensing element.

The track width Tw of the magnetic sensing element shown in FIG. 3 is determined by the distance between the edges 21a of the electrode layers 21 at the track width region C sides. Therefore, even if the magnetization directions of the side regions 17s of the free magnetic layer 17 in the vicinity of the edges 20a of the second antiferromagnetic layers 20 at the track width region C sides are altered due to compositional changes, sagging, etc., it is possible to prevent changes in the track width Tw.

Figure 16:
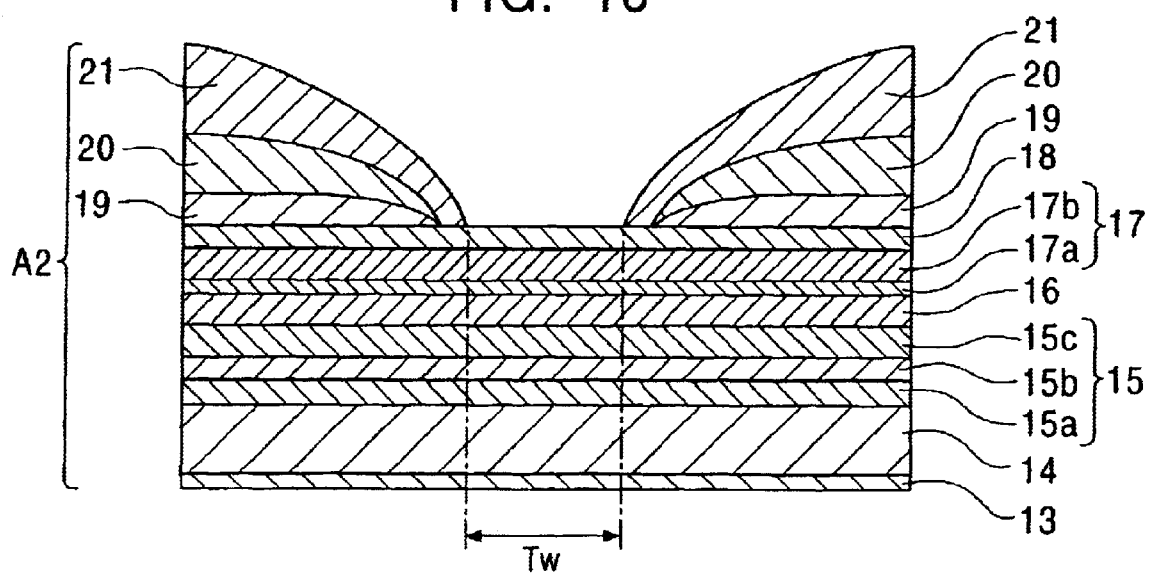
FIG. 16 is a sectional view showing a step in the fabrication process of a magnetic sensing element of the present invention.

After the electrode layers 21 are deposited, the second resist layer R3 is removed and the multilayer film A2 is obtained as shown in FIG. 16.

In the magnetic sensing element in this embodiment, the first antiferromagnetic layer 14 and the second antiferromagnetic layers 20 may comprise the same composition of antiferromagnetic material.

Additionally, electrode underlayers composed of a nonmagnetic material, such as Ta, may be formed between the second antiferromagnetic layers 20 and the electrode layers 21.

By removing the resist layer R3, the multilayer film A2 is obtained as shown in FIG. 16. The multilayer film A2 is then annealed at a second annealing temperature in a second magnetic field directed in the X direction having a second magnitude that produces exchange anisotropic magnetic fields between the second antiferromagnetic layers 20 and the ferromagnetic layers 19 such that the magnetization directions of the ferromagnetic layers 19 are pinned in the X direction. In this embodiment, the second annealing temperature is 250° C. and the second magnitude is 8 kA/m.

The exchange anisotropic magnetic fields between the second antiferromagnetic layers 20 and the ferromagnetic layers 19 are first generated in the annealing step in the second magnetic field. Therefore, in order to direct the exchange anisotropic magnetic fields between the second antiferromagnetic layers 20 and the ferromagnetic layers 19 in the X direction while the direction of the exchange anisotropic magnetic field between the first antiferromagnetic layer 14 and the first pinned magnetic sublayer 15a is being directed in the Y direction, the only requirements are that: (1) the second annealing temperature be set lower than the blocking temperature at which the exchange coupling magnetic field by the first antiferromagnetic layer 14 is lost; and (2) the magnitude of the second magnetic field be set smaller than the magnitude of the exchange anisotropic magnetic field between the first antiferromagnetic layer 14 and the first pinned magnetic sublayer 15a. If annealing in the second magnetic field is performed under such conditions, even if the first antiferromagnetic layer 14 and the second antiferromagnetic layers 20 comprise the same composition of antiferromagnetic material, it is possible to direct the exchange anisotropic magnetic fields between the second antiferromagnetic layers 20 and the ferromagnetic layers 19 in the X direction while the direction of the exchange anisotropic magnetic field between the first antiferromagnetic layer 14 and the first pinned magnetic sublayer 15a is being directed in the Y direction. That is, the magnetization direction of the free magnetic layer 17 is easily pinned in the direction substantially perpendicular to the magnetization direction of the pinned magnetic layer 15.

Preferably, the second magnitude of the second magnetic field for annealing is: (1) larger than the saturation magnetic fields of the free magnetic layer 17 and the ferromagnetic layer 19 and the demagnetizing fields of the free magnetic layer 17 and the ferromagnetic layer 19; and (2) smaller than the spin-flop magnetic field at which antiparallel coupling between the free magnetic layer 17 and the ferromagnetic layer 19 is lost.

After the multilayer film A2 is completed, the upper gap layer 22 and the upper shielding layer 23 are formed. The magnetic sensing element shown in FIG. 3 is thereby obtained.

In order to fabricate the magnetic sensing element shown in FIG. 4, in the step shown in FIG. 7, conductive material layer 30 composed of Cu is formed between the nonmagnetic layer 18 and the free magnetic layer 17. When the conductive material layer 30 is composed of a conductive material having a resistivity that is lower than the resistivity of the nonmagnetic layer 18, a higher spin filter effect can be exhibited than in the case in which only a nonmagnetic layer 18 is used. Consequently, inclusion of the conductive material layer 30 can further improve the magnetic sensitivity of the magnetic sensing element.

When the conductive material layer 30 is formed, for example, the nonmagnetic layer 18 may be composed of Ru with a thickness of 0.4 to 1.1 nm, and the conductive material layer 30 may be composed of Cu with a thickness of 0.3 to 0.5 nm.

In order to fabricate the magnetic sensing element shown in FIG. 5, in the step shown in FIG. 8, after the resist layer R1 is formed on the multilayer film B1, before forming the ferromagnetic layers 19, the surface of the nonmagnetic layer 18 not covered by the resist layer R1 is trimmed by dry etching, such as ion milling. By performing dry etching, the nonmagnetic layer 18 is changed to the nonmagnetic layer 31 in which the thickness t4 of the central region 31c is larger than the thickness t5 of the side regions 31d.

By using such a fabrication method, since the thickness t4 of the central region 31c of the nonmagnetic layer 31 can be increased arbitrarily, the spin filter effect can be improved. Consequently, the increase in thickness can further improve the magnetic sensitivity of the magnetic sensing element.

As shown in FIG. 5, preferably, the thickness t5 of the side regions 31d of the nonmagnetic layer 31, which overlap with the second antiferromagnetic layers 20 and the ferromagnetic layers 19, is set in the range which can increase the RKKY interactions between the ferromagnetic layers 19 and the side regions 17s of the free magnetic layer 17.

For example, when the nonmagnetic layer 31 is composed of Ru, by setting the thickness t5 of the side regions 31d of the nonmagnetic layer 31 at 0.8 to 1.1 nm, the RKKY interactions between the ferromagnetic layers 19 and the side regions 17s of the free magnetic layer 17 can be increased.

Since the free magnetic layer 17 and the ferromagnetic layers 19 are magnetically coupled to each other with the nonmagnetic layer 31 therebetween by the RKKY interaction, even when the interfaces between the nonmagnetic layer 31 and the ferromagnetic layers 19 are surfaces trimmed by milling, it is possible to obtain unidirectional anisotropic magnetic fields having a magnitude sufficient for aligning the magnetization directions in the side regions 17s of the free magnetic layer 17 in a predetermined direction.

In order to fabricate the magnetic sensing element shown in FIG. 6, in the step shown in FIG. 7, the free magnetic layer 32 is formed as a so-called "synthetic-ferrifree-type"

free magnetic layer including the first free magnetic sublayer 32a and the second free magnetic sublayer 32c having different magnetic moments per unit area which are laminated with the nonmagnetic intermediate sublayer 32b therebetween.

Preferably, the second free magnetic sublayer 32c and the ferromagnetic layers 19 are composed of the same material.

Each of the magnetic sensing elements shown in FIGS. 1 to 6 has a so-called "current-in-plane (CIP)"-type structure, in which the electrode layers 21 are provided on both side regions S in the track width direction (in the X direction) of each of the multilayer films A1 to A5 such that a current supplied from the electrode layer 21 into the multilayer film flows parallel to the planes of the individual layers of the multilayer film.

On the other hand, the magnetic sensing element described below with reference to FIG. 20 onward has a so-called "current-perpendicular-to-plane (CPP)"-type structure, in which the electrode layers are provided on the upper and lower surfaces of the multilayer film, and a current flows perpendicular to the planes of the individual layers of the multilayer film. The present invention is also applicable to the CPP-type magnetic sensing element.

With respect to the CPP-type magnetic sensing elements, the same advantages as those of the CIP-type magnetic sensing elements shown in FIGS. 1 to 6 can be expected.

That is, since insensitive regions do not occur in the track width (optical track width) Tw region set in the fabrication process of magnetic sensing element, it is possible to prevent the read output from decreasing when the optical track width Tw of the magnetic sensing element is reduced in order to satisfy demands for increased recording density.

Furthermore, since the side faces of the magnetic sensing element can be formed so as to be perpendicular to the track width direction, variations in the length of the free magnetic layer 17 in the track width direction can be suppressed. Consequently, side reading can be suppressed also.

Figure 20:
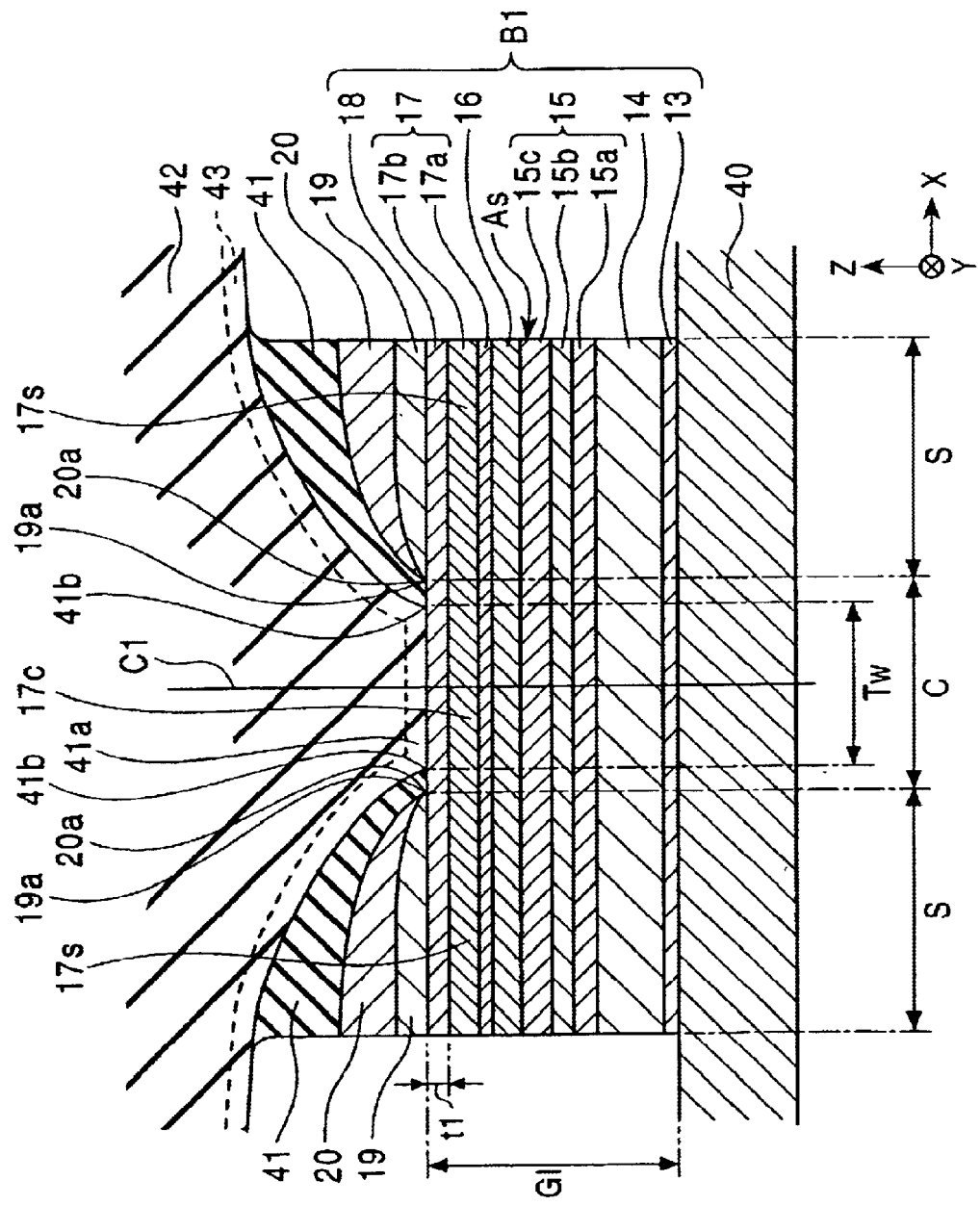
FIG. 20 is a sectional view of a magnetic sensing element in a seventh embodiment of the present invention.

The magnetic sensing element shown in FIG. 20 has the same structure as the multilayer film B1 from underlayer 13 to the nonmagnetic layer 18 as exemplified by the magnetic sensing element shown in FIG. 1. The differences between the magnetic sensing element shown in FIG. 20 and the magnetic sensing element shown in FIG. 1 are as follows.

A lower electrode layer 40 which also acts as a lower shielding layer is provided under the multilayer film B1 shown in FIG. 20. The lower electrode layer 40 is formed by plating using a magnetic material, such as Permalloy (NiFe).

As shown in FIG. 20, insulating layers 41 are formed on the second antiferromagnetic layers 20 and the nonmagnetic layer 18. The insulating layers 41 are composed of, for example, $Al_2O_3$, $SiO_2$, AlN, Al—Si—O, or $Si_3N_4$. The insulating layers 41 provide an opening 41a on the top of the central region of the nonmagnetic layer 18. An upper electrode layer 42 is electrically connected to the multilayer film B1 via the opening 41a. The width in the track width direction (in the X direction) of the opening 41a corresponds to the optical track width Tw. The insulating layer has an appropriate thickness for preventing shunt loss.

The upper electrode layer 42, also acting as an upper shielding layer, is formed on the insulating layer 41 and the nonmagnetic layer 18. The upper electrode layer 42 is composed of a magnetic material, such as NiFe.

As described above, in the magnetic sensing element shown in FIG. 20, the electrode layers 40 and 42 (which also act as shielding layers) are provided on the lower and upper surfaces of the multilayer film B1, respectively. A current passes between the electrode layers 40 and 42 and flows perpendicular to the planes of the individual layers of the multilayer film B1.

In the magnetic sensing element shown in FIG. 20, since the upper surfaces of the second antiferromagnetic layers 20 are covered by the insulating layer 41, the current flowing from the upper electrode layer 41 into the multilayer film B1 is not shunted to the second antiferromagnetic layers 20, etc. Rather, the current flows within the region of the track width Tw that is determined by the width in the track width direction of the opening 41a of the insulating layer 41. Consequently, the current path is prevented from spreading outside the track width Tw. This makes it possible to produce a CPP-type magnetic sensing element having a large read output.

As shown in FIG. 20, a nonmagnetic layer 43 represented by the dotted line may be formed on the insulating layer 41 and the nonmagnetic layer 18. The nonmagnetic layer 43 is preferably composed of a nonmagnetic conductive material, such as Ta, Ru, Rh, Ir, Cr, Re, or Cu. The nonmagnetic layer 43 functions as an upper gap layer. On the other hand, if the nonmagnetic layer 18, comprising a port for the current path is covered by the nonmagnetic layer 43 composed of, for e.g., an insulating material, the current does not substantially flows into the multilayer film B1. This is not desirable. Therefore, in the present invention, the nonmagnetic layer 43 is preferably composed of a nonmagnetic conductive material.

In the magnetic sensing element shown in FIG. 20, the nonmagnetic material layer 16 of the multilayer film B1 may be composed of a nonmagnetic conductive material, such as Cu. Alternatively, the nonmagnetic material layer 16 may be composed of an insulating material, such as $Al_2O_3$ or $SiO_2$. The magnetic sensing element having the former structure is referred to as a spin-valve GMR-type magnetoresistive element; the magnetic sensing element having the latter structure is referred to as a tunneling magnetoresistive element.

In the tunneling magnetoresistive element, a change in resistance is caused by the tunneling effect. When the magnetization directions of the second pinned magnetic sublayer 15c and the free magnetic layer 17 are antiparallel, there is maximum resistance, since the tunneling current does not effectively flow through the nonmagnetic material layer 16. On the other hand, when the magnetization directions of the second pinned magnetic sublayer 15c and the free magnetic layer 17 are parallel, the tunneling current flows effectively, thereby minimizing the level of resistance.

By this principle, a change in electrical resistance is defined by a change in the voltage change or current change such that a fringing magnetic field from a recording medium is detectable.

Figure 21:
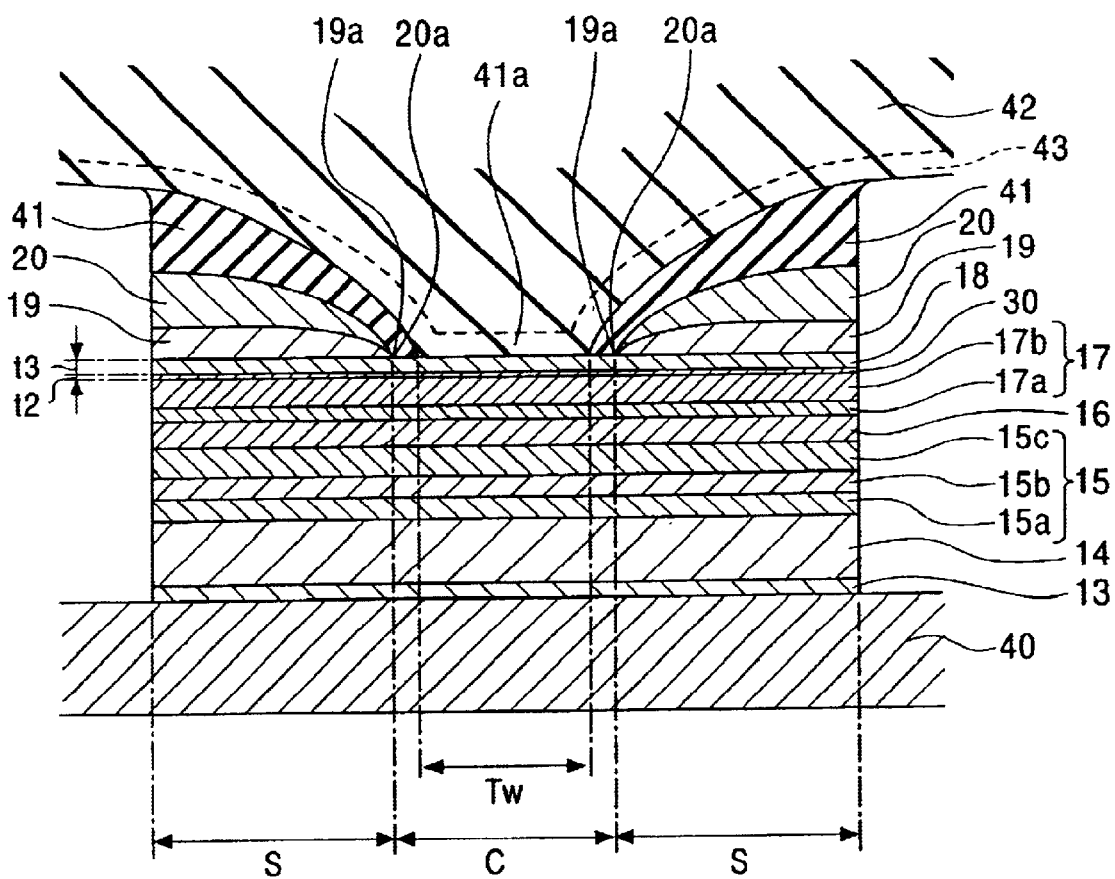
FIG. 21 is a sectional view of a magnetic sensing element in an eighth embodiment of the present invention.
Figure 22:
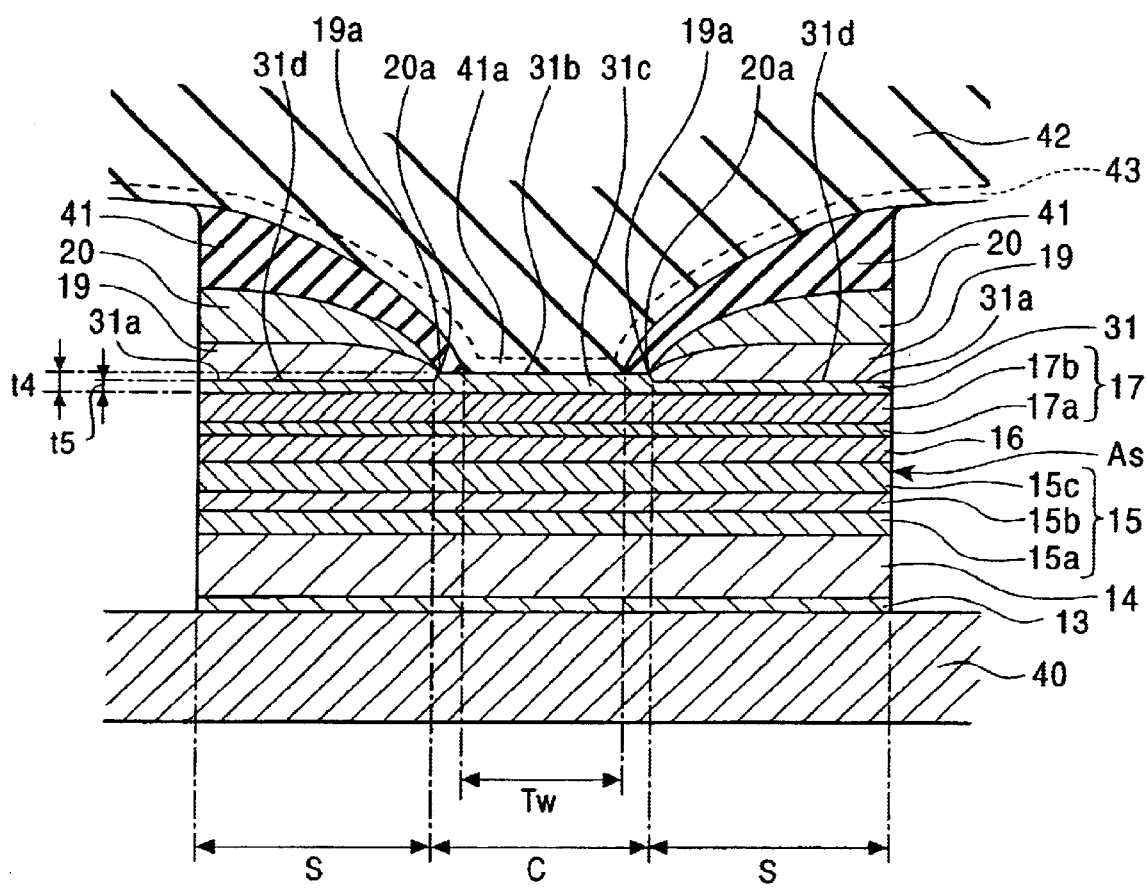
FIG. 22 is a sectional view of a magnetic sensing element in a ninth embodiment of the present invention.
Figure 23:
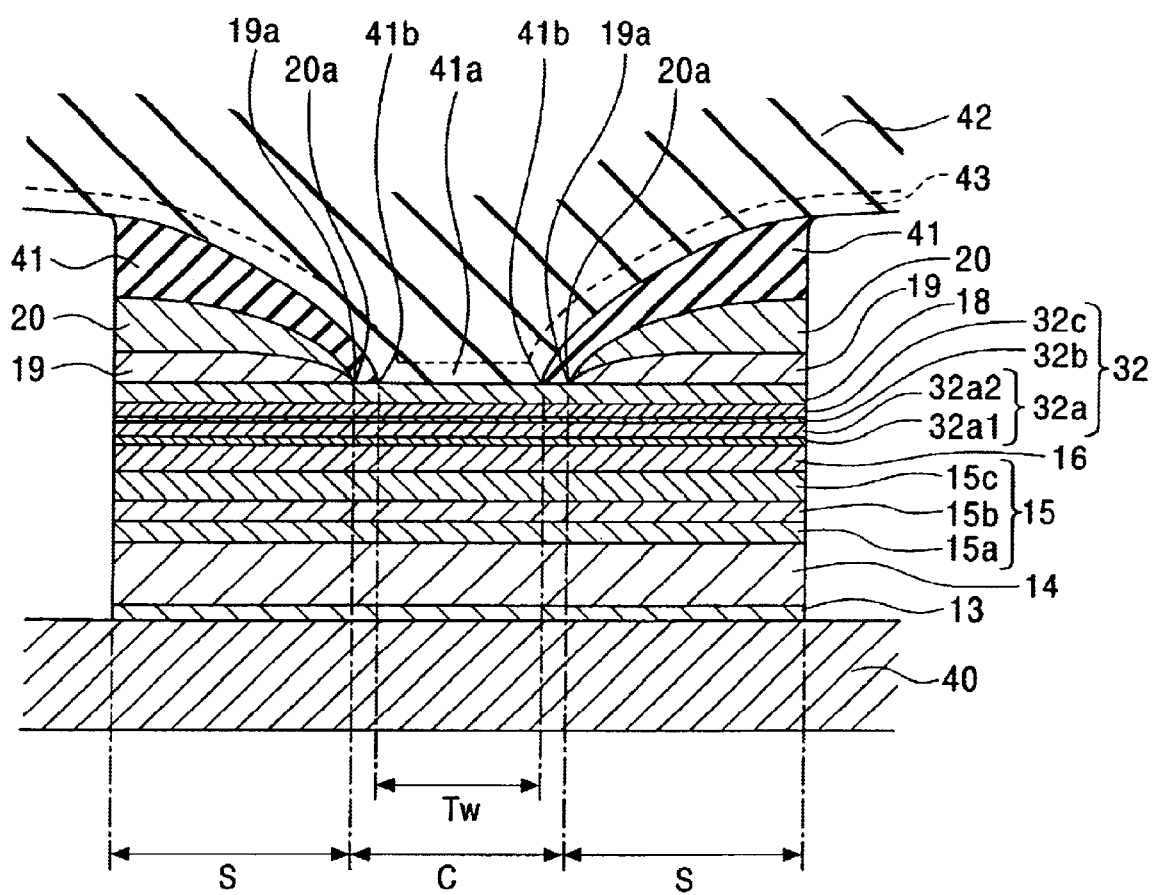
FIG. 23 is a sectional view of a magnetic sensing element in a tenth embodiment of the present invention.

FIG. 21 is a sectional view of a magnetic sensing element in an eighth embodiment of the present invention. The magnetic sensing element in this embodiment is the same as the magnetic sensing element shown in FIG. 4 apart from the fact that the CPP-type structure is used, the same as the magnetic sensing element shown in FIG. 20. FIG. 22 is a sectional view of a magnetic sensing element in a ninth embodiment of the present invention. The magnetic sensing element in this embodiment is the same as the magnetic sensing element shown in FIG. 5 apart from the fact that the CPP-type structure is used, the same as the magnetic sensing element shown in FIG. 20. FIG. 23 a sectional view of a magnetic sensing element in a tenth embodiment of the present invention. The magnetic-sensing element in this embodiment is the same as the magnetic sensing element shown in FIG. 6 apart from the fact that the CPP-type structure is used, the same as the magnetic sensing element shown in FIG. 20.

That is, in each of the magnetic sensing elements shown in FIGS. 21 to 23, the lower electrode layer 40 which also acts as the lower shielding layer is formed under the first antiferromagnetic layer 14; the insulating layer 41 is formed on the second antiferromagnetic layers 20; and the upper electrode layer 42 (which also acts as the upper shielding layer) is formed on the insulating layer 41 and the nonmagnetic layers 18 or 31.

Figure 24:
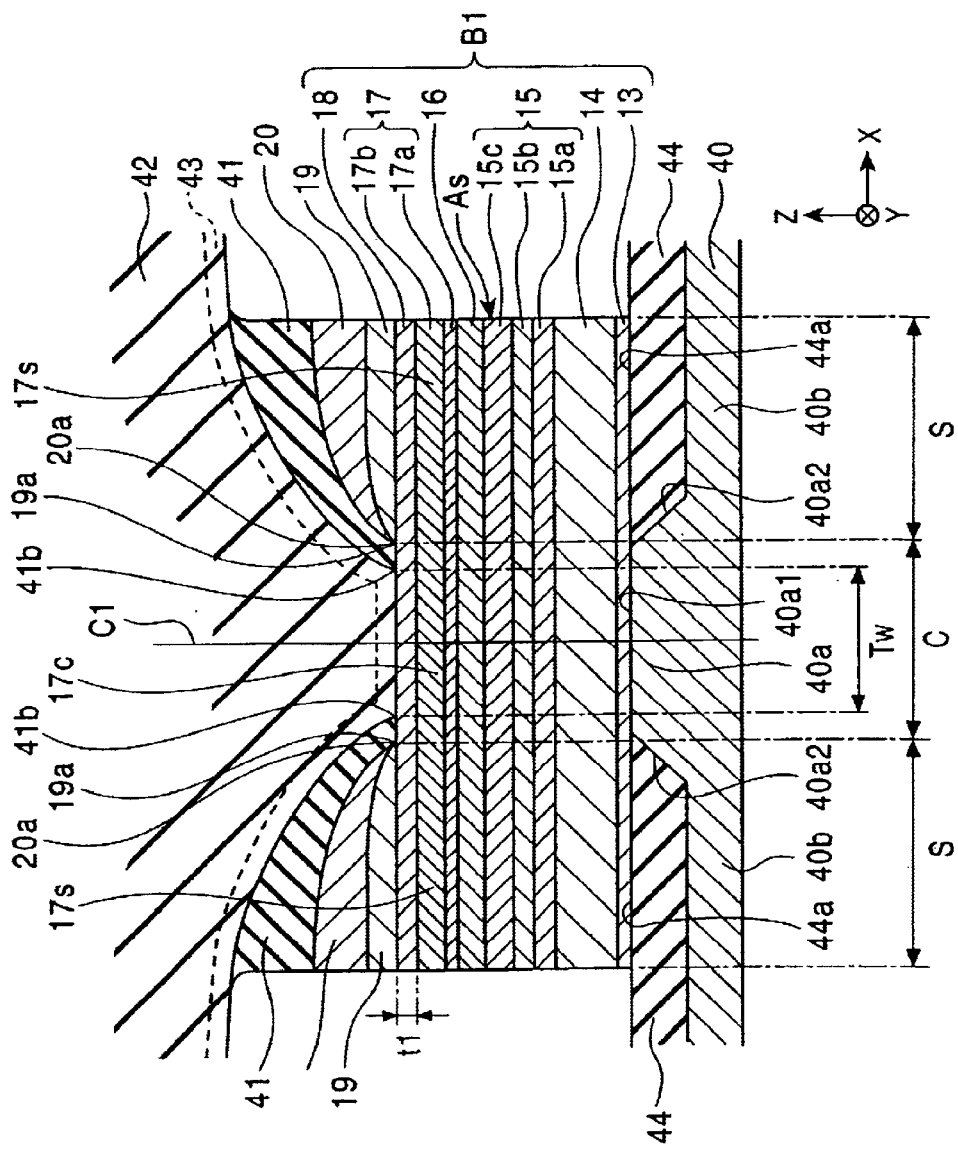
FIG. 24 is a sectional view of a magnetic sensing element in an eleventh embodiment of the present invention.
Figure 25:
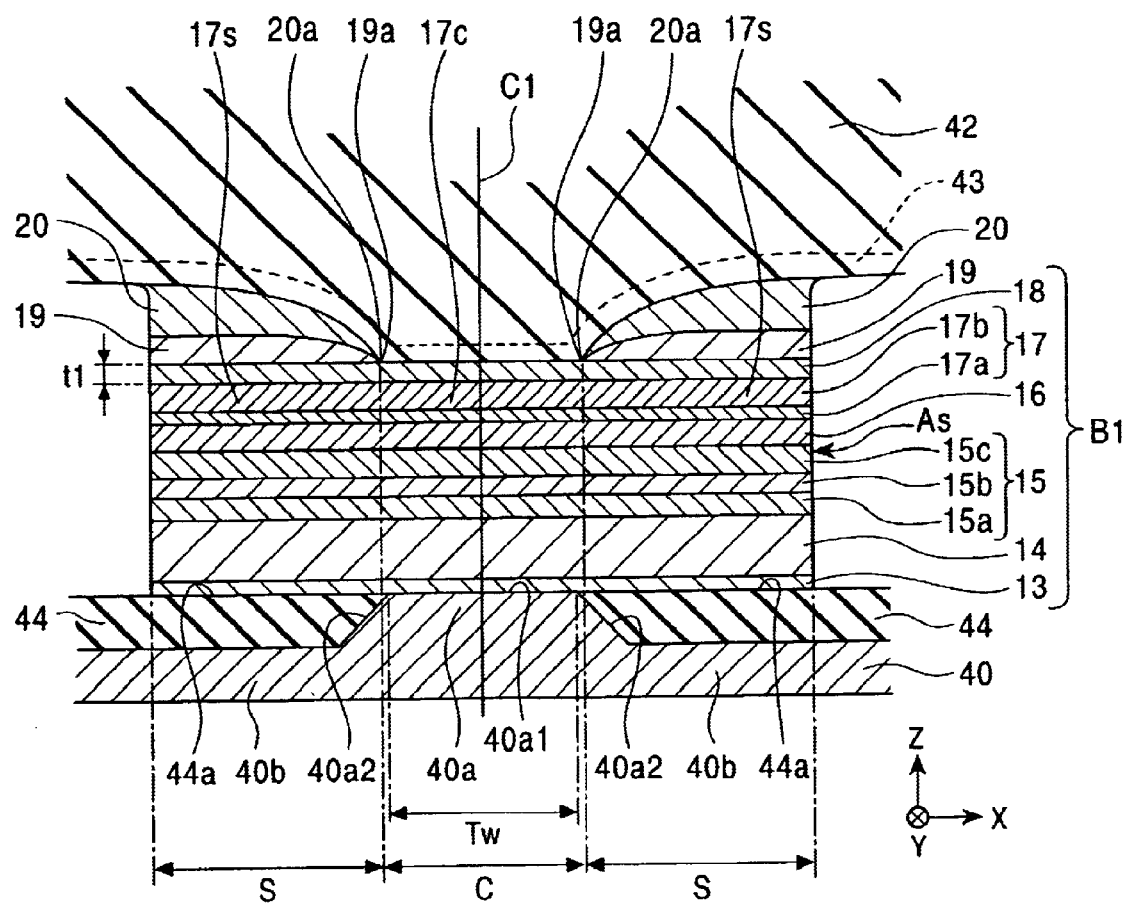
FIG. 25 is a sectional view of a magnetic sensing element in a twelfth embodiment of the present invention.

FIG. 24 is a sectional view of a magnetic sensing element in an eleventh embodiment of the present invention, and FIG. 25 is a sectional view of a magnetic sensing element in a twelfth embodiment of the present invention. Although the magnetic sensing elements shown in FIGS. 24 and 25 are also CPP-type magnetic sensing elements, as those depicted in FIGS. 20 to 23, the lower electrode layer 40 has a different shape in FIGS. 24 and 25.

The magnetic sensing element shown of FIG. 24 is the same as the magnetic sensing element shown of FIG. 20 insofar as it shares a common multilayer film B1. The magnetic sensing element of FIG. 24 also comprises an insulating layer 41 formed on the second antiferromagnetic layers 20, and an upper electrode layer 42 formed on the insulating layer 41 and the nonmagnetic layer 18. Herein, the upper electrode layer similarly acts as an upper shielding layer is.

The magnetic sensing element shown in FIG. 24 differs from the magnetic sensing element shown in FIG. 20 in comprising a protruding section 40a in the center in the track width direction (in the X direction) of the lower electrode layer 40 that extends toward the multilayer film B1 (in the Z direction). Herein, the lower electrode layer 40 also acts as a lower shielding layer. Importantly, the upper surface 40a1 of the protruding section 40a is in contact with the lower surface of the multilayer film B1 so that a current flows from the protruding section 40a to the multilayer film B1 (or from the multilayer film B1 to the protruding section 40a).

In the magnetic sensing element shown in FIG. 24, insulating layers 44 are provided between the multilayer film B1 and the side regions 40b in the track width direction (in the X direction) of the lower electrode layer 40. The insulating layers 44 are composed of an insulating material, such as $Al_2O_3$, $SiO_2$, AlN, Al—Si—O, or $Si_3N_4$.

In the magnetic sensing element shown in FIG. 24, by forming the protrusion section 40a of the lower electrode layer 40, the current path toward the multilayer film B1 is narrowed. Further, by providing the insulating layers 44 between the multilayer film B1 and the side regions 40b of the lower electrode layer 40, current shunting from the side regions 40b into the multilayer film B1 is suppressed. Consequently, it is possible to produce a more effective magnetic sensing element having a larger read output.

In the magnetic sensing element shown in FIG. 24, although the width in the track width direction (in the X direction) of the upper surface 40a1 of the protruding section 40a of the lower electrode layer 40 is equal to the width in the track width direction of the region C, the width of the upper surface 40a1 may be larger than the width in the track width direction of the region C. More preferably, the width of the upper surface 40a1 is equal to the track width Tw. Consequently, a current can be supplied more effectively only to the track width Tw region of the multilayer film B1 so as to produce a larger read output.

In the magnetic sensing element shown in FIG. 24, the side faces 40a2 in the track width direction of the protruding section 40a are formed as inclined surfaces or curved surfaces in which the width in the track width direction of the protruding section 40a gradually increases with distance from the multilayer film B1. However, the side faces 40a2 may be perpendicular to the track width direction (X direction).

The magnetic sensing element of FIG. 25 has a lower electrode layer 40 with the same shape as depicted in FIG. 24. That is, the protruding section 40a which extends toward the multilayer film B1 (in the Z direction) is provided in the center in the track width direction (in the X direction) of the lower electrode layer 40 shown in FIG. 25, and the upper surface 40a1 of the protruding section 40a is in contact with the lower surface of the multilayer film B1 so that a current flows from the protruding section 40a to the multilayer film B1 (or from the multilayer film B1 to the protruding section 40a). Insulating layers 44 are provided between the multilayer film B1 and the side regions 40b in the track width direction (in the X direction) of the lower electrode layer 40.

The magnetic sensing element shown in FIG. 25 differs from the magnetic sensing element shown in FIG. 24 in that the insulating layer 41 is not provided on the second antiferromagnetic layers 20. The upper electrode layer 42, also acting as the upper shielding layer, is directly joined to the second antiferromagnetic layers 20 and the nonmagnetic layer 18.

In the magnetic sensing element shown in FIG. 25, since the upper electrode layer 42 and the second antiferromagnetic layers 20 are not insulated from each other, the current path easily spreads outside the track width Tw, resulting in a lower output in comparison with the magnetic sensing element shown in FIG. 24. However, the protruding section 40a of the lower electrode layer 40 makes it possible to narrow the current path at the lower surface side of the multilayer film B1. Therefore, spreading of the current path and reduction in read output can be suppressed.

In each of the magnetic sensing elements shown in FIGS. 24 and 25, the upper surface 40a of the protruding section 40a is preferably flush with the upper surfaces of the insulating layers 44 provided on the side regions of the lower electrode layer 40. Consequently, the planes of the individual layers of the multilayer film B1 can be formed above the protruding section 40a and the insulating layers 44 that are parallel to the track width direction, thereby producing a magnetic sensing element with superior read characteristics.

In any one of the CPP-type magnetic sensing elements shown in FIGS. 20 to 25, the lower electrode layer 40 and the upper electrode layer 42 are formed in contact with the upper and lower surfaces of the multilayer film; both electrode layers also act as shielding layers. Fabrication of CPP-type magnetic sensing elements is simplified since they do not require separate incorporation of both electrode layers and shielding layers.

Moreover, if the electrode layers are used as the shielding layers, the gap length G1 determined by the distance between the shielding layers can be significantly decreased (See FIG. 20). This makes it possible to produce a magnetic sensing element that can more effectively meet the demands for increased recording density. For those embodiments that include the nonmagnetic layer 43, determination of gap length G1 further includes the thickness of the nonmagnetic layer 43.

However, the present invention is not limited to the magnetic sensing elements shown in FIGS. 20 to 25. An electrode composed of, e.g., Au, W, Cr, or Ta, may be provided on the upper and/or lower surfaces of the multilayer film. A shielding layer composed of a magnetic material may be formed on the surface of the electrode layer, opposite to the multilayer film with a gap layer therebetween.

A method for fabricating the CPP-type magnetic sensing element shown in FIG. 20 will be described below.

First, the lower electrode layer 40 is formed using a magnetic material, such as NiFe. The multilayer film B1 is then formed on the lower electrode layer 40.

The first antiferromagnetic layer 14 is deposited on the underlayer 13. The synthetic ferri-pinned-type pinned magnetic layer 15 including the first pinned magnetic sublayer 15a, the nonmagnetic intermediate sublayer 15b, and the second pinned magnetic sublayer 15c is then deposited thereon. The nonmagnetic material layer 16, the free magnetic layer 17, and the nonmagnetic layer 18 are deposited on the pinned magnetic layer 15. These layers are continuously deposited by a thin-film forming process, such as sputtering or vapor deposition, in the same vacuum deposition apparatus. As a result, the multilayer film B1 is thereby formed.

The first antiferromagnetic layer 14, the first pinned magnetic sublayer 15a, the nonmagnetic intermediate sublayer 15b, the second pinned magnetic sublayer 15c, the nonmagnetic material layer 16, the free magnetic layer 17, and the nonmagnetic layer 18 are composed of the same materials as described in the method for fabricating the magnetic sensing element shown in FIG. 1.

The multilayer film B1 is then annealed at a first annealing temperature in a first magnetic field directed in the Y direction having a first magnitude to produce an exchange anisotropic magnetic field between the first antiferromagnetic layer 14 and the first pinned magnetic sublayer 15a. Therefore, the magnetization of the pinned magnetic layer 15 is pinned in the Y direction. In this embodiment, the first annealing temperature is 270° C. and the first magnitude is 800 kA/m.

Figure 26:
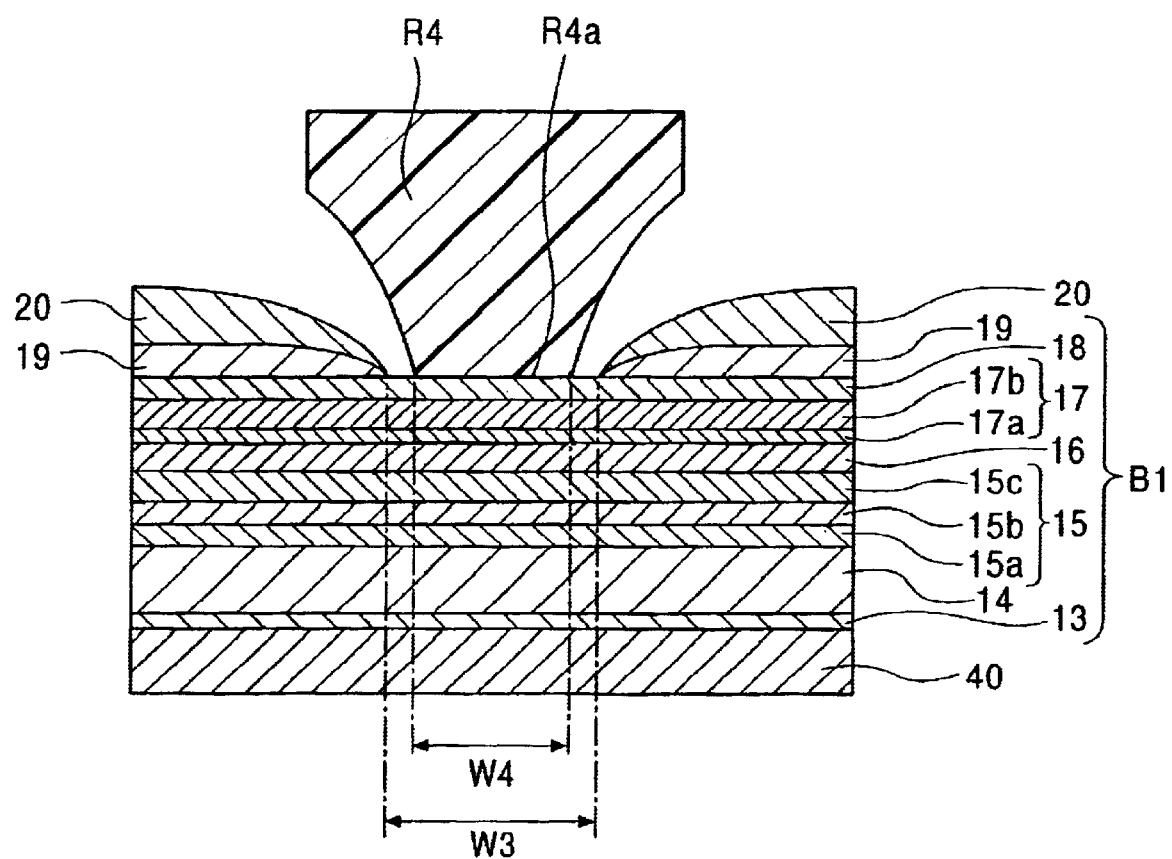
FIG. 26 is a sectional view showing a step in the fabrication process of a magnetic sensing element of the present invention.

Next, as shown in FIG. 26, a resist layer R4 for a lift-off process is formed on the nonmagnetic layer 18, the lower surface of the resist layer R4 having cutout sections. The resist layer R4 covers the track width region (central region) C of the nonmagnetic layer 18 shown in FIG. 20. The width in the track width direction of the track width region (central region) C is equal to the width W3 shown in FIG. 26.

The ferromagnetic layers 19 and the second antiferromagnetic layers 20 are continuously formed by sputtering on the nonmagnetic layer 18 in the regions not covered by the resist layer R4.

As in previous embodiments, the nonmagnetic layer 18 is composed of any one of Ru, Rh, Ir, Os, and Re, or an alloy of at least two of these elements such that the surface of the nonmagnetic layer 18 is not substantially oxidized during annealing in the first magnetic field. Therefore, even if the surface of the nonmagnetic layer 18 is not treated by milling or the like, before the ferromagnetic layers 19 are formed by sputtering, RKKY interactions can be generated by the free magnetic layer 17 and the ferromagnetic layers 19 with the nonmagnetic layer 18 therebetween.

That is, since the interfaces between the nonmagnetic layer 18 and the ferromagnetic layers 19 are not required to be trimmed by milling, it is possible to prevent a decrease in the unidirectional anisotropic magnetic field for aligning, in a predetermined direction, the magnetization direction of the free magnetic layer 17 in each side region 17s (see FIG. 20).

The distance W3 between the pair of second antiferromagnetic layers 20 is larger than the width W4 in the track width direction of the bottom face R4a of the resist layer R4. The resist layer R4 covers the center of the nonmagnetic layer 18 in a substantially rectangular shape or in a substantially circular shape.

Figure 27:
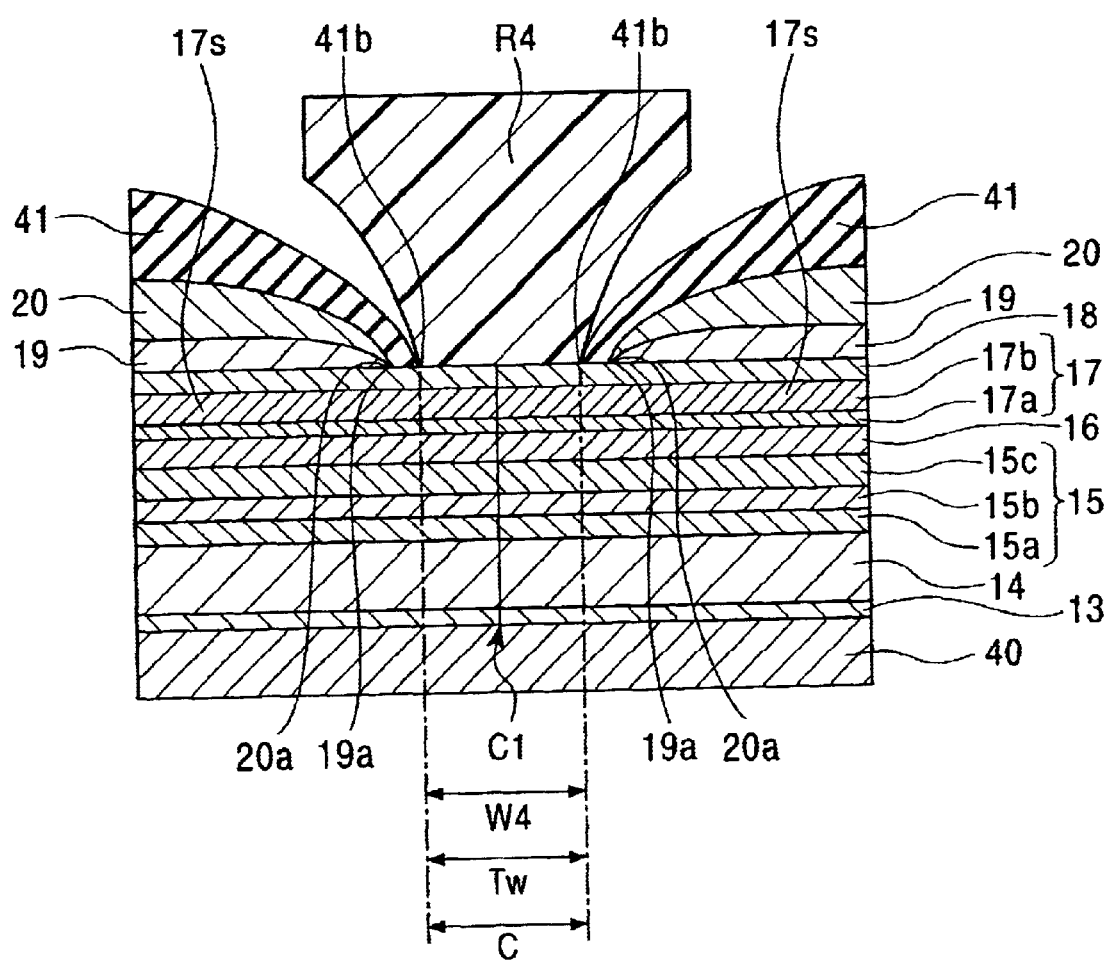
FIG. 27 is a sectional view showing a step in the fabrication process of a magnetic sensing element of the present invention.
Figure 28:
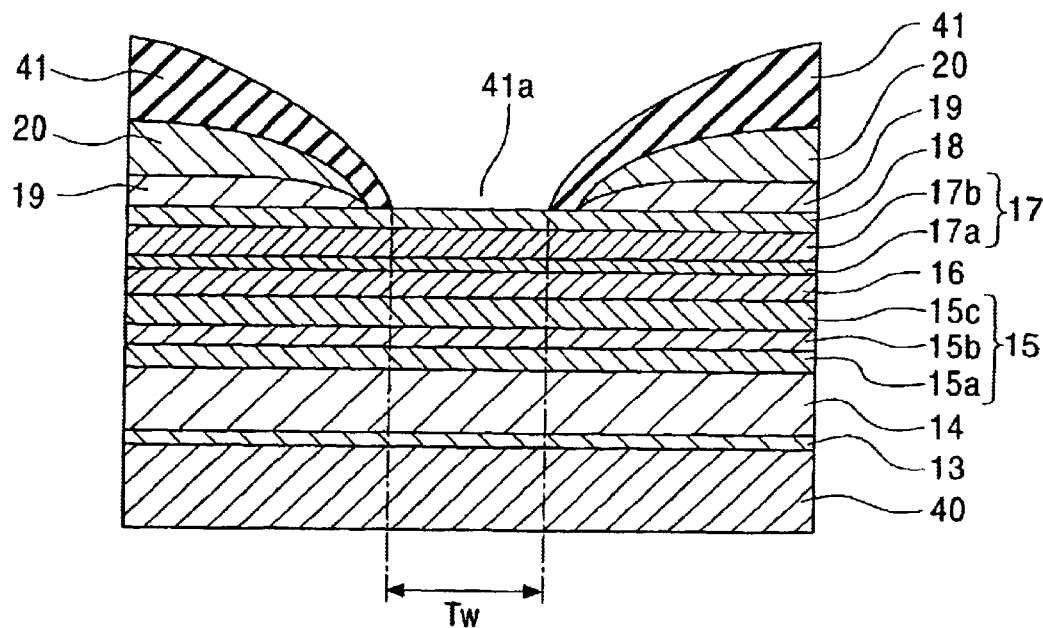
FIG. 28 is a sectional view showing a step in the fabrication process of a magnetic sensing element of the present invention.

Next, as shown in FIG. 27, the insulating layer 41 is formed by sputtering on the nonmagnetic layer 18 in the regions not covered by the resist layer R4 and on the second pair of antiferromagnetic layers 20. The insulating layer 41 is composed of an insulating material, such as $Al_2O_3$, $SiO_2$, AlN, Al—Si—O, or $Si_3N_4$. Examples of the sputtering process to be used include an ion beam sputtering process, a long-throw sputtering process, and a collimation sputtering process.

By adjusting the incident angle of sputtering, the edges 41b at the track width region C sides of the insulating layer 41 are extended to the joints between the nonmagnetic layers 18 and the resist layer R4. As a result, the insulating layer 41 completely covers the second antiferromagnetic layers 20.

At this stage, the width W4 in the track width direction of the bottom face of the resist layer R4 is equal to the distance between the edges 41b in the track width direction. The distance between the edges 41b in the track width direction determines the track width Tw.

Since the insulating layer 41 covers the second antiferromagnetic layers 20 completely, even if the magnetization directions of the side regions 17s of the free magnetic layer 17 in the vicinity of the edges 20a of the second antiferromagnetic layers 20 at the track width region C sides in the step shown in FIG. 26 are altered due to compositional changes, sagging, etc., it is possible to prevent changes in the track width Tw.

After the insulating layer 41 is deposited, the resist layer R4 is removed, creating an opening 41a in which the nonmagnetic layer 18 is exposed in the center of the insulating layer 41.

The first antiferromagnetic layer 14 and the second antiferromagnetic layers 20 of this embodiment may comprise the same composition of antiferromagnetic material.

After the resist layer R4 is removed, the multilayer film is annealed at a second annealing temperature in a second magnetic field directed in the X direction having a second magnitude that produces exchange anisotropic magnetic fields between the second antiferromagnetic layers 20 and the ferromagnetic layers 19 such that the magnetization directions of the ferromagnetic layers 19 are pinned in the X direction. In this embodiment, the second annealing temperature is 250° C. and the second magnitude is 8 kA/m.

The exchange anisotropic magnetic fields between the second antiferromagnetic layers 20 and the ferromagnetic layers 19 are first generated in the annealing step in the second magnetic field. Therefore, in order to direct the exchange anisotropic magnetic fields between the second antiferromagnetic layers 20 and the ferromagnetic layers 19 in the X direction while the direction of the exchange anisotropic magnetic field between the first antiferromagnetic layer 14 and the first pinned magnetic sublayer 15a is being directed in the Y direction, the only requirements are that: (1) the second annealing temperature be set lower than the blocking temperature at which the exchange coupling magnetic field by the first antiferromagnetic layer 14 is lost; and (2) the magnitude of the second magnetic field be set smaller than the magnitude of the exchange anisotropic magnetic field between the first antiferromagnetic layer 14 and the first pinned magnetic sublayer 15a. If annealing in the second magnetic field is performed under such conditions, even if the first antiferromagnetic layer 14 and the second antiferromagnetic layers 20 comprise the same composition of antiferromagnetic material, it is possible to direct the exchange anisotropic magnetic fields between the second antiferromagnetic layers 20 and the ferromagnetic layers 19 in the X direction while the direction of the exchange anisotropic magnetic field between the first antiferromagnetic layer 14 and the first pinned magnetic sublayer 15a is being directed in the Y direction. That is, the magnetization direction of the free magnetic layer 17 is easily pinned in the direction substantially perpendicular to the magnetization direction of the pinned magnetic layer 15.

Preferably, the second magnitude of the second magnetic field for annealing is: (1) larger than the saturation magnetic fields of the free magnetic layer 17 and the ferromagnetic layer 19 and the demagnetizing fields of the free magnetic layer 17 and the ferromagnetic layer 19; and (2) smaller than the spin-flop magnetic field at which antiparallel coupling between the free magnetic layer 17 and the ferromagnetic layer 19 is lost.

If necessary, the surface of the nonmagnetic layer 18 is cleaned by ion milling. The upper electrode layer 42 is formed by sputtering or plating. Alternatively, after the nonmagnetic layer 43 shown in FIG. 20 is formed by sputtering or the like on the insulating layer 41 and the nonmagnetic layer 18, the upper electrode layer 42 may be formed by plating.

In accordance with the fabrication method described above, the second antiferromagnetic layers 20 can be further covered by the insulating layer 41. This facilitates fabrication of a CPP-type magnetic sensing element that suppresses shunt loss of the current supplied from the electrode layer.

The upper region of each of the magnetic sensing elements shown in FIGS. 21 to 25 can be formed by the same steps as described above.

A method for forming the lower electrode layer 40 and the insulating layers 44 of the magnetic sensing element shown in FIG. 24 or 25 will now be described.

Figure 29:
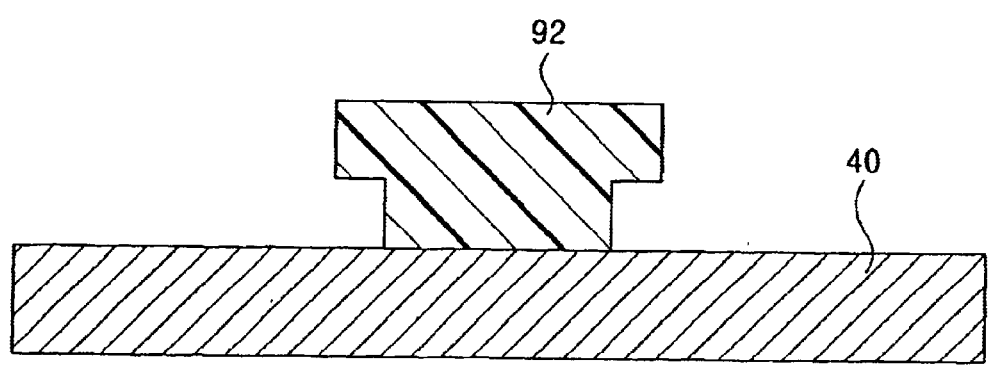
FIG. 29 is a sectional view showing a step in the fabrication process of a magnetic sensing element of the present invention.

First, as shown in FIG. 29, the lower electrode layer 40 is formed by plating or sputtering using a magnetic material, such as NiFe. The surface thereof is planarized by polishing or the like. A resist layer 92 is then formed on the central region in the track width direction of the lower electrode layer 40.

Figure 30:
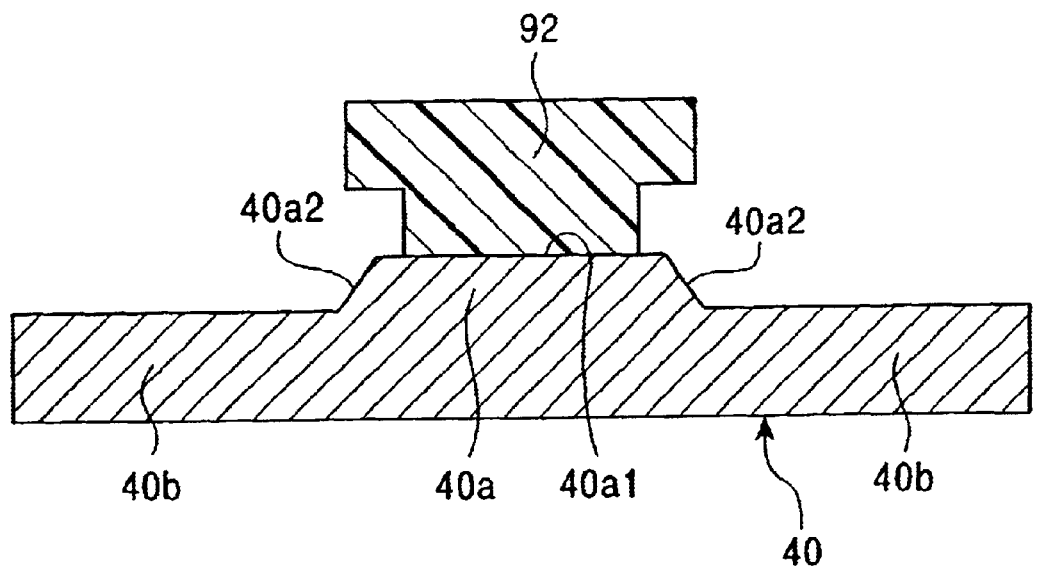
FIG. 30 is a sectional view showing a step in the fabrication process of a magnetic sensing element of the present invention.

Next, as shown in FIG. 30, the side regions 40b of the lower electrode layer 40 not covered by the resist layer 92 are trimmed to the middle of the layer by ion milling. This allows the protruding section 40a to be formed in the center in the track width direction of the lower electrode layer 40.

Figure 31:
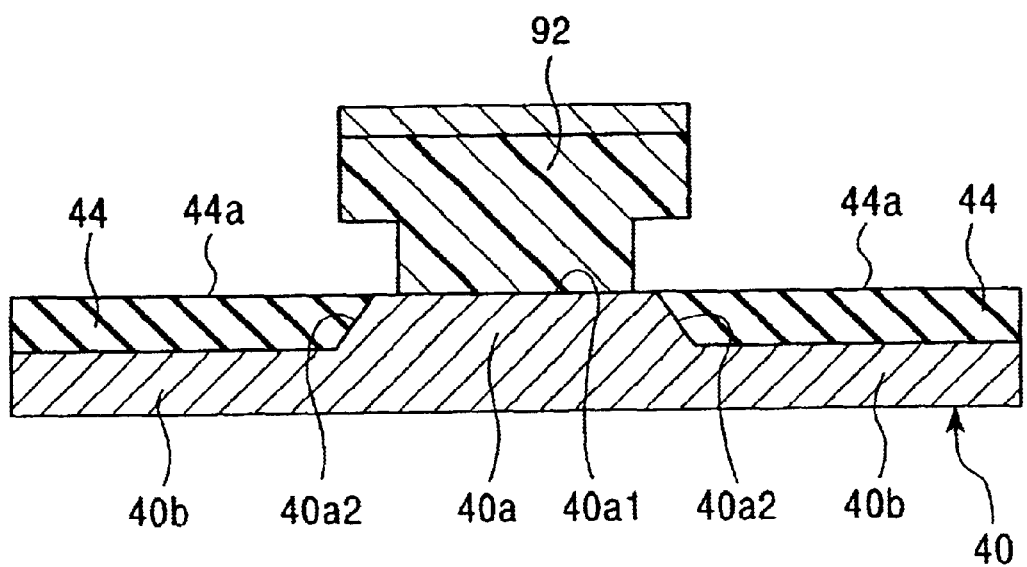
FIG. 31 is a sectional view showing a step in the fabrication process of a magnetic sensing element of the present invention.
Figure 32:
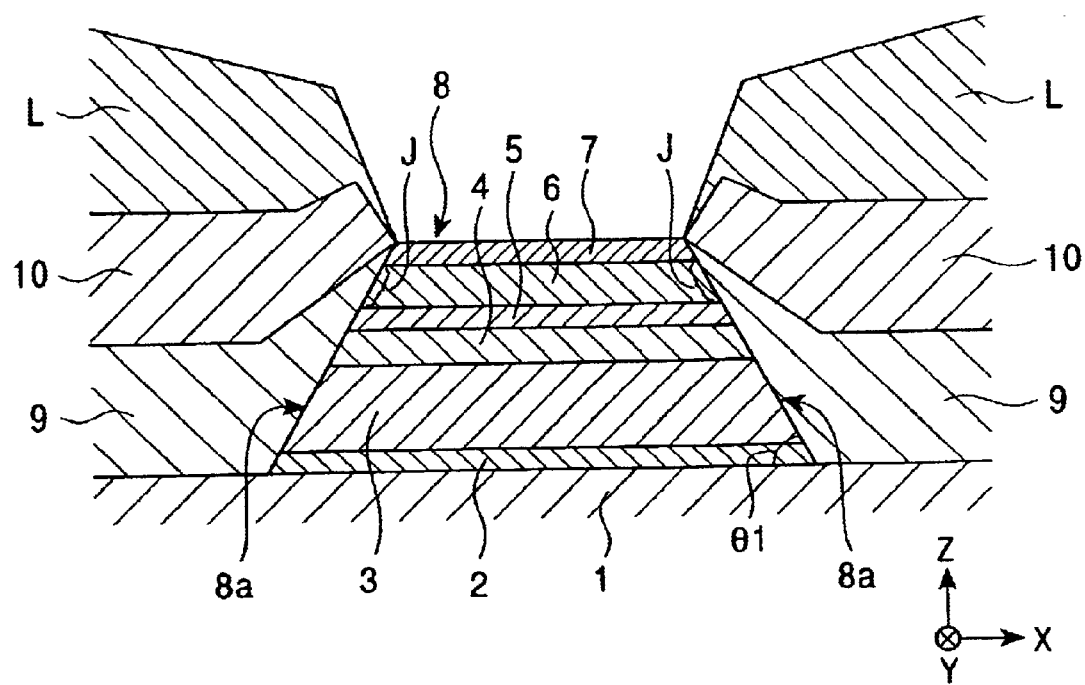
FIG. 32 is a sectional view of a conventional magnetic sensing element.

Furthermore, as shown in FIG. 31, the insulating layers 44 are formed by a sputtering process on the side regions 40b of the lower electrode layer 40 not covered by the resist layer 92. The sputtering process is stopped when the upper surfaces 44a of the insulating layers 44 substantially reach the same level as the upper surface 40a1 of the protruding section 40a. The resist layer 92 is then removed.

After the resist layer 92 is removed, the upper surface 40a1 of the protruding section 40 of the lower electrode layer 40 and the upper surfaces 44a of the insulating layers 44 may be polished by CMP or the like so that the upper surface 40a1 and the upper surfaces 44a are precisely flush with each other. In such a case, the initial planarizing process by polishing or the like may be omitted.

After the resist layer 92 is removed, the multilayer film B1 is deposited on the lower electrode layer 40 and the insulating layers 44.

With respect to any one of the magnetic sensing elements shown in FIGS. 1 to 6 or FIGS. 20 to 25, an inductive element for writing may be deposited thereon.

The magnetic sensing elements in FIGS. 1 to 25 can be used for magnetic sensors, hard disk drives, etc.

In any one of the magnetic sensing elements in the embodiments described above, the pinned magnetic layer 15 may be formed as a single ferromagnetic layer.

What is claimed is:

1. A magnetic sensing element comprising a multilayer film comprising a first antiferromagnetic layer; a pinned magnetic layer, the magnetization direction of the pinned magnetic layer being pinned by the first antiferromagnetic layer; a nonmagnetic material layer; a free magnetic layer, the magnetization direction of the free magnetic layer varying in response to an external magnetic field; a nonmagnetic layer; a pair of ferromagnetic layers; a pair of second antiferromagnetic layers; a first electrode layer; a second electrode layer; and a track width region comprising a central region and a pair of sides, wherein the multilayer film has a characteristic track width direction;

wherein the nonmagnetic layer has a uniform thickness, or the thickness of the nonmagnetic layer is larger in its central region than in its side regions;

wherein the pair of ferromagnetic layers are formed on the upper surface of the nonmagnetic layer, the pair of ferromagnetic layers at a predetermined distance apart from one another in the track width direction;

wherein the pair of the second antiferromagnetic layers are provided on the pair of ferromagnetic layers; and wherein the magnetization direction of the free magnetic layer is substantially perpendicular to the magnetization direction of the pinned magnetic layer by magnetic coupling with the ferromagnetic layers, the magnetization direction of the ferromagnetic layers being aligned by magnetic coupling with the second antiferromagnetic layers.

2. A magnetic sensing element according to claim 1, wherein the ferromagnetic layers and second antiferromagnetic layers are formed by sputtering a ferromagnetic material and an antiferromagnetic material after the track width region of the nonmagnetic layer is covered by a resist layer, said sputtering performed on the regions of the nonmagnetic layer not covered by the resist layer.

3. A magnetic sensing element according to claim 2, wherein the upper surfaces of the ferromagnetic layers and the second antiferromagnetic layers are inclined or curved relative to the upper surface of the nonmagnetic layer.

4. A magnetic sensing element according to claim 1, wherein the nonmagnetic layer comprises a conductive material.

5. A magnetic sensing element according to claim 4, wherein the nonmagnetic layer comprises any one of Ru, Rh, Ir, Os, and Re, or an alloy of at least two of these elements.

6. A magnetic sensing element according to claim 4, wherein the nonmagnetic layer comprises Ru and has a thickness of 0.8 to 1.1 nm.

7. A magnetic sensing element according to claim 1, further comprising a conductive material layer placed between the nonmagnetic layer and the free magnetic layer, the conductive material layer having a lower resistivity than that of the nonmagnetic layer.

8. A magnetic sensing element according to claim 7, wherein the nonmagnetic layer comprises Ru and has a thickness of 0.4 to 1.1 nm.

9. A magnetic sensing element according to either of claims 7 or 8, wherein the conductive material layer comprises Cu and has a thickness of 0.3 to 0.5 nm.

10. A magnetic sensing element according to claim 1, wherein the first electrode layer and the second electrode layer are provided on the side regions in the track width direction of the multilayer film so that a current flows parallel to the planes of the individual layers of the multilayer film.

11. A magnetic sensing element according to claim 10, wherein the first electrode layer and the second electrode layer are provided on the second antiferromagnetic layers, and the edges of the first electrode layer and the second electrode layer at the track width region sides overlap with the edges of the second antiferromagnetic layers at the track width region sides.

12. A magnetic sensing element according to claim 10, wherein the first electrode layer and the second electrode layer are provided on the second antiferromagnetic layers, and the edges of the first electrode layer and the second electrode layer at the track width region sides are placed closer to the side faces of the multilayer film compared to the edges of the second antiferromagnetic layers at the track width region sides.

13. A magnetic sensing element according to claim 10, wherein the first electrode layer and the second electrode layer are provided on the second antiferromagnetic layers, and the edges of the first electrode layer and the second electrode layer at the track width region sides extend from the edges of the second antiferromagnetic layers at the track width region sides toward the central region of the multilayer film.

14. A magnetic sensing element according to claim 1, wherein the first electrode layer is provided on the upper surface of the multilayer film and the second electrode layer is provided on the lower surface of the multilayer film so that a current flows perpendicular to the planes of the individual layers of the multilayer film.

15. A magnetic sensing element according to claim 14, wherein the first electrode layer comprises a magnetic material that acts as an upper shielding layer.

16. A magnetic sensing element according to claim 14, further comprising an insulating layer on the second antiferromagnetic layers, wherein the first electrode layer is formed over the insulating layer and the nonmagnetic layer.

17. A magnetic sensing element according to claim 14, wherein the second electrode layer comprises a magnetic material that acts as a lower shielding layer.

18. A magnetic sensing element according to claim 14, wherein the second electrode layer comprises a protruding section extending toward the multilayer film, the protruding section in the center of the second electrode layer in the track width direction such that its upper surface is in contact with the lower surface of the multilayer film; and insulating layers between the multilayer film and the second electrode layer on both sides of the protruding section between the lower surface of the multilayer film and upper surface of the side regions of the second electrode layer in the track width direction of the second electrode layer.

19. A magnetic sensing element according to claim 18, wherein the upper surface of the protruding section is flush with the upper surfaces of the insulating layers on the side regions of the second electrode layer.

20. A magnetic sensing element according to claim 1, wherein the nonmagnetic material layer comprises a nonmagnetic conductive material.

21. A magnetic sensing element according to claim 14, wherein the nonmagnetic material layer comprises an insulating material.

22. A magnetic sensing element according to claim 7, wherein the first electrode layer is provided on the upper surface of the multilayer film and the second electrode layer is provided on the lower surface of the multilayer film so that a current flows perpendicular to the planes of the individual layers of the multilayer film.

23. A magnetic sensing element according to claim 1, wherein the pinned magnetic layer comprises a plurality of ferromagnetic sublayers having different magnetic moments per unit area and a nonmagnetic intermediate sublayer between two adjacent ferromagnetic sublayers, wherein the magnetization directions of the two adjacent ferromagnetic sublayers are in an antiparallel, ferrimagnetic state.

24. A magnetic sensing element according to claim 1, wherein the free magnetic layer comprises a plurality of ferromagnetic sublayers having different magnetic moments per unit area and a nonmagnetic intermediate sublayer between two adjacent ferromagnetic sublayers, wherein the magnetization directions of the two adjacent ferromagnetic sublayers are in an antiparallel, ferrimagnetic state.

25. A magnetic sensing element according to claim 23, wherein the nonmagnetic intermediate sublayer comprises any one of Ru, Rh, Ir, Os, Cr, Re, and Cu, or an alloy of at least two of these elements.

26. A magnetic sensing element according to claim 23, wherein the first electrode layer is provided on the upper surface of the multilayer film and the second electrode layer is provided on the lower surface of the multilayer film so that a current flows perpendicular to the planes of the individual layers of the multilayer film.

27. A magnetic sensing element according to claim 24, wherein the nonmagnetic intermediate sublayer comprises any one of Ru, Rh, Ir, Os, Cr, Re, and Cu, or an alloy of at least two of these elements.

28. A magnetic sensing element according to claim 24, wherein the first electrode layer is provided on the upper surface of the multilayer film and the second electrode layer is provided on the lower surface of the multilayer film so that a current flows perpendicular to the planes of the individual layers of the multilayer film.

29. A magnetic sensing element according to claim 1, wherein at least the pair of ferromagnetic layers or the free magnetic layer comprises a magnetic material represented by the formula CoFeNi, wherein the Fe content is in the range of 9 to 17 atomic percent, the Ni content is in the range of 0.5 to 10 atomic percent, and the balance is Co.

30. A magnetic sensing element according to claim 1, further comprising an interlayer comprising a CoFe alloy or Co between the nonmagnetic material layer and the free magnetic layer.

31. A magnetic sensing element according to claim 1, wherein at least the pair of ferromagnetic layers or the free magnetic layer comprises a magnetic material represented by the formula CoFeNi, wherein the Fe content is in the range of 7 to 15 atomic percent, the Ni content is in the range of 5 to 15 atomic percent, and the balance is Co.

32. A magnetic sensing element according to claim 1, wherein both the pair of ferromagnetic layers and the free magnetic layer comprise a magnetic material represented by the formula CoFeNi, wherein the Fe content is in the range of 9 to 17 atomic percent, the Ni content is in the range of 0.5 to 10 atomic percent, and the balance is Co.

33. A magnetic sensing element according to claim 1, wherein both of the ferromagnetic layers and the free magnetic layer comprise a magnetic material represented by the formula CoFeNi, wherein the Fe content is in the range of 7 to 15 atomic percent, the Ni content is in the range of 5 to 15 atomic percent, and the balance is Co.

34. A magnetic sensing element according to claim 1, wherein the first antiferromagnetic layer and the second antiferromagnetic layers comprise the same antiferromagnetic material.

35. A magnetic sensing element according to claim 1, wherein at least the first antiferromagnetic layer or the second antiferromagnetic layers comprise any one of a PtMn alloy; an X—Mn alloy, wherein X is at least one element selected from the group consisting of Pd, Ir, Rh, Ru, Os, Ni, and Fe; and a Pt—Mn—X' alloy, wherein X' is at least one element selected from the group consisting of Pd, Ir, Rh, Ru, Au, Ag, Os, Cr, Ni, Ar, Ne, Xe, and Kr.

36. A magnetic sensing element comprising a multilayer film core structure, wherein the core structure comprises:

an underlayer;

a antiferromagnetic layer;

a synthetic ferri-pinned-type pinned magnetic layer comprising a first pinned magnetic sublayer, a nonmagnetic intermediate sublayer, and a second pinned magnetic sublayer;

a free magnetic layer comprising a diffusion-preventing layer and a magnetic layer; and a nonmagnetic layer.

* * * * *